US012641800B2

(12) United States Patent
Park et al.

(10) Patent No.: US 12,641,800 B2
(45) Date of Patent: May 26, 2026

(54) CAPACITOR STRUCTURE AND SEMICONDUCTOR DEVICE INCLUDING THE SAME

(71) Applicant: SAMSUNG ELECTRONICS CO., LTD., Suwon-si (KR)

(72) Inventors: Jungmin Park, Suwon-si (KR); Intak Jeon, Suwon-si (KR); Hanjin Lim, Suwon-si (KR); Hyungsuk Jung, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 448 days.

(21) Appl. No.: 18/461,408

(22) Filed: Sep. 5, 2023

(65) Prior Publication Data

US 2024/0105765 A1     Mar. 28, 2024

(30) Foreign Application Priority Data

Sep. 19, 2022    (KR) ........................ 10-2022-0118063

(51) Int. Cl.
| | |
|---|---|
| *H10D 1/00* | (2025.01) |
| *H10B 12/00* | (2023.01) |
| *H10D 1/68* | (2025.01) |

(52) U.S. Cl.
CPC ......... *H10D 1/043* (2025.01); *H10B 12/0335* (2023.02); *H10B 12/315* (2023.02); *H10D 1/716* (2025.01)

(58) Field of Classification Search
CPC .. H10B 12/315; H10B 12/0335; H10D 1/043; H10D 1/716
See application file for complete search history.

(56) References Cited

U.S. PATENT DOCUMENTS

| | | | |
|---|---|---|---|
| 7,799,631 | B2 | 9/2010 | Park |
| 7,869,189 | B2 | 1/2011 | Choi et al. |

(Continued)

FOREIGN PATENT DOCUMENTS

| | | |
|---|---|---|
| CN | 107017235 A | 8/2017 |
| CN | 110021582 A | 7/2019 |

(Continued)

*Primary Examiner* — Steven M Page
(74) *Attorney, Agent, or Firm* — Morgan, Lewis & Bockius LLP

(57) ABSTRACT

A capacitor structure includes a first lower conductive pattern, a first capacitor, a first upper conductive pattern, a second lower conductive pattern, a second capacitor and a second upper conductive pattern. The first capacitor includes first lower electrodes, first upper electrodes and first dielectric structures. Each of the first dielectric structures are disposed between one of the first lower electrodes and a corresponding one of the first upper electrodes. The first upper conductive pattern is formed on and is electrically connected to the first upper electrodes. The second lower conductive pattern is spaced apart from the first lower conductive pattern disposed on the substrate. The second capacitor includes second lower electrodes, second upper electrodes and second dielectric structures. The second upper conductive pattern is formed on and is electrically connected to the second upper electrodes. The first and second conductive patterns are electrically insulated from each other.

20 Claims, 42 Drawing Sheets

(56)     References Cited

U.S. PATENT DOCUMENTS

| | | | |
|---|---|---|---|
| 8,633,533 B2 | 1/2014 | Kim | |
| 9,768,181 B2 | 9/2017 | Chavan et al. | |
| 9,887,258 B2 | 2/2018 | Lin | |
| 9,941,286 B2 | 4/2018 | Kim et al. | |
| 10,304,512 B2 | 5/2019 | Lu et al. | |
| 10,886,276 B2 | 1/2021 | Hwang | |
| 11,107,724 B2 | 8/2021 | Ramaswamy | |
| 11,152,369 B2 | 10/2021 | Kim et al. | |
| 11,211,384 B2 | 12/2021 | Sills | |
| 11,322,578 B2 * | 5/2022 | Lim | H10D 1/684 |
| 11,665,452 B2 | 5/2023 | Baek et al. | |
| 2006/0115952 A1 * | 6/2006 | Wu | H10D 1/047 |
| | | | 257/E21.59 |
| 2008/0180986 A1 | 7/2008 | Shibata | |
| 2017/0025416 A1 * | 1/2017 | Han | H10D 1/692 |
| 2021/0183873 A1 * | 6/2021 | Goodwin | H10B 53/10 |
| 2021/0391343 A1 * | 12/2021 | Mutch | H10B 53/10 |
| 2023/0164979 A1 | 5/2023 | Park et al. | |

FOREIGN PATENT DOCUMENTS

| | | |
|---|---|---|
| KR | 10-2023-0075875 | 5/2023 |
| TW | 202114192 A | 4/2021 |

* cited by examiner

FIG. 17

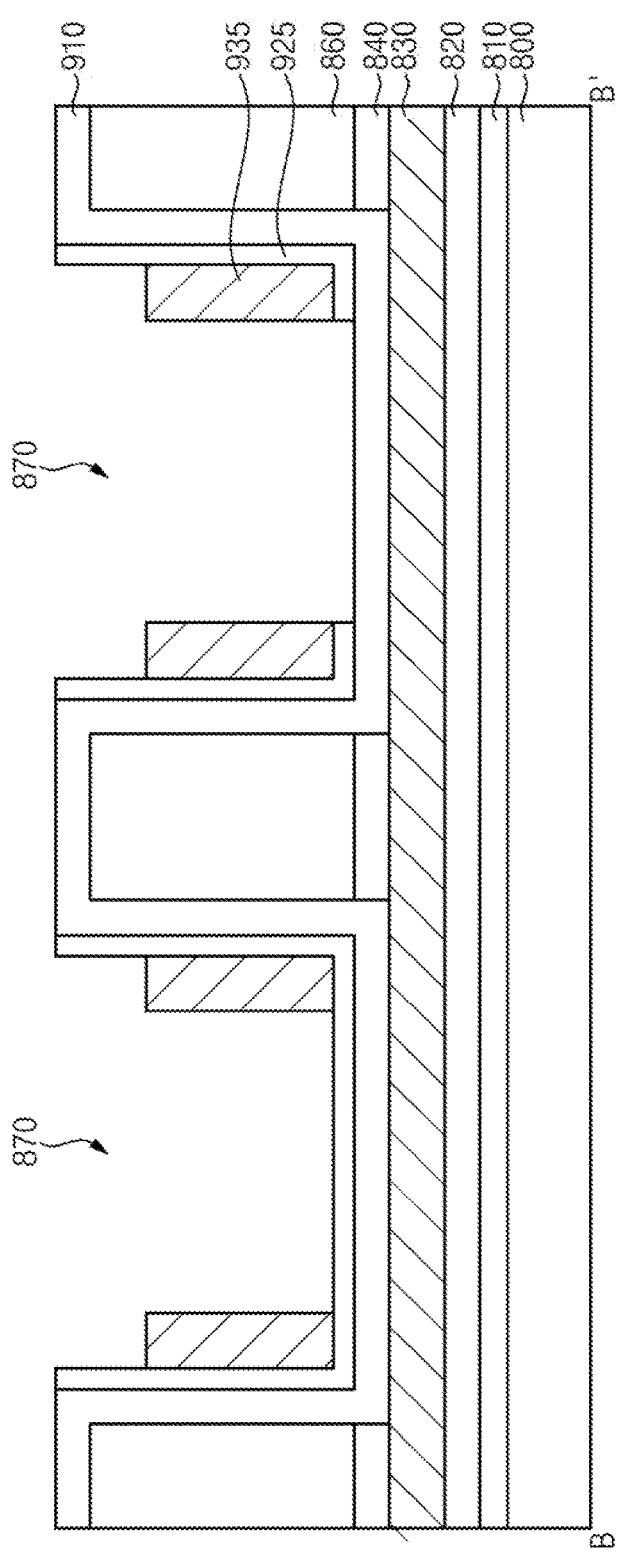
FIG. 41
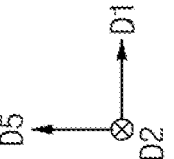

CAPACITOR STRUCTURE AND SEMICONDUCTOR DEVICE INCLUDING THE SAME

CROSS-REFERENCE TO RELATED APPLICATION

This application claims priority under 35 U.S.C. § 119 to Korean Patent Application No. 10-2022-0118063 filed on Sep. 19, 2022 in the Korean Intellectual Property Office, the disclosure of which is hereby incorporated by reference in its entirety.

TECHNICAL FIELD

The present disclosure relates to a capacitor and, more particularly, to a capacitor structure and a semiconductor device including the same.

DISCUSSION OF THE RELATED ART

A capacitor in a dynamic random access memory (DRAM) device includes a lower electrode, an upper electrode and a dielectric pattern disposed between the lower electrode and the upper electrode. The dielectric pattern may include a high-k dielectric material (e.g., a material having a dialectic constant at least as great as silicon oxide) so that the capacitance of the capacitor may increase. However, increasing the capacitance of the capacitor by increasing the dielectric constant of the dielectric pattern has a limit, and thus a new method of increasing the capacitance of the capacitor is needed.

SUMMARY

A capacitor structure includes a first lower conductive pattern, a first capacitor, a first upper conductive pattern, a second lower conductive pattern, a second capacitor and a second upper conductive pattern disposed on a substrate. The first capacitor includes first lower electrodes, first upper electrodes and first dielectric structures. The first lower electrodes are spaced apart from each other on the first lower conductive pattern in a horizontal direction that is substantially parallel to an upper surface of the substrate, and the first lower electrodes is electrically connected to the first lower conductive pattern. The first upper electrodes are formed in a space between the first lower electrodes and in a space adjacent to one of the first lower electrodes that is disposed at a first end portion. Each of the first dielectric structures is disposed between one of the first lower electrodes and a corresponding one of the first upper electrodes. The first upper conductive pattern is formed on and is electrically connected to the first upper electrodes. The second lower conductive pattern is spaced apart from the first lower conductive pattern disposed on the substrate. The second capacitor includes second lower electrodes, second upper electrodes and second dielectric structures. The second lower electrodes are spaced apart from each other on the second lower conductive pattern in the horizontal direction, and the second lower electrodes are electrically connected to the second lower conductive pattern. The second upper electrodes are formed in a space between the second lower electrodes and in a space adjacent to one of the second lower electrodes that is disposed at a first end portion. Each of the second dielectric structures is disposed between one of the second lower electrodes and a corresponding one of the second upper electrodes. The second upper conductive pattern is formed on and is electrically connected to the second upper electrodes. The first and second conductive patterns are electrically insulated from each other.

A capacitor structure includes a first lower conductive pattern, a first capacitor, a first upper conductive pattern, a second lower conductive pattern, a second capacitor and a second upper conductive pattern disposed on a substrate. The first capacitor includes first lower electrodes, first upper electrodes and first dielectric structures. The first lower electrodes are spaced apart from each other on the first lower conductive pattern in a horizontal direction that is substantially parallel to an upper surface of the substrate. The first lower electrodes are electrically connected to the first lower conductive pattern. The first upper electrodes are formed in a space between the first lower electrodes and in a space adjacent to one of the first lower electrodes that is disposed at a first end portion. Each of the first dielectric structures is disposed between one of the first lower electrodes and a corresponding one of the first upper electrodes. The first upper conductive pattern is formed on and is electrically connected to the first upper electrodes. The second lower conductive pattern is spaced apart from the first lower conductive pattern disposed on the substrate. The second capacitor includes second lower electrodes, second upper electrodes and second dielectric structures. The second lower electrodes are spaced apart from each other on the second lower conductive pattern in the horizontal direction, and the second lower electrodes are electrically connected to the second lower conductive pattern. The second upper electrodes are formed in a space between the second lower electrodes and in a space adjacent to one of the second lower electrodes that is disposed at a first end portion. Each of the second dielectric structures is disposed between one of the second lower electrodes and a corresponding one of the second upper electrodes. The second upper conductive pattern is formed on and is electrically connected to the second upper electrodes. Each of the first dielectric structures includes a third dielectric pattern extending in a vertical direction that is substantially perpendicular to the upper surface of the substrate, a second dielectric pattern disposed on a sidewall of the third dielectric pattern, and a first dielectric pattern disposed on an outer sidewall of the second dielectric pattern and contacting sidewalls of the first lower electrode and the first upper electrode. Each of the second dielectric structures includes a fifth dielectric pattern extending in the vertical direction, and a fourth dielectric pattern disposed on a sidewall of the fifth dielectric pattern and contacting sidewalls of the second lower electrode and the second upper electrode.

A capacitor structure includes a first lower conductive pattern, a first capacitor, a first upper conductive pattern, a second lower conductive pattern, a second capacitor and a second upper conductive pattern disposed on a substrate. The first capacitor includes first lower electrodes, first upper electrodes and first dielectric structures. The first lower electrodes are spaced apart from each other on the first lower conductive pattern in a horizontal direction that is substantially parallel to an upper surface of the substrate. The first lower electrodes are electrically connected to the first lower conductive pattern. The first upper electrodes are formed in a space between the first lower electrodes and in a space adjacent to one of the first lower electrodes that is disposed at a first end portion. Each of the first dielectric structures is disposed between one of the first lower electrodes and a corresponding one of the first upper electrodes. The first upper conductive pattern is formed on and is electrically connected to the first upper electrodes. The second lower conductive pattern is spaced apart from the first lower conductive pattern disposed on the substrate. The second capacitor includes second lower electrodes, second upper electrodes and second dielectric structures. The second lower electrodes are spaced apart from each other on the second lower conductive pattern in the horizontal direction, and the second lower electrodes are electrically connected to the second lower conductive pattern. The second upper electrodes are formed in a space between the second lower electrodes and in a space adjacent to one of the second lower electrodes that is disposed at a first end portion. Each of the second dielectric structures is disposed between one of the second lower electrodes and a corresponding one of the second upper electrodes. The second upper conductive pattern is formed on and is electrically connected to the second upper electrodes. Each of the first dielectric structures includes a first dielectric pattern extending in a vertical direction that is substantially perpendicular to the upper surface of the substrate, and at least one second dielectric pattern disposed on a sidewall of the first dielectric pattern. Each of the second dielectric structures includes a third dielectric pattern extending in the vertical direction, and at least one fourth dielectric pattern disposed on a sidewall of the fifth dielectric pattern. A number of the second dielectric pattern is different from a number of the fourth dielectric patterns.

A semiconductor device includes active patterns, gate structures, bit line structures, contact plug structures and capacitors. The active patterns are formed on a substrate. The gate structures are spaced apart from each other in a second direction that is substantially parallel to an upper surface of the substrate, and each of the gate structures extends in upper portions of the active patterns in a first direction that is substantially parallel to the upper surface of the substrate and is substantially perpendicular to the second direction. The bit line structures are spaced apart from each other in the first direction, and each of the bit line structures extends in the second direction on central portions of corresponding ones of the active patterns. The contact plug structures are formed on opposite end portions of the active patterns. The capacitors are formed on the contact plug structures, respectively. The contact plug structures include first contact plugs and second contact plugs. The capacitors include a first capacitor and a second capacitor. The first capacitor includes first lower electrodes, first upper electrodes and first dielectric structures. The first lower electrodes are spaced apart from each other on a corresponding one of the first contact plugs in a horizontal direction that is substantially parallel to an upper surface of the substrate, and the first lower electrodes are electrically connected to the corresponding one of the first contact plugs. The first upper electrodes are formed in a space between the first lower electrodes and in a space adjacent to one of the first lower electrodes that is disposed at a first end portion. Each of the first dielectric structures is disposed between one of the first lower electrodes and a corresponding one of the first upper electrodes. The second capacitor includes second lower electrodes, second upper electrodes and second dielectric structures. The second lower electrodes are spaced apart from each other on a corresponding one of the second contact plugs in the horizontal direction, and the second lower electrodes are electrically connected to the corresponding one of the second contact plugs. The second upper electrodes are formed in a space between the second lower electrodes and in a space adjacent to one of the second lower electrodes that is disposed at a first end portion. Each of the second dielectric structures is disposed between one of the second lower electrodes and a corresponding one of the second upper electrodes. A first upper conductive pattern is disposed on and is electrically connected to the first upper electrodes, and a second conductive pattern is disposed on and is electrically connected to the second upper electrodes. The first and second conductive patterns are electrically insulated from each other.

A semiconductor device includes active patterns, gate structures, bit line structures, contact plug structures and capacitors. The active patterns are formed on a substrate. The gate structures are spaced apart from each other in a second direction that is substantially parallel to an upper surface of the substrate, and each of the gate structures extends in upper portions of the active patterns in a first direction that is substantially parallel to the upper surface of the substrate and is substantially perpendicular to the second direction. The bit line structures are spaced apart from each other in the first direction, and each of the bit line structures extends in the second direction on central portions of corresponding ones of the active patterns. The contact plug structures are formed on opposite end portions of the active patterns. The capacitors are formed on the contact plug structures, respectively. The contact plug structures includes first contact plugs and second contact plugs. The capacitors include a first capacitor and a second capacitor. The first capacitor includes first lower electrodes, first upper electrodes and first dielectric structures. The first lower electrodes are spaced apart from each other on a corresponding one of the first contact plugs in a horizontal direction that is substantially parallel to an upper surface of the substrate, and the first lower electrodes are electrically connected to the corresponding one of the first contact plugs. The first upper electrodes are formed in a space between the first lower electrodes and in a space adjacent to one of the first lower electrodes that is disposed at a first end portion. Each of the first dielectric structures is disposed between one of the first lower electrodes and a corresponding one of the first upper electrodes. The second capacitor includes second lower electrodes, second upper electrodes and second dielectric structures. The second lower electrodes are spaced apart from each other on a corresponding one of the second contact plugs in the horizontal direction, and the second lower electrodes are electrically connected to the corresponding one of the second contact plugs. The second upper electrodes are formed in a space between the second lower electrodes and in a space adjacent to one of the second lower electrodes that is disposed at a first end portion. Each of the second dielectric structures is disposed between one of the second lower electrodes and a corresponding one of the second upper electrodes. A first upper conductive pattern is disposed on and is electrically connected to the first upper electrodes, and a second conductive pattern is disposed on and is electrically connected to the second upper electrodes. Each of the first dielectric structures includes a third dielectric pattern extending in a vertical direction that is substantially perpendicular to the upper surface of the substrate, a second dielectric pattern disposed on a sidewall of the third dielectric pattern, and a first dielectric pattern disposed on an outer sidewall of the second dielectric pattern and contacting sidewalls of the first lower electrode and the first upper electrode. Each of the second dielectric structures includes a fifth dielectric pattern extending in the vertical direction, and a fourth dielectric pattern disposed on a sidewall of the fifth dielectric pattern and contacting sidewalls of the second lower electrode and the second upper electrode.

A semiconductor device includes active patterns, gate structures, bit line structures, contact plug structures and capacitors. The active patterns are formed on a substrate. The gate structures are spaced apart from each other in a second direction that is substantially parallel to an upper surface of the substrate, and each of the gate structures extends in upper portions of the active patterns in a first direction that is substantially parallel to the upper surface of the substrate and substantially perpendicular to the second direction. The bit line structures are spaced apart from each other in the first direction, and each of the bit line structures extends in the second direction on central portions of corresponding ones of the active patterns. The contact plug structures are formed on opposite end portions of the active patterns. The capacitors are formed on the contact plug structures, respectively. The contact plug structures includes first contact plugs and second contact plugs. The capacitors include a first capacitor and a second capacitor. The first capacitor includes first lower electrodes, first upper electrodes and first dielectric structures. The first lower electrodes are spaced apart from each other on a corresponding one of the first contact plugs in a horizontal direction that is substantially parallel to an upper surface of the substrate, and the first lower electrodes are electrically connected to the corresponding one of the first contact plugs. The first upper electrodes are formed in a space between the first lower electrodes and in a space adjacent to one of the first lower electrodes that is disposed at a first end portion. Each of the first dielectric structures are disposed between one of the first lower electrodes and a corresponding one of the first upper electrodes. The second capacitor includes second lower electrodes, second upper electrodes and second dielectric structures. The second lower electrodes are spaced apart from each other on a corresponding one of the second contact plugs in the horizontal direction, and the second lower electrodes are electrically connected to the corresponding one of the second contact plugs. The second upper electrodes are formed in a space between the second lower electrodes and in a space adjacent to one of the second lower electrodes that is disposed at a first end portion. Each of the second dielectric structures are disposed between one of the second lower electrodes and a corresponding one of the second upper electrodes. A first upper conductive pattern is disposed on and is electrically connected to the first upper electrodes, and a second conductive pattern is disposed on and is electrically connected to the second upper electrodes. Each of the first dielectric structures includes a first dielectric pattern extending in a vertical direction that is substantially perpendicular to the upper surface of the substrate, and at least one second dielectric pattern disposed on a sidewall of the first dielectric pattern. Each of the second dielectric structures includes a third dielectric pattern extending in the vertical direction, and at least one fourth dielectric pattern disposed on a sidewall of the fifth dielectric pattern. A number of the second dielectric patterns is different from a number of the fourth dielectric patterns.

A semiconductor device includes bit line structures, gate electrodes, gate insulation patterns, channels, contact plug structures and capacitors disposed on a substrate. Each of the bit line structures extends in a first direction that is substantially parallel to an upper surface of the substrate, and the bit lines are spaced apart from each other in a second direction that is substantially parallel to the upper surface of the substrate and crossing the first direction. The gate electrodes are spaced apart from each other in the first direction on the bit lines, and each of the gate electrodes extends in the second direction. The gate insulation patterns are formed on sidewalls of the gate electrodes, respectively. The channels are formed on sidewalls of the gate insulation patterns, respectively, and each of the channels includes an oxide semiconductor material. The contact plug structures contact upper surfaces of the channels, respectively. The capacitors are formed on the contact plug structures, respectively. The contact plug structures include first contact plugs and second contact plugs. The capacitors include a first capacitor and a second capacitor. The first capacitor includes first lower electrodes, first upper electrodes and first dielectric structures. The first lower electrodes are spaced apart from each other on a corresponding one of the first contact plugs in a horizontal direction that is substantially parallel to an upper surface of the substrate, and the first lower electrodes are electrically connected to the corresponding one of the first contact plugs. The first upper electrodes are formed in a space between the first lower electrodes and in a space adjacent to one of the first lower electrodes that is disposed at a first end portion. Each of the first dielectric structures are disposed between one of the first lower electrodes and a corresponding one of the first upper electrodes. The second capacitor includes second lower electrodes, second upper electrodes and second dielectric structures. The second lower electrodes are spaced apart from each other on a corresponding one of the second contact plugs in the horizontal direction, and the second lower electrodes are electrically connected to the corresponding one of the second contact plugs. The second upper electrodes are formed in a space between the second lower electrodes and in a space adjacent to one of the second lower electrodes that is disposed at a first end portion. Each of the second dielectric structures are disposed between one of the second lower electrodes and a corresponding one of the second upper electrodes. A first upper conductive pattern is disposed on and is electrically connected to the first upper electrodes, and a second conductive pattern is disposed on and is electrically connected to the second upper electrodes. The first and second conductive patterns are electrically insulate from each other.

A semiconductor device includes bit line structures, gate electrodes, gate insulation patterns, channels, contact plug structures and capacitors disposed on a substrate. Each of the bit line structures extends in a first direction that is substantially parallel to an upper surface of the substrate, and the bit lines are spaced apart from each other in a second direction that is substantially parallel to the upper surface of the substrate and crossing the first direction. The gate electrodes are spaced apart from each other in the first direction on the bit lines, and each of the gate electrodes extends in the second direction. The gate insulation patterns are formed on sidewalls of the gate electrodes, respectively. The channels are formed on sidewalls of the gate insulation patterns, respectively, and each of the channels include an oxide semiconductor material. The contact plug structures contact upper surfaces of the channels, respectively. The capacitors are formed on the contact plug structures, respectively. The contact plug structures include first contact plugs and second contact plugs. The capacitors include a first capacitor and a second capacitor. The first capacitor includes first lower electrodes, first upper electrodes and first dielectric structures. The first lower electrodes are spaced apart from each other on a corresponding one of the first contact plugs in a horizontal direction that is substantially parallel to an upper surface of the substrate, and the first lower electrodes are electrically connected to the corresponding one of the first contact plugs. The first upper electrodes are formed in a space between the first lower electrodes and in a space adjacent to one of the first lower electrodes that is disposed at a first end portion. Each of the first dielectric structures are disposed between one of the first lower electrodes and a corresponding one of the first upper electrodes. The second capacitor includes second lower electrodes, second upper electrodes and second dielectric structures. The second lower electrodes are spaced apart from each other on a corresponding one of the second contact plugs in the horizontal direction, and the second lower electrodes are electrically connected to the corresponding one of the second contact plugs. The second upper electrodes are formed in a space between the second lower electrodes and in a space adjacent to one of the second lower electrodes that is disposed at a first end portion. Each of the second dielectric structures is disposed between one of the second lower electrodes and a corresponding one of the second upper electrodes. A first upper conductive pattern is disposed on and is electrically connected to the first upper electrodes, and a second conductive pattern is disposed on and is electrically connected to the second upper electrodes. Each of the first dielectric structures includes a third dielectric pattern extending in a vertical direction that is substantially perpendicular to the upper surface of the substrate, a second dielectric pattern disposed on a sidewall of the third dielectric pattern, and a first dielectric pattern disposed on an outer sidewall of the second dielectric pattern and contacting sidewalls of the first lower electrode and the first upper electrode. Each of the second dielectric structures includes a fifth dielectric pattern extending in the vertical direction, and a fourth dielectric pattern disposed on a sidewall of the fifth dielectric pattern and contacting sidewalls of the second lower electrode and the second upper electrode.

A semiconductor device includes bit line structures, gate electrodes, gate insulation patterns, channels, contact plug structures and capacitors disposed on a substrate. Each of the bit line structures extends in a first direction that is substantially parallel to an upper surface of the substrate, and the bit lines are spaced apart from each other in a second direction that is substantially parallel to the upper surface of the substrate and crossing the first direction. The gate electrodes are spaced apart from each other in the first direction on the bit lines, and each of the gate electrodes extends the second direction. The gate insulation patterns are formed on sidewalls of the gate electrodes, respectively. The channels are formed on sidewalls of the gate insulation patterns, respectively, and each of the channels includes an oxide semiconductor material. The contact plug structures contact upper surfaces of the channels, respectively. The capacitors are formed on the contact plug structures, respectively. The contact plug structures include first contact plugs and second contact plugs. The capacitors include a first capacitor and a second capacitor. The first capacitor includes first lower electrodes, first upper electrodes and first dielectric structures. The first lower electrodes are spaced apart from each other on a corresponding one of the first contact plugs in a horizontal direction that is substantially parallel to an upper surface of the substrate, and the first lower electrodes are electrically connected to the corresponding one of the first contact plugs. The first upper electrodes are formed in a space between the first lower electrodes and in a space adjacent to one of the first lower electrodes that is disposed at a first end portion. Each of the first dielectric structures is disposed between one of the first lower electrodes and a corresponding one of the first upper electrodes. The second capacitor includes second lower electrodes, second upper electrodes and second dielectric structures. The second lower electrodes are spaced apart from each other on a corresponding one of the second contact plugs in the horizontal direction, and the second lower electrodes is electrically connected to the corresponding one of the second contact plugs. The second upper electrodes are formed in a space between the second lower electrodes and in a space adjacent to one of the second lower electrodes that is disposed at a first end portion. Each of the second dielectric structures is disposed between one of the second lower electrodes and a corresponding one of the second upper electrodes. A first upper conductive pattern is disposed on and is electrically connected to the first upper electrodes, and a second conductive pattern is disposed on and is electrically connected to the second upper electrodes. Each of the first dielectric structures includes a first dielectric pattern extending in a vertical direction that is substantially perpendicular to the upper surface of the substrate, and at least one second dielectric pattern disposed on a sidewall of the first dielectric pattern. Each of the second dielectric structures includes a third dielectric pattern extending in the vertical direction, and at least one fourth dielectric pattern disposed on a sidewall of the fifth dielectric pattern. A number of the second dielectric pattern is different from a number of the fourth dielectric patterns.

BRIEF DESCRIPTION OF THE DRAWINGS

FIGS. 17 to 32 are plan views and cross-sectional views illustrating a method of manufacturing a semiconductor device according to example embodiments.

FIGS. 35 to 45 are plan views and cross-sectional views illustrating a method of manufacturing a semiconductor device in accordance with example embodiments.

DETAILED DESCRIPTION

The above and other aspects and features of the capacitor structures and the methods of manufacturing the same, the semiconductor devices including the capacitor structures and the methods of manufacturing the same in accordance with example embodiments will become readily understood from detail descriptions that follow, with reference to the accompanying drawings.

It will be understood that, although the terms "first," "second," and/or "third" may be used herein to describe various materials, layers, regions, pads, electrodes, patterns, structure and/or processes, these various materials, layers, regions, pads, electrodes, patterns, structure and/or processes should not necessarily be limited by these terms. These terms are used to distinguish one material, layer, region, pad, electrode, pattern, structure or process from another material, layer, region, pad, electrode, pattern, structure or process. Thus, "first", "second" and/or "third" may be used selectively or interchangeably for each material, layer, region, electrode, pad, pattern, structure or process respectively.

Figure 1:
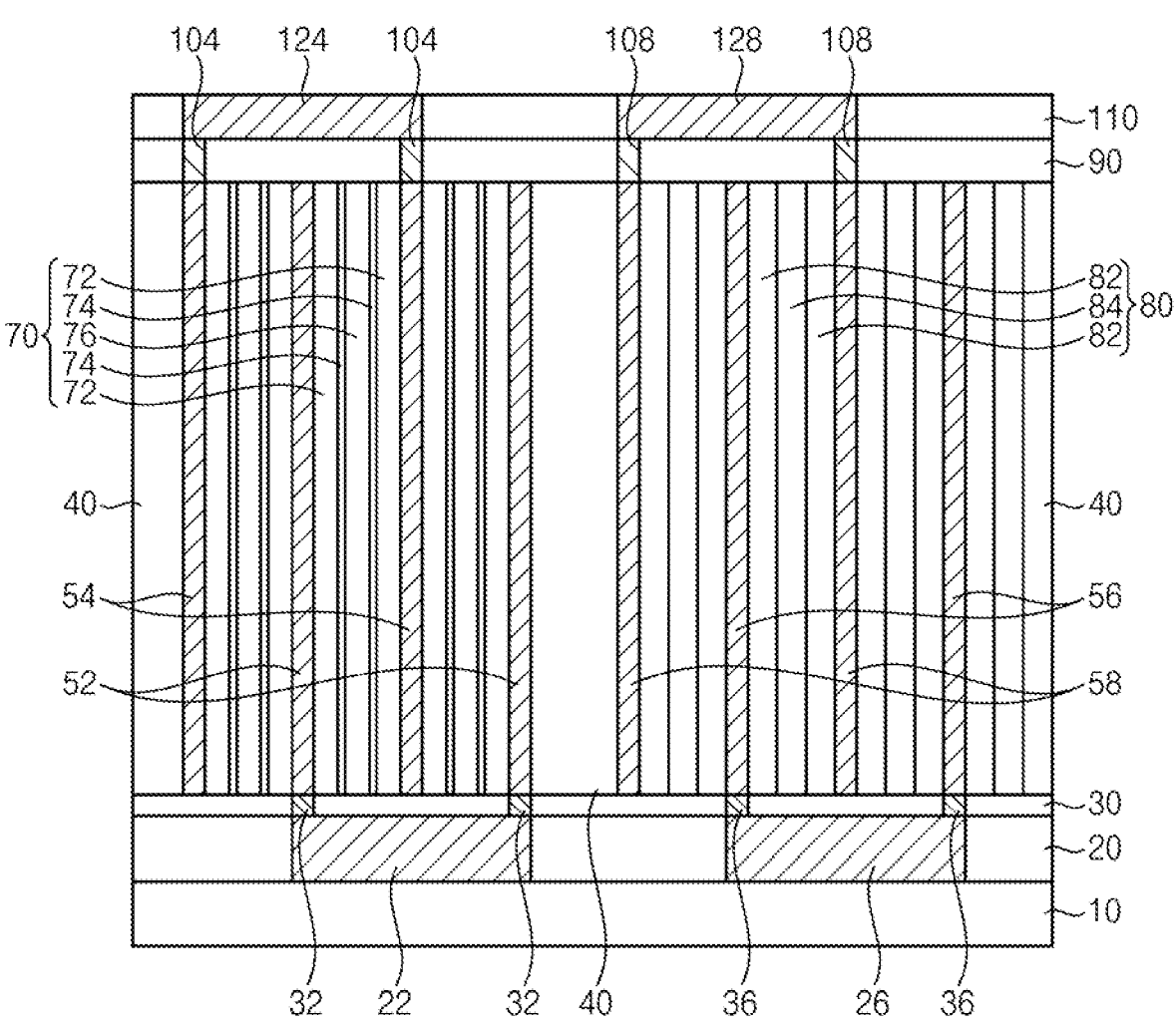
FIG. 1 is a cross-sectional view illustrating a first capacitor structure according to example embodiments.

FIG. 1 is a cross-sectional view illustrating a first capacitor structure according to example embodiments.

The first capacitor structure may include first, second, third and fourth conductive patterns 22, 26, 124 and 128, first, second, third and fourth electrodes 52, 54, 56 and 58, first, second, third and fourth vias 32, 36, 104 and 108, and first and second dielectric structures 70 and 80 disposed on a substrate 10. The first capacitor structure may further include first, second, third and fourth insulating interlayers 20, 30, 90 and 110 and a mold layer 40 on the substrate 10.

The substrate 10 may include silicon, germanium, silicon-germanium, or a III-V group compound semiconductor, such as GaP, GaAs, or GaSb. In example embodiments, the substrate 10 may be a silicon-on-insulator (SOI) substrate or a germanium-on-insulator (GOI) substrate.

The first and second insulating interlayers 20 and 30 may be stacked on the substrate 10, the first and second conductive patterns 22 and 26 may extend through the first insulating interlayer 20, and the first and second vias 32 and 36 may extend through the second insulating interlayer 30 and contact upper surfaces of the first and second conductive patterns 22 and 26, respectively.

In example embodiments, neighboring pairs of the first vias 32 may form a first via pair, and the neighboring pairs of the first vias 32 of the first via pair may contact upper surfaces of opposite edge portions, respectively, of the first conductive pattern 22. Additionally, neighboring pairs of the second vias 36 may form a second via pair, and the neighboring pairs of the second vias 36 of the second via pair may contact upper surfaces of opposite edge portions, respectively, of the second conductive pattern 26.

Each of the first and second conductive patterns 22 and 26 may include, e.g., contact plugs, landing pads, etc. In example embodiments, a plurality of first conductive patterns 22 may be spaced apart from each other in a horizontal direction that is substantially parallel to an upper surface of the substrate 10, and a plurality of second conductive patterns 26 may be spaced apart from each other in the horizontal direction. FIG. 1 shows one first conductive pattern 22 and one second conductive pattern 26.

Each of the first and second insulating interlayers 20 and 30 may include an oxide, e.g., silicon oxide, or a low-k dielectric material (e.g., a material having a dielectric constant at least as low as that of silicon oxide). Each of the first and second conductive patterns 22 and 26 and each of the first and second vias 32 and 36 may include, e.g., a metal, a metal nitride, a metal silicide, doped polysilicon, etc.

The mold layer 40 may be formed on the second insulating interlayer 30 and the first and second vias 32 and 36. Each of the first to fourth electrodes 52, 54, 56 and 58 may have a pillar shape extending in a vertical direction that is substantially perpendicular to the upper surface of the substrate 10, and may extend through the mold layer 40.

As used herein, the term "extending" when used to describe the orientation of a three-dimensional shape, referrers to a direction of extension of that shape's longest dimension.

The mold layer 40 may include an oxide, e.g., silicon oxide.

The first and third electrodes 52 and 56 may contact upper surfaces of the first and second vias 32 and 36, respectively. Thus, neighboring pairs of the first electrodes 52 may form a first electrode pair, and neighboring pairs of the third electrodes 56 may form a third electrode pair.

The second electrode 54 may contact an upper surface of a portion of the second insulating interlayer 30 between the first electrodes 52 and an upper surface of a portion of the second insulating interlayer 30 adjacent to the first electrode 52. The fourth electrode 58 may contact an upper surface of a portion of the second insulating interlayer 30 between the third electrodes 56 and an upper surface of a portion of the second insulating interlayer 30 adjacent to the third electrode 56. Neighboring pairs of the second electrodes 54 may form a second electrode pair, and neighboring pairs of the fourth electrodes 58 may form a fourth electrode pair.

Each of the first to fourth electrodes 52, 54, 56 and 58 may have a pillar shape extending in the vertical direction. Each of the first to fourth electrodes 52, 54, 56 and 58 may have a shape of, e.g., a circle, an ellipse, a polygon, a polygon with rounded corners, etc., in a plan view. In an example embodiment, each of the first to fourth electrodes 52, 54, 56 and 58 may extend in a direction among the horizontal directions, and a length in the direction of each of the first to fourth electrodes 52, 54, 56 and 58 may be greater than a length in a direction that is substantially perpendicular to the direction among the horizontal directions.

Each of the first to fourth electrodes 52, 54, 56 and 58 may include, e.g., a metal nitride, e.g., titanium nitride, tantalum nitride, a metal, a metal silicide, etc.

The first dielectric structure 70 may extend through the mold layer 40. The first dielectric structure 70 may be formed between the first and second electrodes 52 and 54, and may contact sidewalls of the first and second electrodes 52 and 54. As the neighboring pairs of the first electrodes 52 form the first electrode pair and the neighboring pairs of the second electrodes 54 form the second electrode pair, three first dielectric structures 70 may be formed adjacent to the first and second electrode pairs.

In example embodiments, each of the first dielectric structures 70 may include a third dielectric pattern 76 having a pillar shape, a second dielectric pattern 74 on a sidewall of the third dielectric pattern 76 and having a cylindrical shape, and a first dielectric pattern 72 on an outer sidewall of the second dielectric pattern 74 and having a cylindrical shape. The first dielectric pattern 72 may contact sidewalls of the first and second electrodes 52 and 54.

Each of the first to third dielectric patterns 72, 74 and 76 may include a paraelectric substance, an antiferroelectric substance or a ferroelectric substance. In example embodiments, each of the first to third dielectric patterns 72, 74 and 76 may include a metal oxide having a high dielectric constant (e.g., a dielectric constant at least as great as that of silicon oxide). e.g., hafnium oxide, zirconium oxide, etc. In an example embodiment each of the first and third dielectric patterns 72 and 76 may include zirconium oxide, and the second dielectric pattern 74 may include hafnium oxide. Alternatively, each of the first and third dielectric patterns 72 and 76 may include hafnium oxide, and the second dielectric pattern 74 may include zirconium oxide.

The second dielectric structure 80 may extend through the mold layer 40, and may be formed between the third and fourth electrodes 56 and 58 may contact sidewalls of the third and fourth electrodes 56 and 58. As the neighboring pairs of the third electrodes 56 form the third electrode pair and the neighboring pairs of the fourth electrodes 58 form the fourth electrode pair, three second dielectric structures 80 may be formed adjacent to the third and fourth electrode pairs.

In example embodiments, each of the second dielectric structures 80 may include a fifth dielectric pattern 84 having a pillar shape, and a fourth dielectric pattern 82 on a sidewall of the fifth dielectric pattern 84 and having a cylindrical shape. The fourth dielectric pattern 82 may contact the sidewalls of the third and fourth electrodes 56 and 58.

In example embodiments, each of the fourth and fifth dielectric patterns 82 and 84 may include a metal oxide having a high dielectric constant (e.g., a dielectric constant at least as great as that of silicon oxide), e.g., hafnium oxide, zirconium oxide, etc. In an example embodiment, the fourth dielectric pattern 82 may include zirconium oxide, and the fifth dielectric pattern 84 may include hafnium oxide. Alternatively, the fourth dielectric pattern 82 may include hafnium oxide, and the fifth dielectric pattern 84 may include zirconium oxide.

FIG. 1 shows that the first dielectric structure 70 includes three dielectric patterns and the second dielectric structure 80 includes two dielectric patterns, however, the inventive concept is not necessarily limited thereto, and the first and second dielectric structures 70 and 80 may include different numbers of the dielectric patterns that are sequentially stacked in the horizontal direction.

For example, the first dielectric structure 70 may include the third dielectric pattern 76, and one or more dielectric patterns that are sequentially stacked from a sidewall of the third dielectric pattern 76 in the horizontal direction, which may be referred to as an eighth dielectric pattern. The second dielectric structure 80 may include the fifth dielectric pattern 84, and one or more dielectric patterns that are sequentially stacked from a sidewall of the fifth dielectric pattern 84 in the horizontal direction, which may be referred to as a ninth dielectric pattern. A number of the eighth and a number of the ninth dielectric patterns, respectively, may be different from each other.

The third and fifth dielectric patterns 76 and 84 may include a same material or different materials. In an example embodiment, if the first dielectric structure 70 includes a plurality of eighth dielectric patterns, at least one of the plurality of eighth dielectric patterns may include a dielectric material that is different from a dielectric material of at least another one of the plurality of eighth dielectric patterns. Likewise, if the second dielectric structure 80 includes a plurality of ninth dielectric patterns, at least one of the plurality of ninth dielectric patterns may include a dielectric material that is different from a dielectric material of at least another one of the plurality of ninth dielectric patterns.

The third and fourth insulating interlayers 90 and 110 may be stacked on the mold layer 40, the first to fourth electrodes 52, 54, 56 and 58, and the first and second dielectric structures 70 and 80, the third and fourth vias 104 and 108 may extend through the third insulating interlayer 90 and may contact upper surfaces of the second and fourth electrodes 54 and 58, respectively, and the third and fourth conductive patterns 124 and 128 may extend through the fourth insulating interlayer 110 and may contact upper surfaces of the third and fourth vias 104 and 108, respectively.

In example embodiments, neighboring pairs of the third vias 104 may form a third via pair, and may contact lower surfaces of opposite edge portions, respectively, of the third conductive pattern 124. Additionally, neighboring pairs of the fourth vias 108 may form a fourth via pair, and may contact lower surfaces of opposite edge portions, respectively, of the fourth conductive pattern 128.

Each of the third insulating interlayers 90 and 110 may include an oxide, e.g., silicon oxide or a low-k dielectric material (e.g., a material having a dielectric constant at least as low as that of silicon oxide), and each of the third and fourth vias 104 and 108 and each of the third and fourth conductive patterns 124 and 128 may include, e.g., a metal, a metal nitride, a metal silicide, doped polysilicon, etc.

In example embodiments, the first capacitor structure may include a first capacitor and a second capacitor. The first capacitor may include first and second electrodes 52 and 54 and the first dielectric structure 70, and the second capacitor may include third and fourth electrodes 56 and 58 and the second dielectric structures 80.

In the first capacitor, the first electrodes 52 may be electrically connected to each other through the first vias 32 and the first conductive pattern 22, the second electrodes 54 may be electrically connected to each other through the third vias 104 and the third conductive pattern 124. Each of the first dielectric structures 70 may be formed between the first and second electrodes 52 and 54.

The first and third conductive patterns 22 and 124 may be formed under and over the first and second electrodes 52 and 54, respectively, and thus may also be referred to as a first lower conductive pattern 22 and a first upper conductive pattern 124, respectively. Likewise, the first and third vias 32 and 104 may be formed under and over the first and second electrodes 52 and 54, respectively, and thus may also be referred to as a first lower via 32 and a first upper via 104, respectively. The first and second electrodes 52 and 54 may also be referred to as a first lower electrode 52 and a first upper electrode 54, respectively.

Thus, the first capacitor may include a first capacitor having the first lower electrode 52, the first dielectric structure 70 and the first upper electrode 54, a second capacitor having the first upper electrode 54, the first dielectric structure 70 and the first lower electrode 52, and a third capacitor having the first lower electrode 52, the first dielectric structure 70 and the first upper electrode 54. The first to third capacitors may be connected in parallel. Accordingly, the first capacitor may have an electric capacitance that may be a sum of electric capacitances of the first to third capacitors, respectively.

For example, the first capacitor may include a plurality of capacitors connected in parallel, and may have the electric capacitance corresponding to the sum of the electric capacitances of the capacitors, respectively. Thus, the first capacitor may have an increased electric capacitance. FIG. 1 shows that the first capacitor includes three capacitors having four electrodes and three dielectric patterns disposed therebetween, however, the inventive concept is not necessarily limited thereto. For example, the first capacitor may include N capacitors having (N+1) electrodes and N dielectric patterns disposed therebetween, and may have an increased electric capacitance as the capacitors are connected in parallel.

Additionally, the third electrodes 56 may be electrically connected to each other through the second vias 36 and the second conductive pattern 26, and the fourth electrodes 58 may be electrically connected to each other through the fourth vias 108 and the fourth conductive pattern 128. Each of the second dielectric structures 80 may be formed between the third and fourth electrodes 56 and 58.

The second and fourth conductive patterns 26 and 128 may be formed under and over the third and fourth electrodes 56 and 58, respectively, and thus may also be referred to as a second lower conductive pattern 26 and a second upper conductive pattern 128, respectively. Likewise, the second and fourth vias 36 and 108 may be formed under and over the third and fourth electrodes 56 and 58, respectively, and thus may also be referred to as a second lower via 36 and a second upper via 108, respectively. The third and fourth electrodes 56 and 58 may also be referred to as a second lower electrode 56 and a second upper electrode 58, respectively.

Thus, the second capacitor may include a third capacitor having the second lower electrode 56, the second dielectric structure 80 and the second upper electrode 58, a fifth capacitor having the second upper electrode 58, the second dielectric structure 80 and the second lower electrode 56, and a sixth capacitor having the second lower electrode 56, the second dielectric structure 80 and the second upper electrode 58. The fourth to sixth capacitors may be connected in parallel. Accordingly, the second capacitor may have an electric capacitance that may be a sum of electric capacitances of the fourth to sixth capacitors, respectively.

For example, the second capacitor may include a plurality of capacitors connected in parallel, and may have the electric capacitance corresponding to the sum of the electric capacitances of the capacitors, respectively. Thus, the second capacitor may have an increased electric capacitance. FIG. 1 shows that the second capacitor includes three capacitors having four electrodes and three dielectric patterns disposed therebetween, however, the inventive concept is not necessarily limited thereto. For example, the second capacitor may include N capacitors having (N+1) electrodes and N dielectric patterns disposed therebetween, and may have an increased electric capacitance as the capacitors are connected in parallel.

The first dielectric structure 70 may include the first to third dielectric patterns 72, 74 and 76 that are sequentially stacked in the horizontal direction, and the second dielectric structure 80 may include fourth and fifth dielectric patterns 82 and 84 stacked in the horizontal direction. Some of the first to fifth dielectric patterns 72, 74 and 76 may include a same material or different materials. However, even if the first and second dielectric structures 70 and 80 include the same dielectric patterns, the stack structure of the first and second dielectric structures 70 and 80 are different from each other, and thus the first and second dielectric structures 70 and 80 may have different dielectric constants from each other.

Thus, the first capacitor including the first dielectric structures 70 and the second capacitor including the second dielectric structures 80 may have different electric capacitances from each other. For example, the stack structure of the dielectric patterns included in the first and second dielectric structures 70 and 80 or the dielectric materials included in the dielectric patterns may be adjusted so as to control the total dielectric constant of the first and second dielectric structures 70 and 80, and thus the first and second capacitors including the first and second dielectric structures 70 and 80, respectively, may have different electric capacitances from each other.

FIG. 1 shows that the first dielectric structure 70 includes three dielectric patterns and the second dielectric structure 80 includes two dielectric patterns, however, the inventive concept is not necessarily limited thereto.

In some embodiments, the first and second dielectric structures 70 and 80 may include the same numbers of the dielectric patterns, and in this case, at least one of the dielectric patterns included in the first and second dielectric structures 70 and 80, respectively, may have different dielectric materials from each other so that the first and second dielectric structures 70 and 80 may have different total dielectric constants from each other.

As illustrated above, the first and second capacitors included in the first capacitor structure may have different dielectric constants from each other, and thus, even if the same voltage is applied to the first and second capacitors, amounts of electric charges stored in the first and second capacitors may be different from each other.

Further, different voltages may be applied to the first and second capacitors, respectively. For example, voltages applied to the first and second conductive patterns 22 and 26 that may be electrically connected to the first and second capacitors, respectively, may be different, or voltages applied to the third and fourth conductive patterns 124 and 128 may be different so that different voltages may be applied to the first and second capacitors, respectively. Accordingly, the amounts of electric charges stored in the first and second capacitors may be different from each other.

As a result, the electric charges stored in the first and second capacitors may be controlled by adjusting the dielectric constants of the first and second capacitors or the voltages applied to the first and second capacitors, and multi-level bit may be implemented by the first capacitor structure including the first and second capacitors.

FIGS. 2 to 9 are cross-sectional views illustrating a method of forming a first capacitor structure in accordance with example embodiments.

Figure 2:
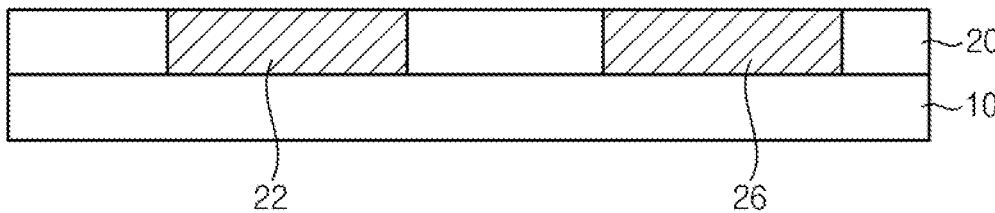
FIGS. 2 to 9 are cross-sectional views illustrating a method of forming a first capacitor structure in accordance with example embodiments.

Referring to FIG. 2, a first insulating interlayer 20 containing the first and second conductive patterns 22 and 26 may be formed on a substrate 10.

Figure 3:
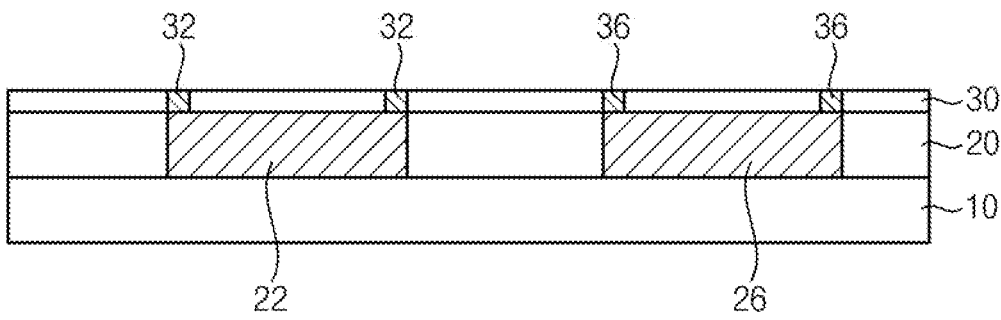

Referring to FIG. 3, a second insulating interlayer 30 may be formed on the first insulating interlayer 20 and the first and second conductive patterns 22 and 26, and first and second vias 32 and 36 may be formed through the second insulating interlayer 30 and may contact upper surfaces of the first and second conductive patterns 22 and 26, respectively.

In example embodiments, two first vias 32 may be spaced apart from each other and may contact upper surfaces of opposite edge portions, respectively, of the first conductive pattern 22, which may form a first via pair. Likewise, two second vias 36 may be spaced apart from each other and may contact upper surfaces of opposite edge portions, respectively, of the second conductive pattern 22, which may form a second via pair.

Figure 4:
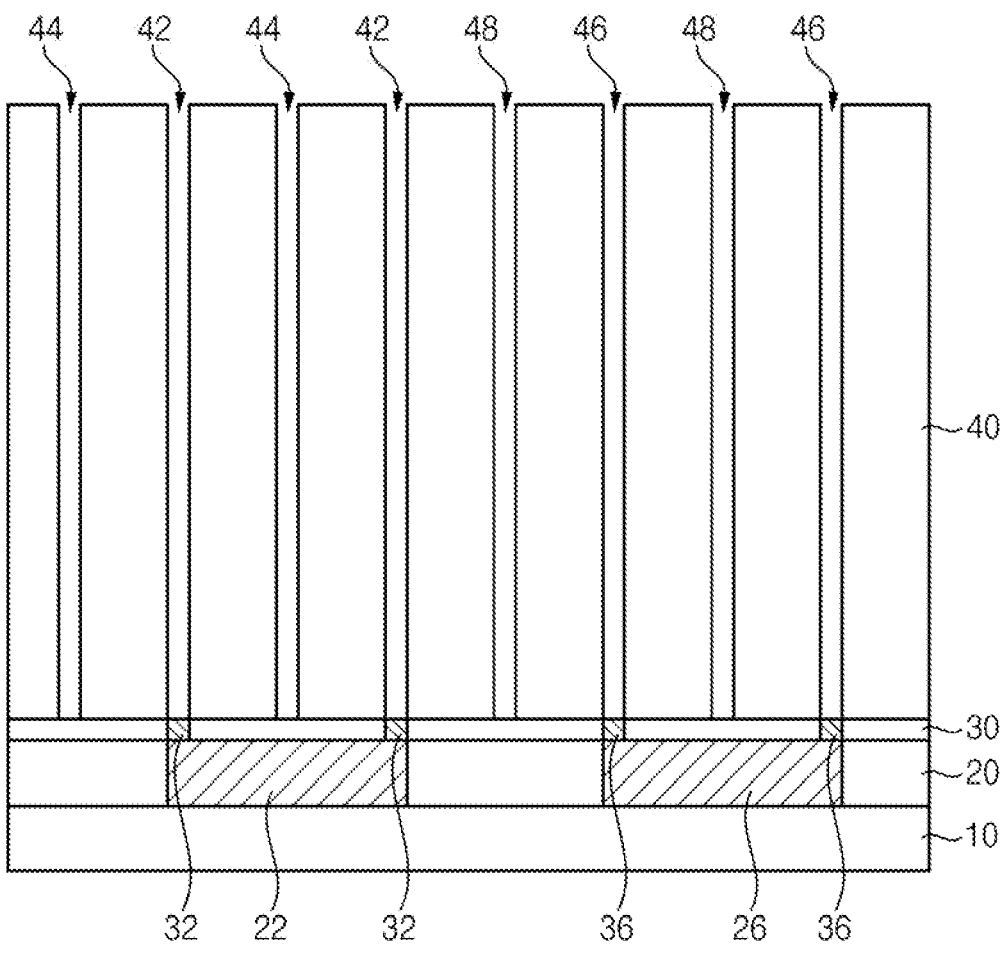

Referring to FIG. 4, a mold layer 40 may be formed on the second insulating interlayer 30 and the first and second vias 32 and 36, and first to fourth holes 42, 44, 46 and 48 may be formed through the mold layer 40.

The first and third holes 42 and 46 may expose upper surfaces of the first and second vias 32 and 36, respectively, the second hole 44 may expose an upper surface of a portion of the second insulating interlayer 30 between the first holes 42 and an upper surface of a portion of the second insulating interlayer 30 adjacent to the first hole 42, and the fourth hole 48 may expose an upper surface of a portion of the second insulating interlayer 30 between the third holes 46 and an upper surface of a portion of the second insulating interlayer 30 adjacent to the third hole 46.

The mold layer 40 may include an oxide, e.g., silicon oxide or a low-k dielectric material (e.g., a material having a dielectric constant at least as low as that of silicon oxide).

Figure 5:
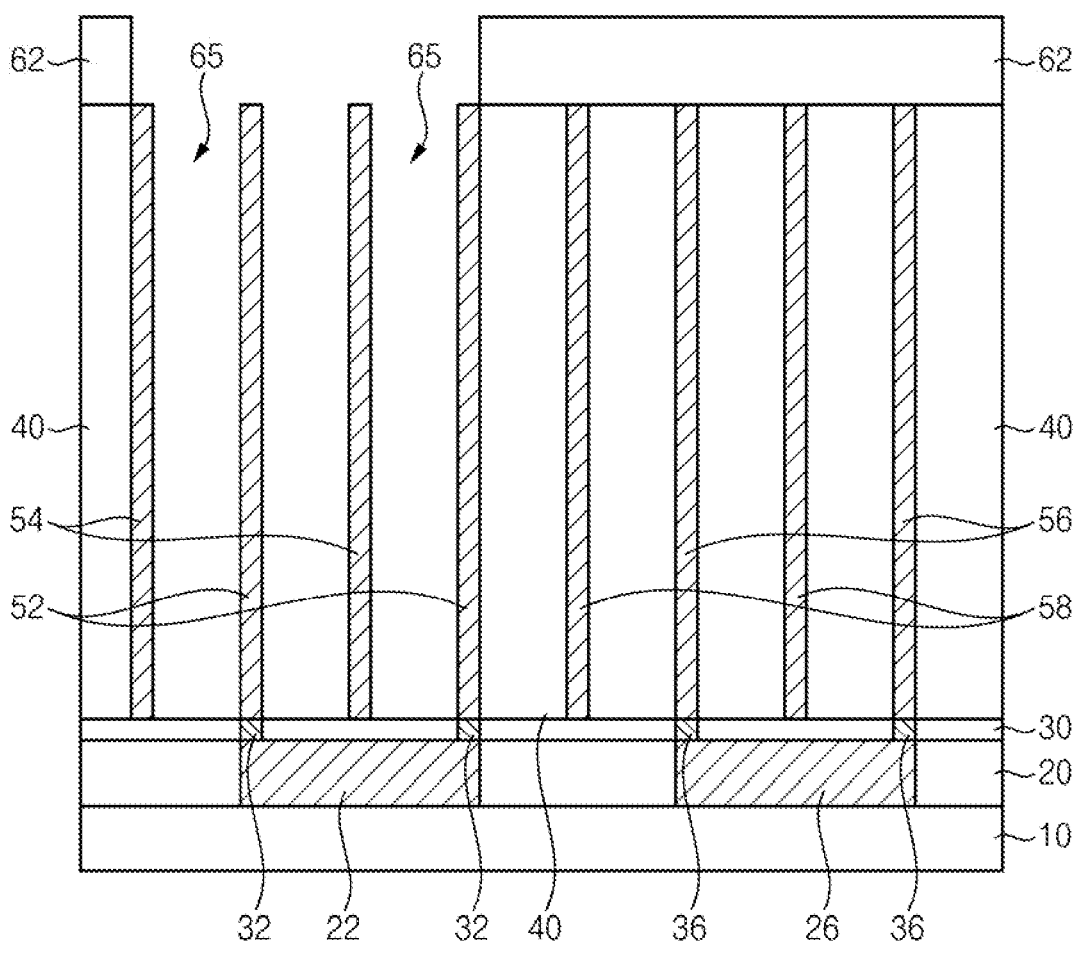

Referring to FIG. 5, first to fourth electrodes 52, 54, 56 and 58 may be formed in the first to fourth holes 42, 44, 46 and 48, respectively, a first mask 62 may be formed on the mold layer 40 and the third and fourth electrodes 56 and 58, and an etching process may be performed using the first mask 62 as an etching mask.

In example embodiments, the first mask 62 may be formed on upper surfaces of the third and fourth electrodes 56 and 58, an upper surface of a portion of the mold layer 40 between the third and fourth electrodes 56 and 58, and an upper surface of a portion of the mold layer 40 between the first and fourth electrodes 52 and 58, and may expose upper surfaces of the first and second electrodes 52 and 54 and an upper surface of a portion of the mold layer 40 between the first and second electrodes 52 and 54.

Thus, the portion of the mold layer 40 between the first and second electrodes 52 and 54 may be removed by the etching process, and a first opening 65 exposing an upper surface of a portion of the second insulating interlayer 30 between the first and second electrodes 52 and 54 may be formed.

The first mask 62 may include an oxide, e.g., silicon oxide or an electrically insulating nitride, e.g., silicon nitride.

Figure 6:
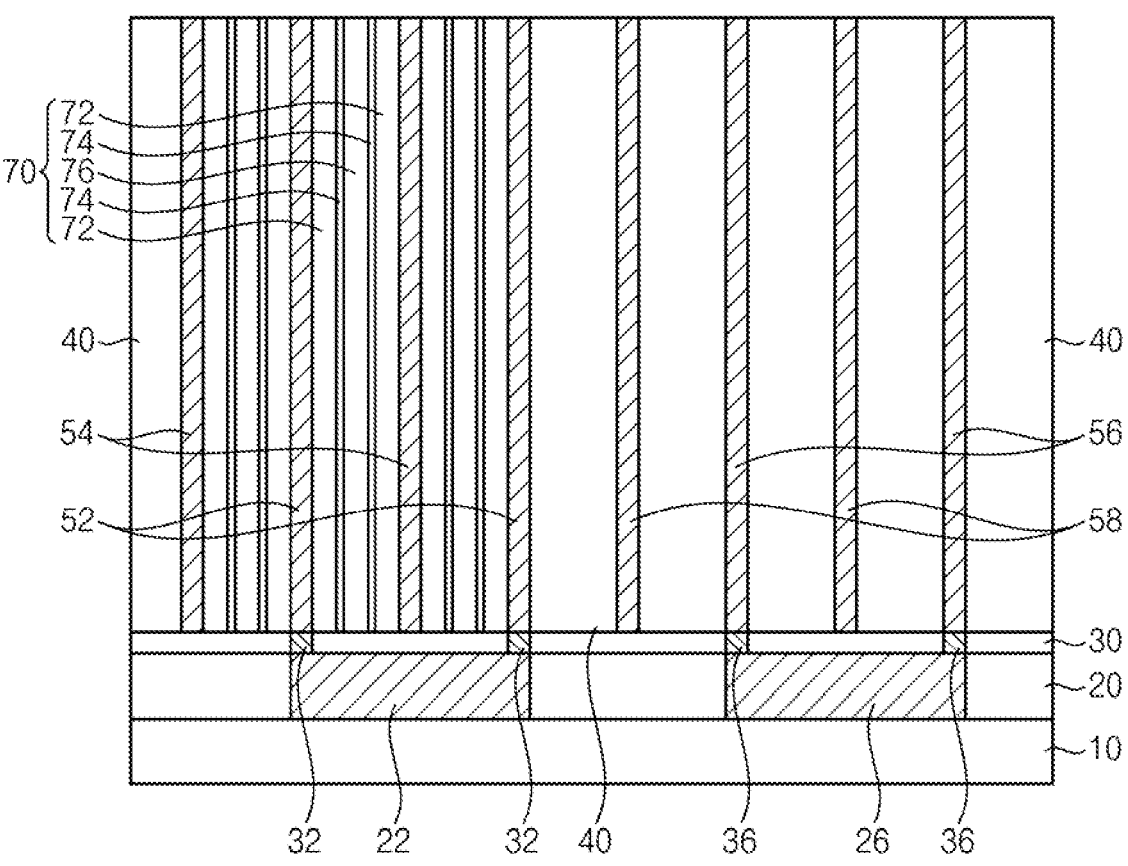

Referring to FIG. 6, the first mask 62 may be removed, and a first dielectric structure 70 may be formed in the first opening 65.

In example embodiments, the first dielectric structure 70 may include a third dielectric pattern 76 at a central portion of the first opening 65, a second dielectric pattern 74 on a sidewall of the third dielectric pattern 76, and a first dielectric pattern 72 on an outer sidewall of the second dielectric pattern 74.

In example embodiments, the first dielectric pattern 72 may be formed on a sidewall of the first opening 65 by forming a first dielectric layer on the sidewall of the first opening 65, the upper surface of the portion of the second insulating interlayer 30 exposed by the first opening 65, the upper surfaces of the first to fourth electrodes 52, 54, 56 and 58 and an upper surface of the mold layer 40, and by anisotropically etching the first dielectric layer.

Additionally, the second dielectric pattern 74 may be formed by forming a second dielectric layer on a sidewall of the first dielectric pattern 72, the upper surface of the portion of the second insulating interlayer 30 exposed by the first opening 65, the upper surfaces of the first to fourth electrodes 52, 54, 56 and 58 and the upper surface of the mold layer 40 and by anisotropically etching the second dielectric layer, and may be formed on an inner sidewall of the first dielectric pattern 72.

The third dielectric pattern 76 may be formed by forming a third dielectric layer on the upper surface of the portion of the second insulating interlayer 30 exposed by the first opening 65, the upper surfaces of the first to fourth electrodes 52, 54, 56 and 58 and the upper surface of the mold layer 40 and by anisotropically etching the third dielectric layer, and may be formed on an inner sidewall of the second dielectric pattern 74.

Figure 7:
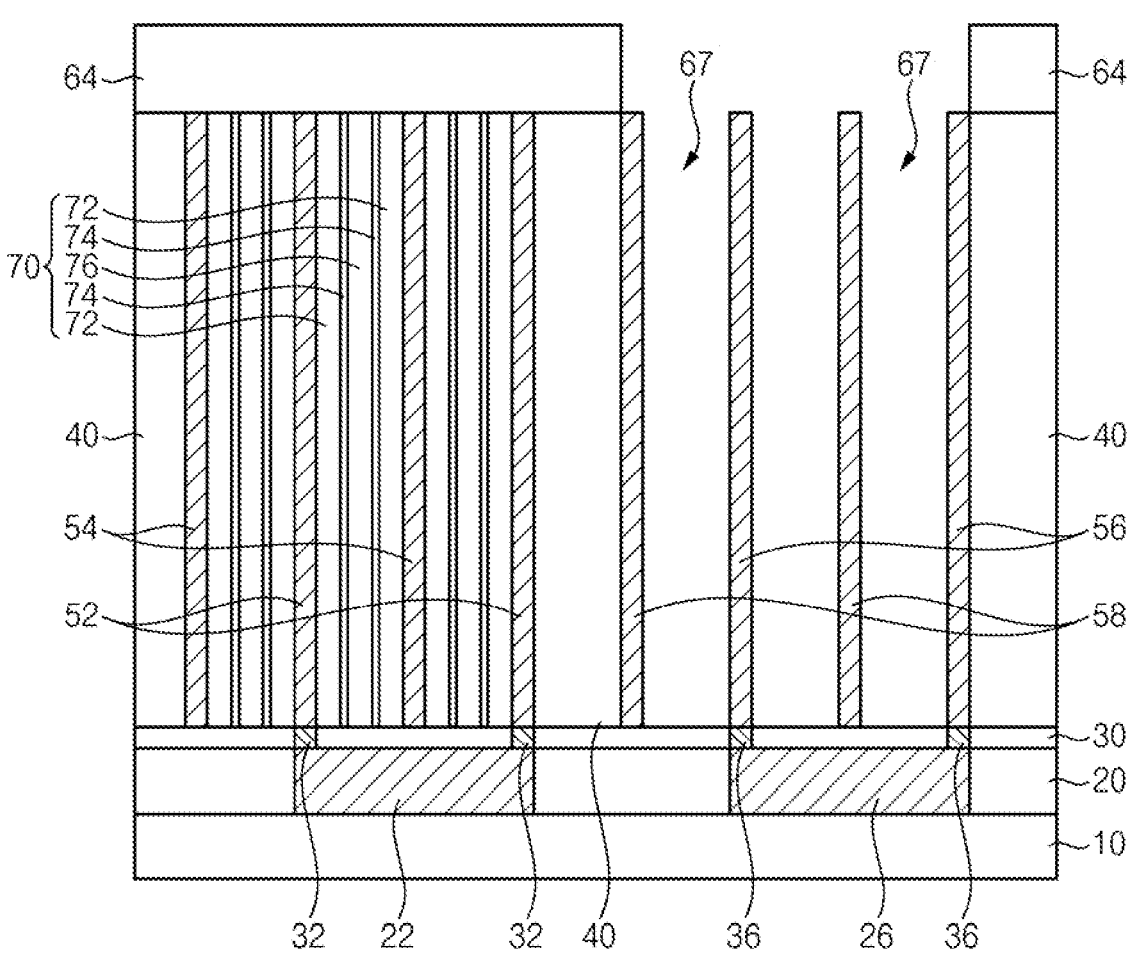

Referring to FIG. 7, a second mask 64 may be formed on the mold layer 40, the first and second electrodes 52 and 54 and the first dielectric structure 70, and an etching process may be performed using the second mask 64 as an etching mask.

In example embodiments, the second mask 64 may be formed on the upper surfaces of the first and second electrodes 52 and 54, an upper surface of a portion of the mold layer 40 between the first and second electrodes 52 and 54 and an upper surface of a portion of the mold layer 40 between the first and fourth electrodes 52 and 58, and may expose upper surfaces of the third and fourth electrodes 56 and 58 and an upper surface of a portion of the mold layer 40 between the third and fourth electrodes 56 and 58.

Thus, the portion of the mold layer 40 between the third and fourth electrodes 56 and 58 may be removed by the etching process, and a second opening 67 exposing an upper surface of a portion of the second insulating interlayer 30 between the third and fourth electrodes 56 and 58 may be formed.

The second mask 64 may include an oxide, e.g., silicon oxide or an electrically insulating nitride, e.g., silicon nitride.

Figure 8:
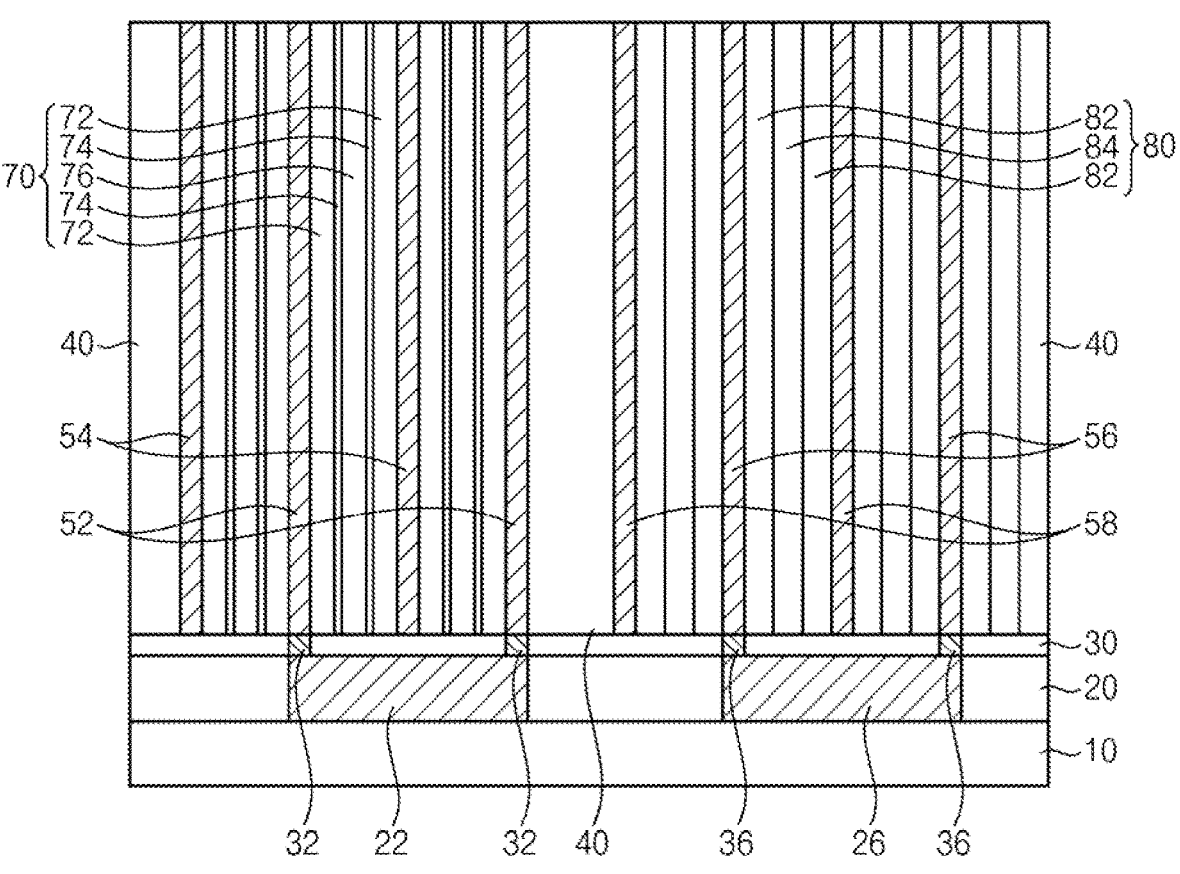

Referring to FIG. 8, the second mask 64 may be removed, and a second dielectric structure 80 may be formed in the second opening 67.

In example embodiments, the second dielectric structure 80 may include a fifth dielectric pattern 84 at a central portion of the second opening 67 and a fourth dielectric pattern 82 on a sidewall of the fifth dielectric pattern 84.

In example embodiments, the fourth dielectric pattern 82 may be formed on a sidewall of the second opening 67 by forming a fourth dielectric layer on the sidewall of the second opening 67, the upper surface of the portion of the second insulating interlayer 30 exposed by the second opening 67, the upper surfaces of the first to fourth electrodes 52, 54, 56 and 58, an upper surface of the first dielectric structure 70 and the upper surface of the mold layer 40, and by anisotropically etching the fourth dielectric layer.

The fifth dielectric pattern 84 may be formed on an inner sidewall of the fourth dielectric pattern 82 by forming a fifth dielectric layer on the upper surface of the portion of the second insulating interlayer 30 exposed by the second opening 67, the upper surfaces of the first to fourth electrodes 52, 54, 56 and 58, the upper surface of the first dielectric structure 70 and the upper surface of the mold layer 40 and by anisotropically etching the fifth dielectric layer, and may be formed on an inner sidewall of the second dielectric pattern 74.

Figure 9:
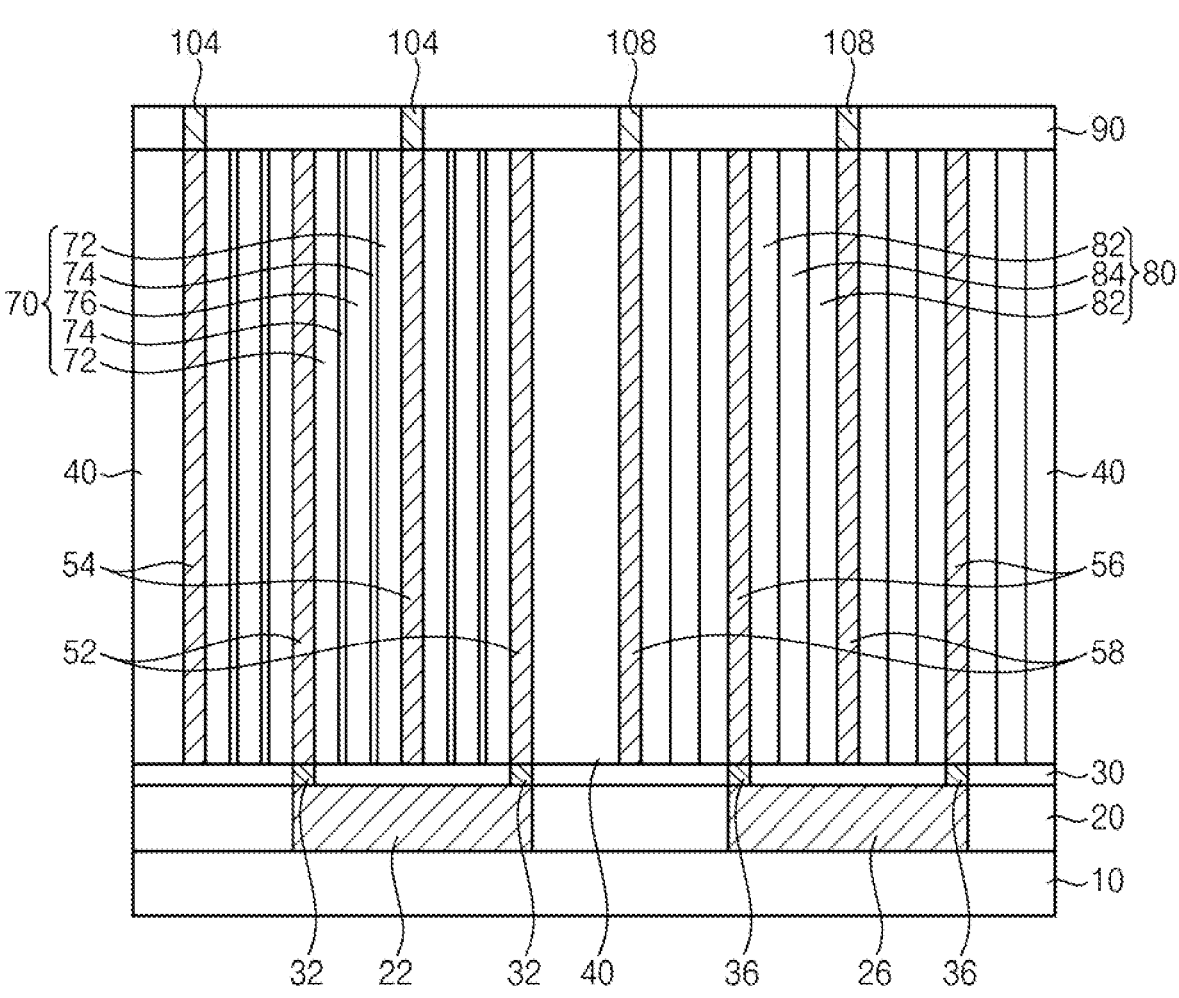

Referring to FIG. 9, a third insulating interlayer 90 may be formed on the mold layer 40, the first to fourth electrodes 52, 54, 56 and 58, and the first and second dielectric structures 70 and 80, and third and fourth vias 104 and 108 may be formed through the third insulating interlayer 90 and may contact the upper surfaces of the second and fourth electrodes 54 and 58.

Pairs of the third vias 104 contacting neighboring pairs, respectively, of the second electrodes 54 may form a third via pair, and neighboring pairs of the fourth vias 108 contacting neighboring pairs, respectively, of the fourth electrodes 58 may form a fourth via pair.

Referring to FIG. 1 again, a fourth insulating interlayer 110 may be formed on the third insulating interlayer 90 and the third and fourth vias 104 and 108, and third and fourth conductive patterns 124 and 128 may be formed through the fourth insulating interlayer 110 and may contact upper surfaces of the third and fourth vias 104 and 108, respectively.

In example embodiments, the third conductive pattern 124 may contact upper surfaces of the third vias 104 included in the third via pair, and the fourth conductive pattern 128 may contact upper surfaces of the fourth vias 108 included in the fourth via pair. The third vias 104 may contact lower surfaces of opposite edge portions, respectively, of the third conductive pattern 124, and the fourth via 108 may contact lower surfaces of opposite edge portions, respectively, of the fourth conductive pattern 128.

By the above processes, the first capacitor structure may be formed.

Figure 10:
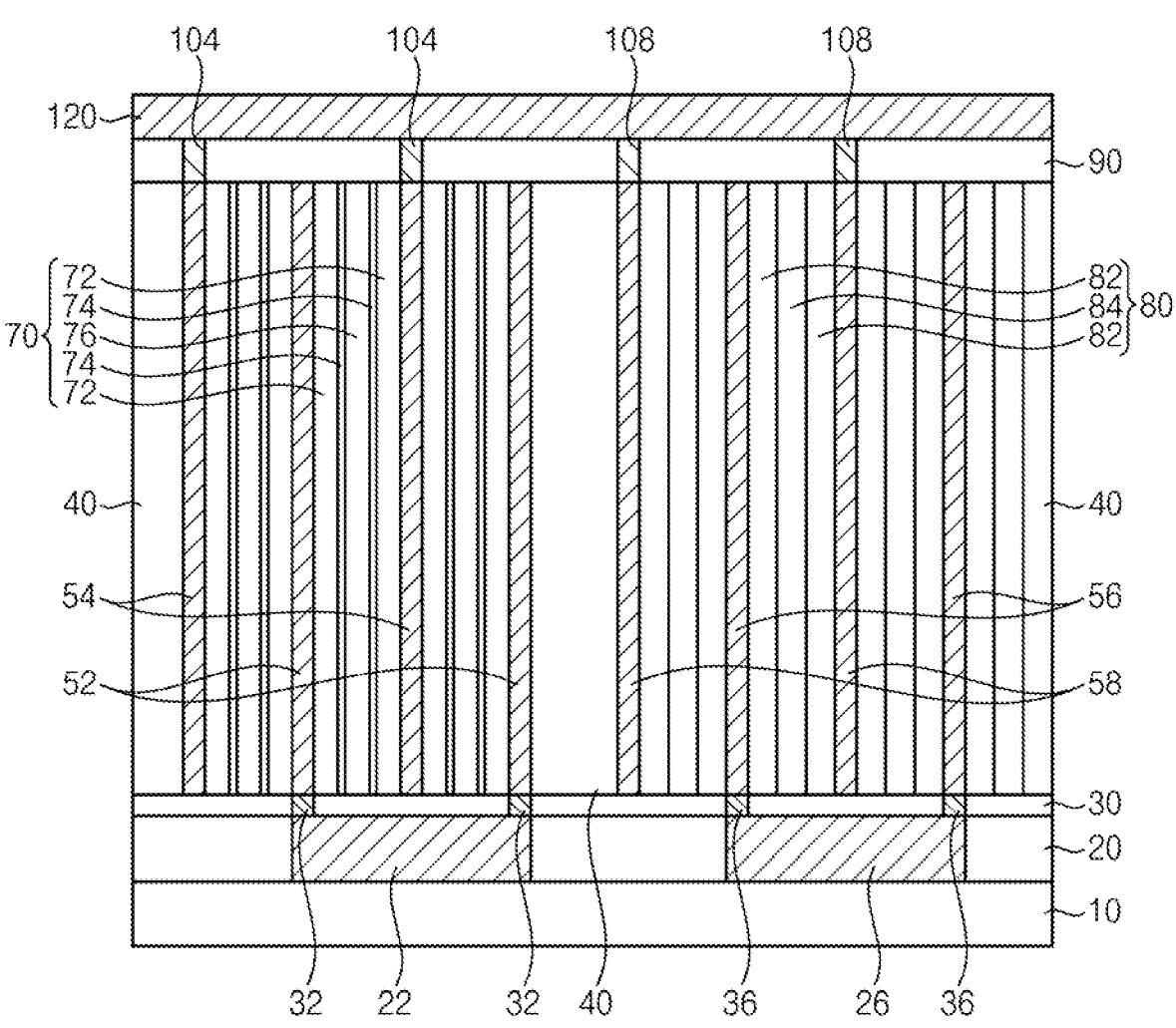
FIG. 10 is a cross-sectional view illustrating a second capacitor structure in accordance with example embodiments.

FIG. 10 is a cross-sectional view illustrating a second capacitor structure in accordance with example embodiments. The second capacitor structure may be substantially the same as or similar to the first capacitor structure illustrated with reference to FIG. 1, except for including a fifth conductive pattern instead of the third and fourth conductive patterns, and thus to the extent that an element is not described in detail herein, it may be assumed that the element is at least similar to a corresponding element that has been described elsewhere within the instant specification.

Referring to FIG. 10, the second capacitor structure may include a fifth conductive pattern 120 extending through the fourth insulating interlayer 110, and the fifth conductive pattern 120 may commonly contact the upper surfaces of the third and fourth vias 104 and 108.

For example, the first and second capacitors included in the first capacitor structure shown in FIG. 1 may include the first and second conductive patterns 22 and 26, which are electrically insulated from each other, and may also include the third and fourth conductive patterns 124 and 128, which are electrically insulated from each other, and thus different voltages may be applied to the third and fourth conductive patterns 124 and 128, respectively.

The first and second capacitors included in the second capacitor structure shown in FIG. 10 may include the first and second conductive patterns 22 and 26, which are electrically insulated from each other, but may commonly include the fifth conductive pattern 120, so that the same voltage may be applied through the fifth conductive pattern 120. However, in the second capacitor structure, the first and second conductive patterns 22 and 26 may still be electrically insulated from each other, so that different voltages may be applied to the first and second conductive patterns 22 and 26, respectively.

Figure 11:
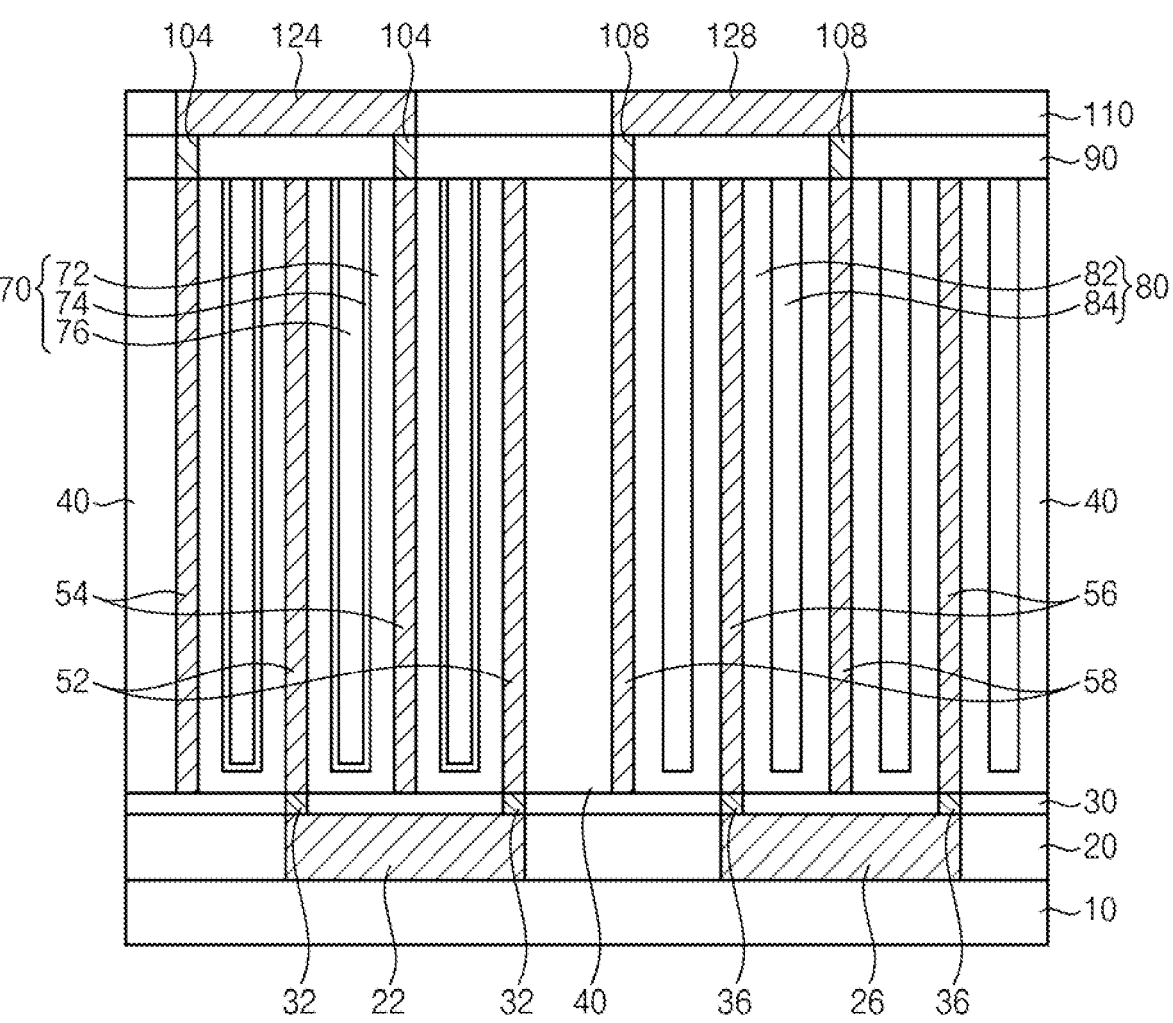
FIG. 11 is a cross-sectional view illustrating a third capacitor structure in accordance with example embodiments.

FIG. 11 is a cross-sectional view illustrating a third capacitor structure in accordance with example embodiments. The third capacitor structure may be substantially the same as or similar to the first capacitor structure illustrated with reference to FIG. 1, except for the shapes of the first and second dielectric structures, and thus to the extent that an element is not described in detail herein, it may be assumed that the element is at least similar to a corresponding element that has been described elsewhere within the instant specification.

Referring to FIG. 11, the second dielectric pattern 74 included in the first dielectric structure 70 may at least partially cover a lower surface as well as the sidewall of the first dielectric pattern 72, and the third dielectric pattern 76 may at least partially cover a lower surface as well as the outer sidewall of the second dielectric pattern 74.

Likewise, the fifth dielectric pattern 84 included in the second dielectric structure 80 may at least partially cover a lower surface as well as the sidewall of the fourth dielectric pattern 82.

Figure 12:
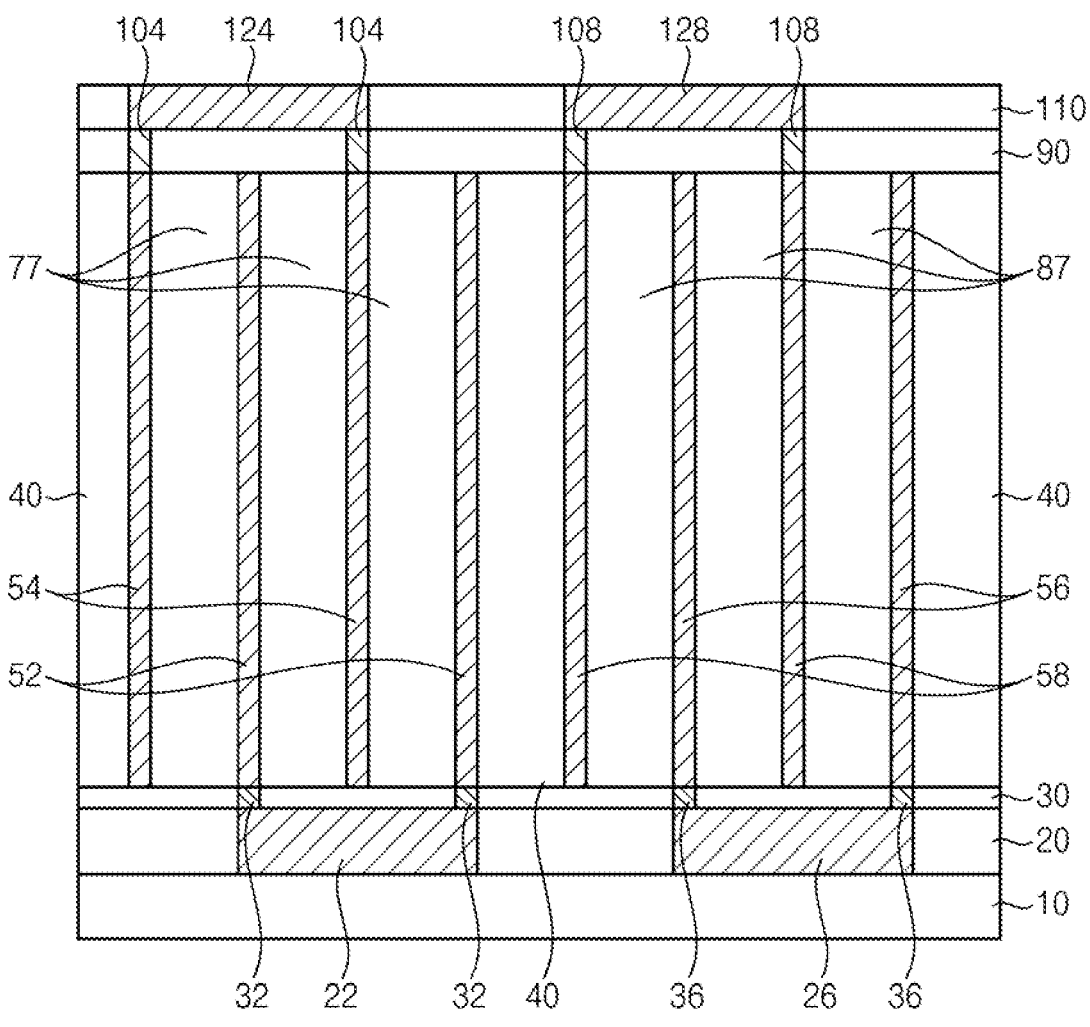
FIG. 12 is a cross-sectional view illustrating a fourth capacitor structure in accordance with example embodiments.

FIG. 12 is a cross-sectional view illustrating a fourth capacitor structure in accordance with example embodiments. The fourth capacitor structure may be substantially the same as or similar to the first capacitor structure illustrated with reference to FIG. 1, except for including third and fourth dielectric structures instead of the first and second dielectric structures, and thus to the extent that an element is not described in detail herein, it may be assumed that the element is at least similar to a corresponding element that has been described elsewhere within the instant specification.

Referring to FIG. 12, the first and second capacitors included in the fourth capacitor structure may include third and fourth dielectric structures 77 and 87, respectively, and each of the third and fourth dielectric structures 77 and 87 may include a single dielectric pattern.

For example, the third dielectric structure 77 may include a sixth dielectric pattern, and the fourth dielectric structure 87 may include a seventh dielectric pattern. The sixth and seventh dielectric patterns may include dielectric materials having different dielectric constants from each other. Thus, the first and second capacitors including the sixth and seventh dielectric patterns, respectively, may have different electric capacitances from each other.

The first and second capacitors included in the first capacitor structure shown in FIG. 1 may include the first and second dielectric structures 70 and 80 having stacked structures of a plurality of dielectric patterns, while the first and second capacitors included in the fourth capacitor structure shown in FIG. 12 may include single dielectric patterns, respectively, however, the single dielectric patterns may have different dielectric constants so that the first and second capacitors included in the fourth capacitor structure may have different dielectric constants from each other.

Figure 13A:
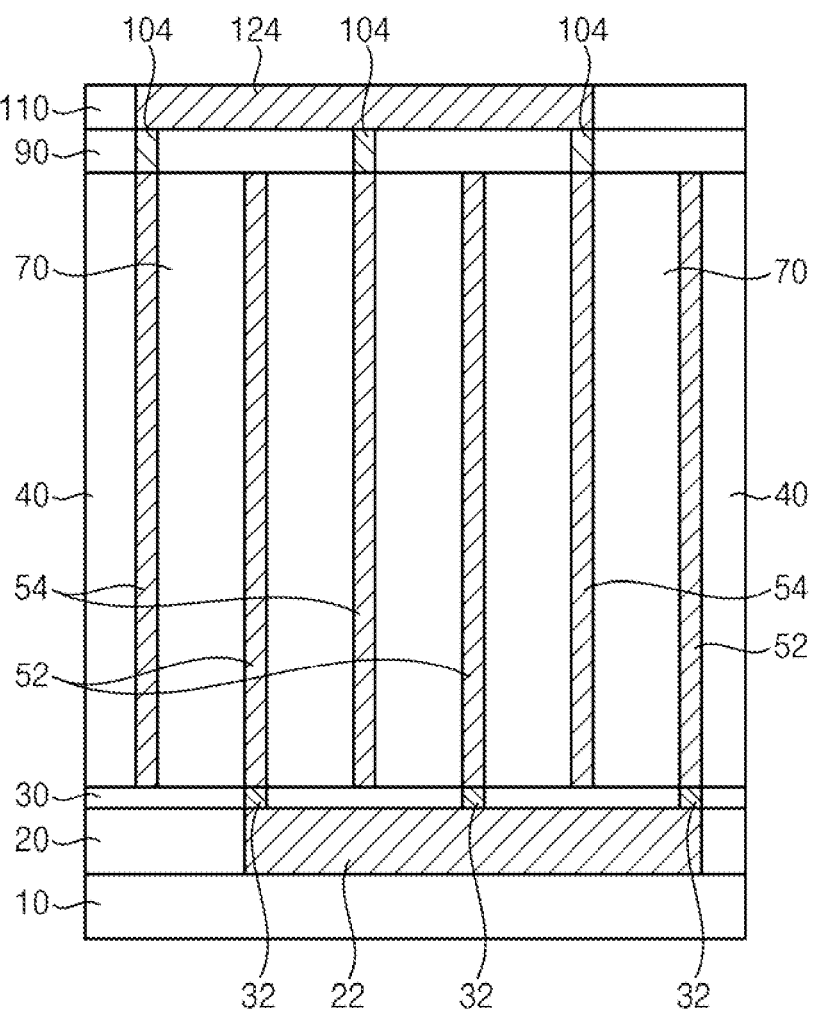
FIGS. 13A and 13B are cross-sectional views illustrating a fifth capacitor structure in accordance with example embodiments.
Figure 13B:
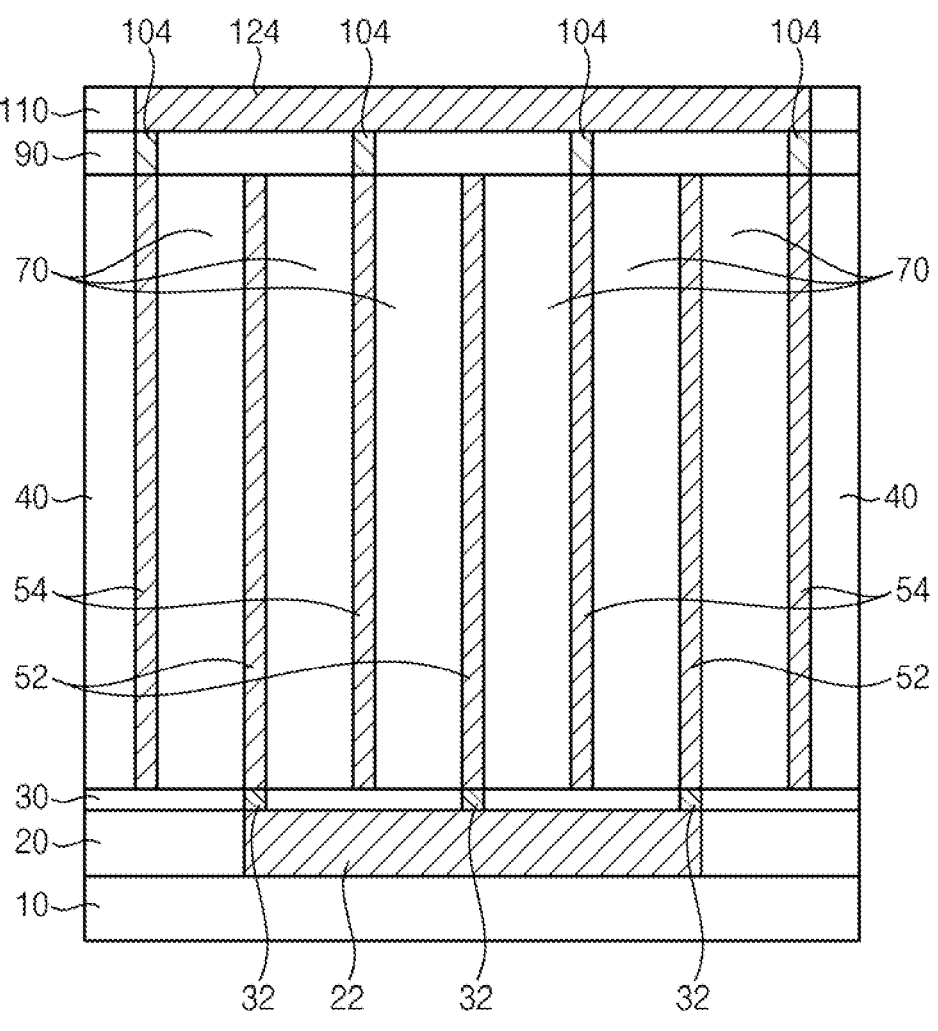

FIGS. 13A and 13B are cross-sectional views illustrating a fifth capacitor structure in accordance with example embodiments, which show only the first capacitor included in the fifth capacitor structure. The fifth capacitor structure may be substantially the same as or similar to the first capacitor structure illustrated with reference to FIG. 1, except for numbers of the electrodes included in the first and second capacitors, and thus to the extent that an element is not described in detail herein, it may be assumed that the element is at least similar to a corresponding element that has been described elsewhere within the instant specification.

Referring to FIG. 13A, the first capacitor included in the fifth capacitor structure may include six electrodes disposed in the horizontal direction and five dielectric structures between the electrodes.

For example, the first capacitor may include three first electrodes 52 and three second electrodes 54 alternately disposed in the horizontal direction, for example, three first lower electrodes 52 and three first upper electrodes 54, and five first dielectric structures 70 may be formed between neighboring ones of the first lower electrodes 52 and the first upper electrodes 54.

Thus, the first capacitor may include five capacitors, and may have a total electric capacitance that may be a sum of the electric capacitances of the five capacitors, respectively. As illustrated with reference to FIG. 1, the first capacitor may include N capacitors having (N+1) electrodes and N dielectric patterns, and N equals 5 in this case, but N may more generally be a positive integer.

The second capacitor included in the fifth capacitor structure may also include six electrodes disposed in the horizontal direction and five dielectric structures between the electrodes. For example, the second capacitor may include three third electrodes 56 and three fourth electrodes 58 alternately disposed in the horizontal direction, for example, three second lower electrodes 56 and three second upper electrodes 58, and five second dielectric structures 80 may be formed between neighboring ones of the second lower electrodes 56 and the second upper electrodes 58.

Referring to FIG. 13B, the first capacitor included in the fifth capacitor structure may further include one first upper electrode 54 in addition to the three first upper electrodes 54 shown in FIG. 13A.

For example, the first capacitor in FIG. 13A includes the first upper electrodes 54 between the first lower electrodes 52 and the first upper electrode 54 adjacent to a first one of the first lower electrodes 52 among the first lower electrodes at a first end portion, while the first capacitor in FIG. 13B may further include the first lower electrode 54 adjacent to a second one of the first lower electrodes 52 among the first lower electrodes at a second end portion. Thus, the first capacitor in FIG. 13B may include four first upper electrodes 54. Accordingly, the first capacitor may include six first dielectric structures 70 and six capacitors.

The second capacitor included in the fifth capacitor structure may also include four second upper electrodes 58, and thus may include six dielectric structures 80 and sixth capacitors.

Figure 14:
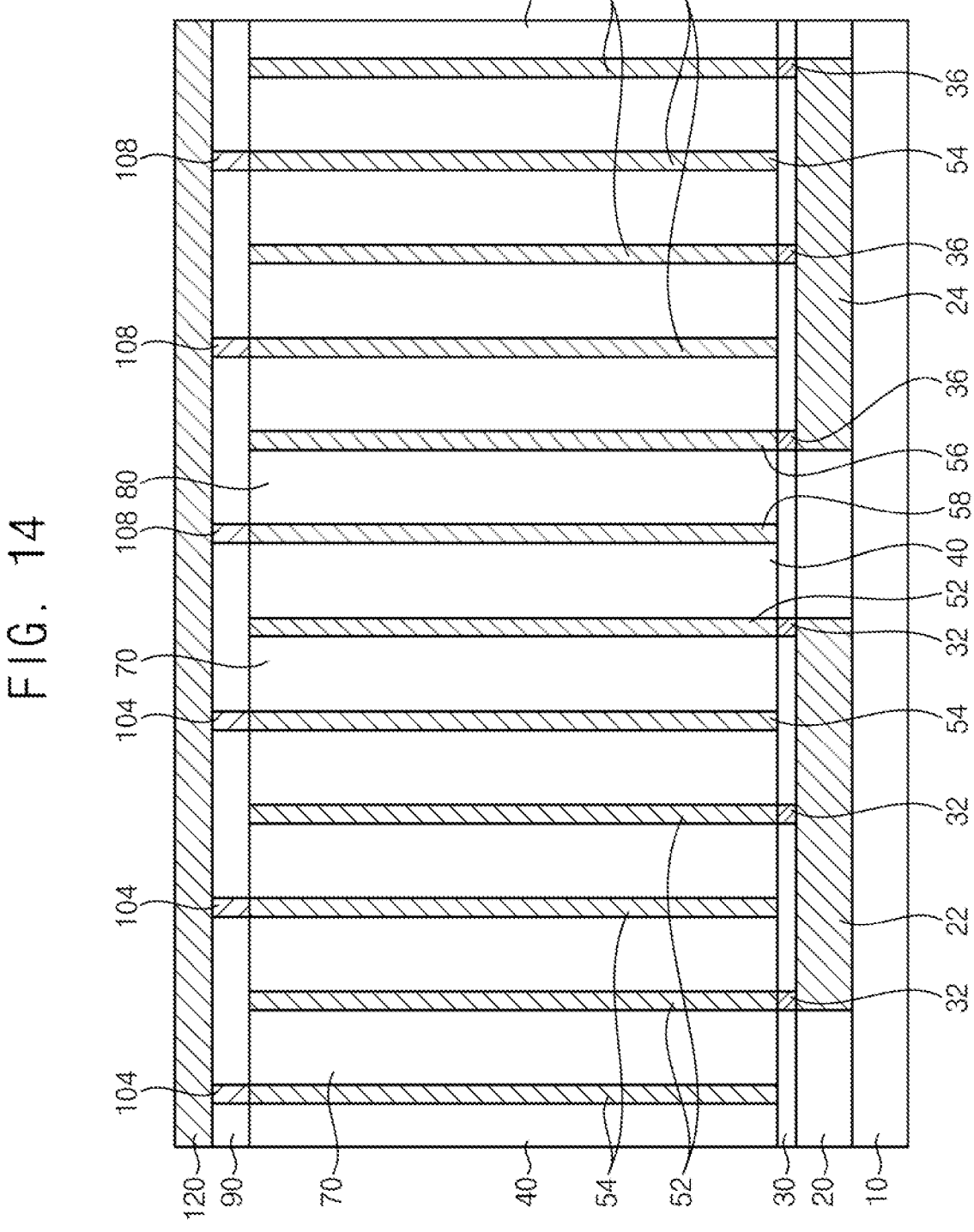
FIG. 14 is a cross-sectional view illustrating a sixth capacitor structure in accordance with example embodiments.

FIG. 14 is a cross-sectional view illustrating a sixth capacitor structure in accordance with example embodiments.

The sixth capacitor structure may be substantially the same as or similar to the fifth capacitor structure illustrated with reference to FIGS. 13A, except for including the fifth conductive pattern 120 instead of the third and fourth conductive patterns 124 and 128, and thus to the extent that an element is not described in detail herein, it may be assumed that the element is at least similar to a corresponding element that has been described elsewhere within the instant specification.

Figure 15:
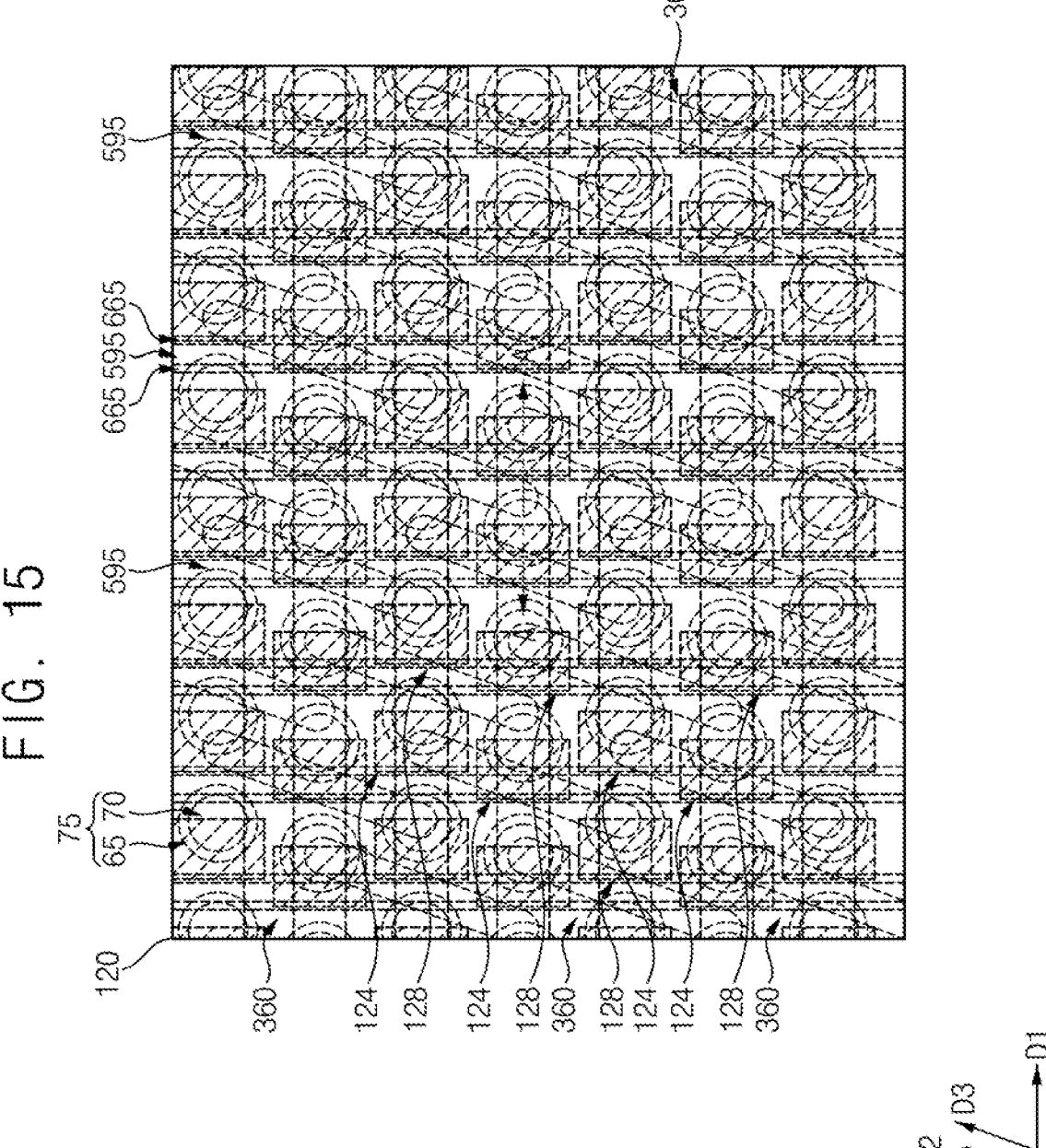
FIG. 15 is a plan view illustrating a semiconductor device in accordance with example embodiments.
Figure 16:
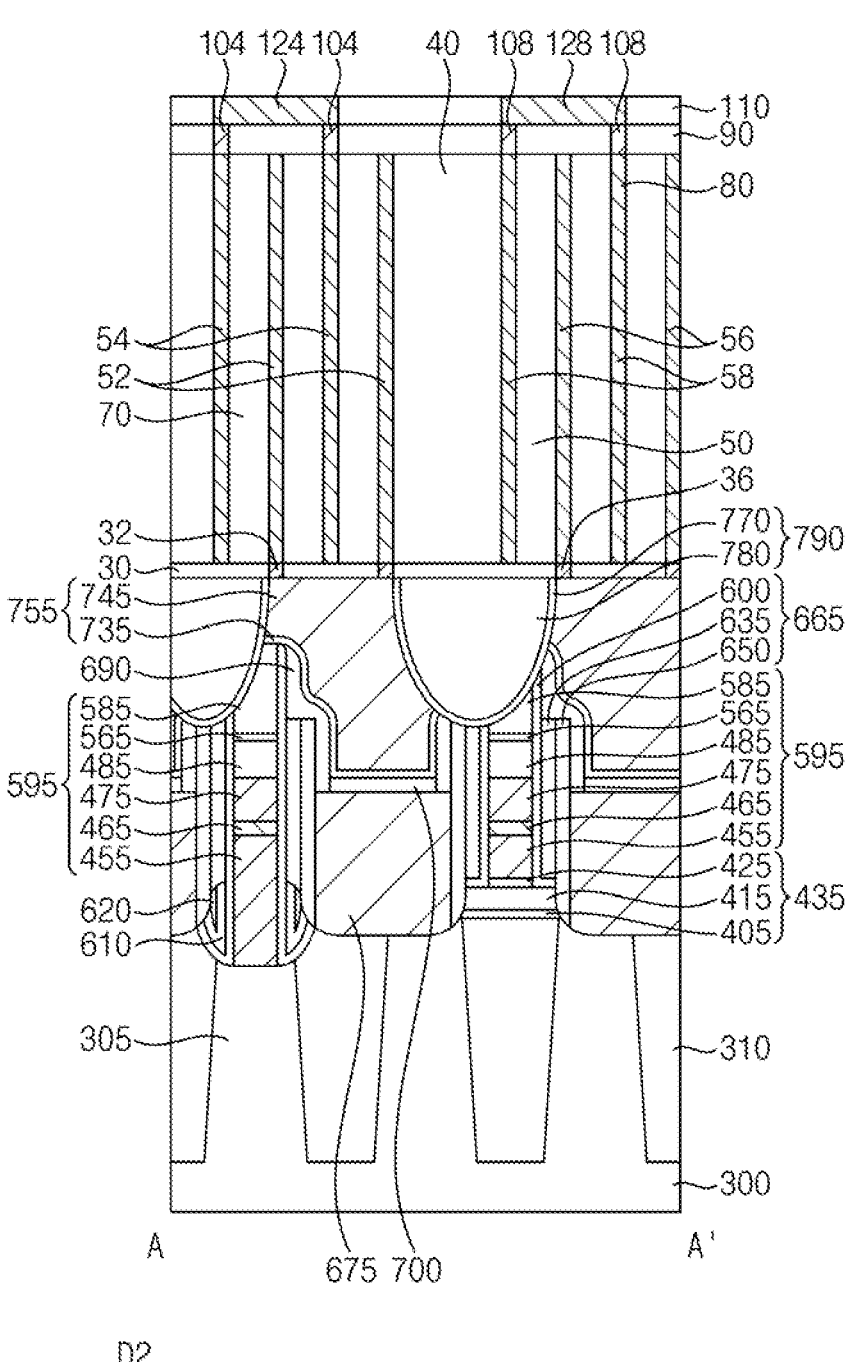
FIG. 16 is a cross-sectional view taken along line A-A' of FIG. 15.
Figure 16:

FIG. 15 is a plan view illustrating a semiconductor device in accordance with example embodiments, and FIG. 16 is a cross-sectional view taken along line A-A' of FIG. 15.

This semiconductor device may be an application of the first capacitor structure illustrated with reference to FIG. 1 to a DRAM device, and thus to the extent that an element is not described in detail herein, it may be assumed that the element is at least similar to a corresponding element that has been described elsewhere within the instant specification. However, the semiconductor device may include one of the second to sixth capacitor structures shown in FIGS. 10 to 14 instead of the first capacitor structure.

Hereinafter, two directions among horizontal directions that are substantially parallel to an upper surface of a substrate 300, which may be substantially orthogonal to each other, may be referred as first and second directions D1 and D2, respectively, and a direction among the horizontal directions, which may have an acute angle with respect to each of the first and second directions D1 and D2, may be referred to as a third direction D3. Additionally, a direction that is substantially perpendicular to the upper surface of the substrate 300 may be referred to as a vertical direction.

Referring to FIGS. 15 and 16, the semiconductor device may include an active pattern 305, a gate structure 360, a first bit line structure 595, a contact plug structure, and the first capacitor structure on the substrate 300.

The semiconductor device may further include an isolation pattern 310, a spacer structure 665, a fourth spacer 690, a second capping pattern 685, first and second insulation pattern structures 435 and 790, fourth and fifth insulation patterns 610 and 620, and a metal silicide pattern 700.

The active pattern 305 may extend in the third direction D3, and a plurality of active patterns 305 may be spaced apart from each other in the first and second directions D1 and D2. A sidewall of the active pattern 305 may be at least partially covered by the isolation pattern 310. The active pattern 305 may include a same material as the substrate 300, and the isolation pattern 310 may include an oxide, e.g., silicon oxide.

Figure 18:
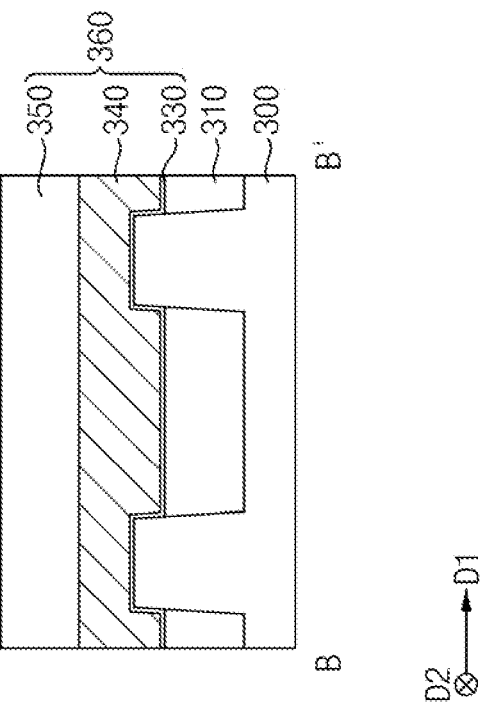
Figure 18:
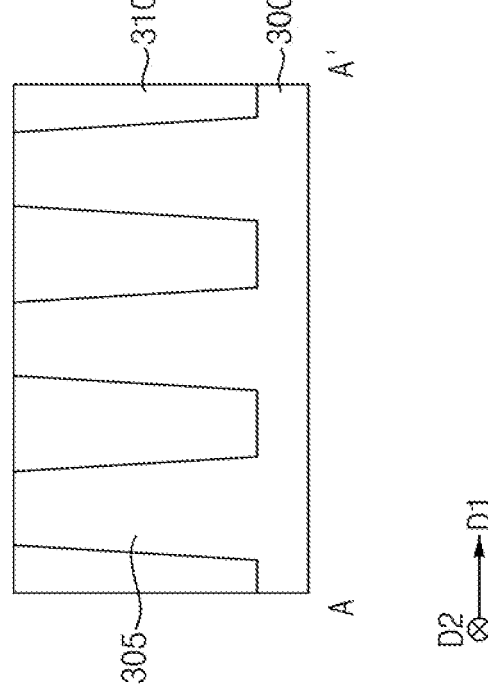

Referring to FIGS. 15 and 16 together with FIG. 18, the gate structure 360 may be formed in a second recess extending in the first direction D1 through upper portions of the active pattern 305 and the isolation pattern 310. The gate structure 360 may include a first gate insulation pattern 330 on a bottom and a sidewall of the second recess, a first gate electrode 340 on a portion of the first gate insulation pattern 330 on the bottom and a lower sidewall of the second recess, and a gate mask 350 on the first gate electrode 340 and filling an upper portion of the second recess.

The first gate insulation pattern 330 may include an oxide, e.g., silicon oxide, the first gate electrode 340 may include, e.g., a metal, a metal nitride, a metal silicide, etc., and the gate mask 350 may include an electrically insulating nitride, e.g., silicon nitride.

In example embodiments, the gate structure 360 may extend in the first direction D1, and a plurality of gate structures 360 may be spaced apart from each other in the second direction D2.

Figure 19:
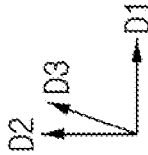
Figure 20:
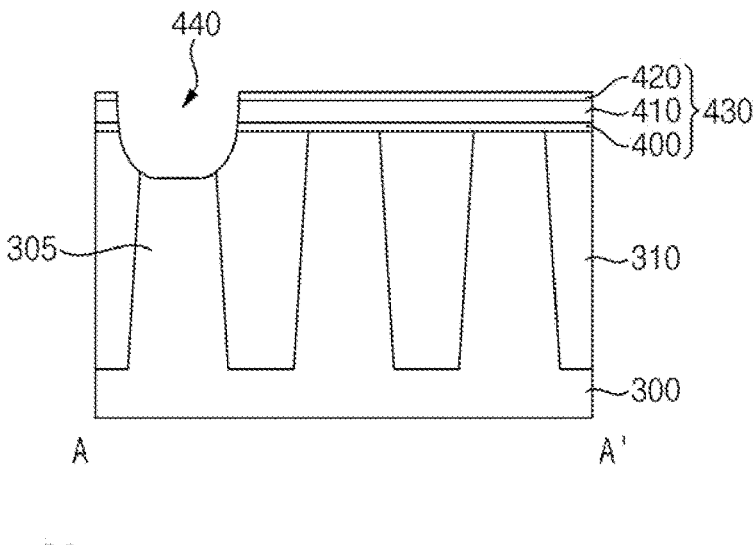

Referring to FIGS. 15 and 16 together with FIGS. 19 and 20, a third opening 440 extending through a first insulation layer structure 430 and exposing upper surfaces of the active pattern 305, the isolation pattern 310 and the gate mask 350 of the gate structure 360 may be formed, and an upper surface of a central portion in the third direction D3 of the active pattern 305 may be exposed by the third opening 440.

In example embodiments, an area of a bottom of the third opening 440 may be greater than an area of the upper surface of the active pattern 305. Thus, the third opening 440 may also expose an upper surface of a portion of the isolation pattern 310 adjacent to the active pattern 305. Additionally, the third opening 440 may extend through upper portions of the active pattern 305 and the portion of the isolation pattern 310 adjacent thereto, and thus the bottom of the third opening 440 may be lower than an upper surface of each of opposite edge portions in the third direction D3 of the active pattern 305.

The first bit line structure 595 may include a seventh conductive pattern 455, a first barrier pattern 465, an eighth conductive pattern 475, a third mask 485, an etch stop pattern 565 and a first capping pattern 585 that are sequentially stacked in the vertical direction on the third opening 440 or the first insulation pattern structure 435. The seventh conductive pattern 455, the first barrier pattern 465 and the eighth conductive pattern 475 may collectively form a conductive structure, and the third mask 485, the etch stop pattern 565 and the first capping pattern 585 may collectively form an insulation structure.

The seventh conductive pattern 455 may include, e.g., doped polysilicon, the first barrier pattern 465 may include a metal nitride, e.g., titanium nitride, or a metal silicon nitride, e.g., titanium silicon nitride, the eighth conductive pattern 475 may include a metal, e.g., tungsten, and each of the third mask 485, the etch stop pattern 565 and the first capping pattern 585 may include an electrically insulating nitride, e.g., silicon nitride.

In example embodiments, the first bit line structure 595 may extend in the second direction D2 on the substrate 300, and a plurality of first bit line structures 595 may be spaced apart from each other in the first direction D1.

The fourth and fifth insulation patterns 610 and 620 may be formed in the third opening 440, and may contact a lower sidewall of the first bit line structure 595. The fourth insulation pattern 610 may include an oxide, e.g., silicon oxide, and the fifth insulation pattern 620 may include an electrically insulating nitride, e.g., silicon nitride.

The first insulation pattern structure 435 may be formed on the active pattern 305 and the isolation pattern 310 under the first bit line structure 595, and may include first, second and third insulation patterns 405, 415 and 425 that are sequentially stacked in the vertical direction. The first and third insulation patterns 405 and 425 may include an oxide, e.g., silicon oxide, and the second insulation pattern 415 may include an electrically insulating nitride, e.g., silicon nitride.

The contact plug structure may include a lower contact plug 675, a metal silicide pattern 700 and an upper contact plug 755 that are sequentially stacked in the vertical direction on the active pattern 305 and the isolation pattern 310.

The lower contact plug 675 may contact the upper surface of each of opposite edge portions in the third direction D3 of the active pattern 305. In example embodiments, a plurality of lower contact plugs 675 may be spaced apart from each other in the second direction D2, and a second capping pattern 685 may be formed between neighboring ones of the lower contact plugs 675 in the second direction D2. The second capping pattern 685 may include an electrically insulating nitride, e.g., silicon nitride.

The lower contact plug 675 may include, e.g., doped polysilicon, the metal silicide pattern 700 may include, e.g., titanium silicide, cobalt silicide, nickel silicide, etc.

The upper contact plug 755 may include a second metal pattern 745 and a second barrier pattern 735 at least partially covering a lower surface of the second metal pattern 745. The second metal pattern 745 may include a metal, e.g., tungsten, and the second barrier pattern 735 may include a metal nitride, e.g., titanium nitride.

In example embodiments, a plurality of upper contact plugs 755 may be spaced apart from each other in the first and second directions D1 and D2, and may be arranged in a honeycomb pattern or a lattice pattern in a plan view. Each of the upper contact plugs 755 may have a shape of, e.g., a circle, an ellipse, or a polygon in a plan view.

The spacer structure 665 may include a first spacer 600 at least partially covering sidewalls of the first bit line structure 595 and the third insulation pattern 425, an air spacer 600 on a lower outer sidewall of the first spacer 600, and a third spacer 650 on an outer sidewall of the air spacer 635, a sidewall of the first insulation pattern structure 435, and upper surfaces of the fourth and fifth insulation patterns 610 and 620.

Each of the first and third spacers 600 and 650 may include an electrically insulating nitride, e.g., silicon nitride, and the air spacer 895 may include air.

The fourth spacer 690 may be formed on an outer sidewall of a portion of the first spacer 600 on an upper sidewall of the first bit line structure 595, and may at least partially cover an upper end of the air spacer 635 and an upper surface of the third spacer 650. The fourth spacer 690 may include an electrically insulating nitride, e.g., silicon nitride.

Figure 30:
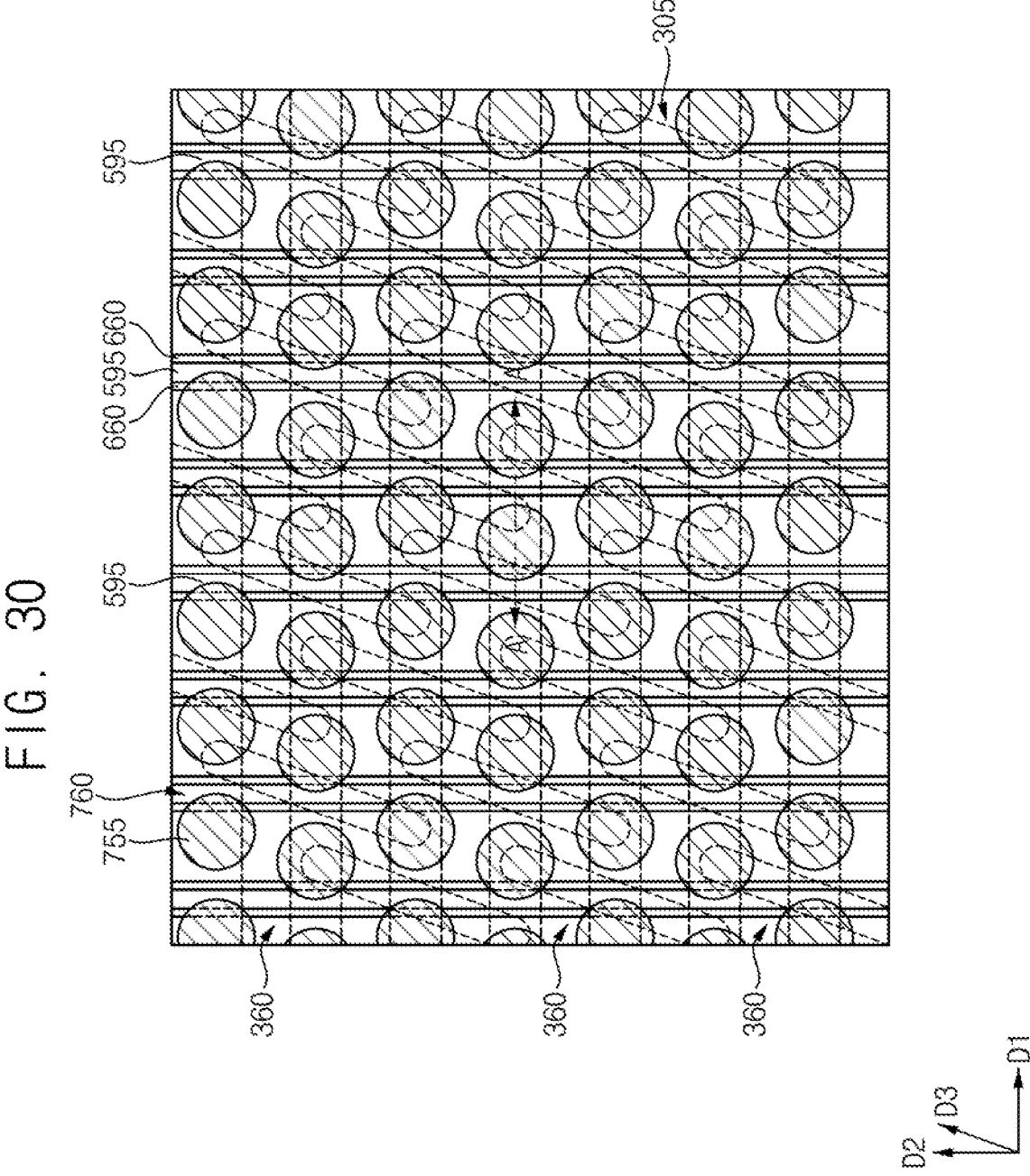
Figure 31:
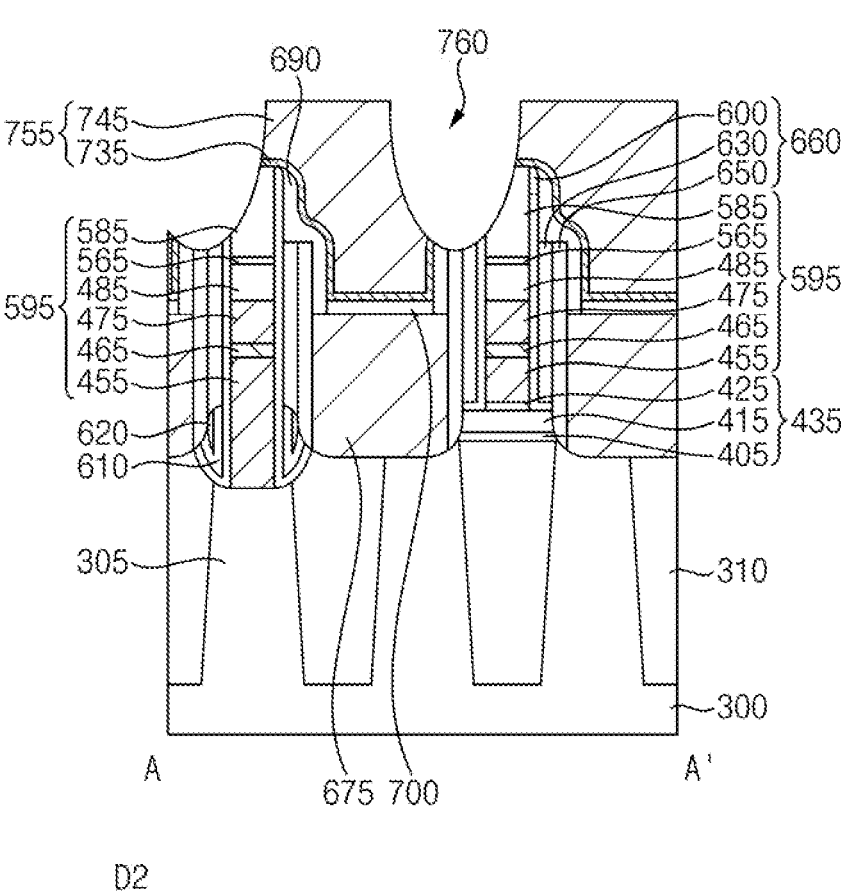

Referring to FIGS. 15 and 16 together with FIGS. 30 and 31, the second insulation pattern structure 790 may include a sixth insulation pattern 770 on an inner wall of an eighth opening 760, which may extend through the upper contact plug 755, a portion of the insulation structure of the first bit line structure 595 and portions of the first, third and fourth spacers 600, 650 and 690 and at least partially surround the upper contact plug 755 in a plan view, and a seventh insulation pattern 780 on the sixth insulation pattern 770 and fill a remaining portion of the eighth opening 760. The upper end of the air spacer 635 may be closed by the sixth insulation pattern 770.

The sixth and seventh insulation patterns 770 and 780 may include an electrically insulating nitride, e.g., silicon nitride.

The first capacitor structure may include the first and second capacitors, and the second insulating interlayer 30 may be formed on the sixth and seventh insulation patterns 770 and 780, the upper contact plug 755 and the second capping pattern 685.

The first electrodes 52 included in the first capacitor may be electrically connected to the first vias 32, respectively, extending through the second insulating interlayer 30 and may contact an upper surface of the upper contact plug 755, and the second electrodes 54 included in the first capacitor may be electrically connected to the third vias 104, respectively, extending through the third insulating interlayer 90 and may contact upper surfaces of the second electrodes 54, respectively, and the third conductive pattern 124 extending through the fourth insulating interlayer 110 and may contact upper surfaces of the third vias 104.

Additionally, the third electrodes 56 included in the second capacitor may be electrically connected to the second vias 36, respectively, extending through the second insulating interlayer 30 and may contact an upper surface of the upper contact plug 755, and the fourth electrodes 58 included in the second capacitor may be electrically connected to the fourth vias 108, respectively, extending through the third insulating interlayer 90 and may contact upper surfaces of the fourth electrodes 58, respectively, and the fourth conductive pattern 128 extending through the fourth insulating interlayer 110 and may contact upper surfaces of the fourth vias 108.

FIGS. 17 to 32 are plan views and cross-sectional views illustrating a method of manufacturing a semiconductor device according to example embodiments. For example, FIGS. 17, 19, 22, 26 and 30 are the plan views, FIG. 18 includes cross-sectional views taken along lines A-A' and B-B' of FIG. 17, and FIGS. 20-21, 23-25, 27-29 and 31-32 are cross-sectional views taken along lines A-A', respectively, of corresponding plan views.

The method of manufacturing the semiconductor device is an application of the method of forming the first capacitor structure described with reference to FIGS. 1 to 6 to a method of manufacturing a DRAM device, and to the extent that a method for forming an element is not described in detail herein, it may be assumed that the element is formed at least similar to a corresponding element whose method of formation has been described elsewhere within the instant specification.

Figure 17:
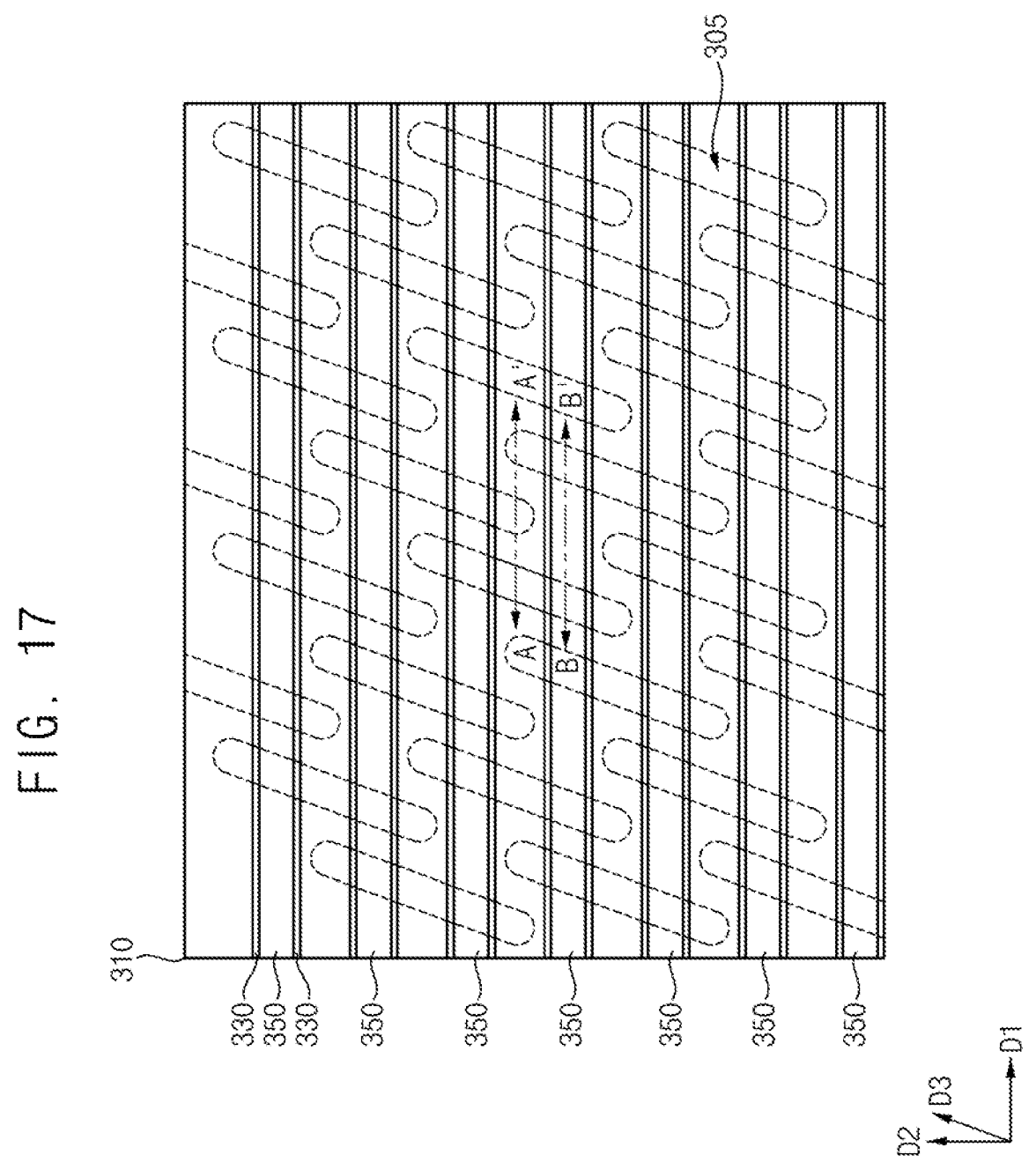

Referring to FIGS. 17 and 18, an upper portion of a substrate 300 may be removed to form a first recess, and an isolation pattern 310 may be formed in the first recess.

As the isolation pattern 310 is formed on the substrate 300, an active pattern 305 of which a sidewall is at least partially covered by the isolation pattern 310 may be defined.

The active pattern 305 and the isolation pattern 310 on the substrate 300 may be partially etched to form a second recess extending in the first direction D1, and a gate structure 360 may be formed in the second recess. In example embodiments, the gate structure 360 may extend in the first direction D1, and a plurality of gate structures may be spaced apart from each other in the second direction D2.

Referring to FIGS. 19 and 20, an insulating layer structure 430 may be formed on the active pattern 305, the isolation pattern 310, and the gate structure 360. The insulating layer structure 430 may include first to third insulating layers 400, 410, and 420 that are sequentially stacked.

The insulating layer structure 430 may be patterned, and the active pattern 305, the isolation pattern 310, and the gate mask 350 included in the gate structure 360 may be partially etched using the patterned insulating layer structure 430 as an etching mask to form a third opening 440. In example embodiments, the insulating layer structure 430 may have a circular shape or an elliptical shape in a plain view, and a plurality of insulating layer structures 430 may be spaced apart from each other in the first and second direction D1 and D2. Each of the insulating layer structures 430 may overlap end portions of ones of the active patterns 305 neighboring in the third direction D3, which may face each other, in a vertical direction that is substantially orthogonal to the upper surface of the substrate 300.

Figure 21:
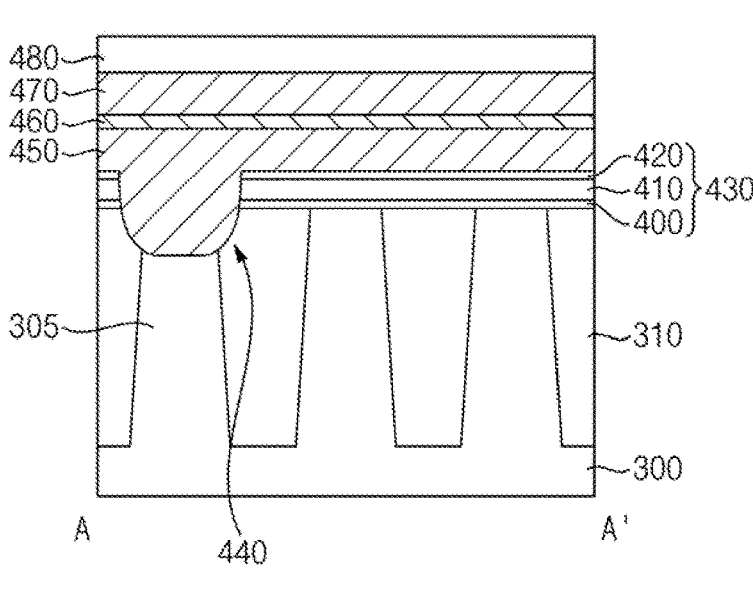

Referring to FIG. 21, a sixth conductive layer 450, a first barrier layer 460, a seventh conductive layer 470 and a third mask layer 480 may be sequentially stacked on the insulating layer structure 430, and the active pattern 305, the isolation pattern 310 and the gate structure 360 exposed by the third opening 440. The sixth conductive layer 450 may fill the third opening 440.

Figure 22:
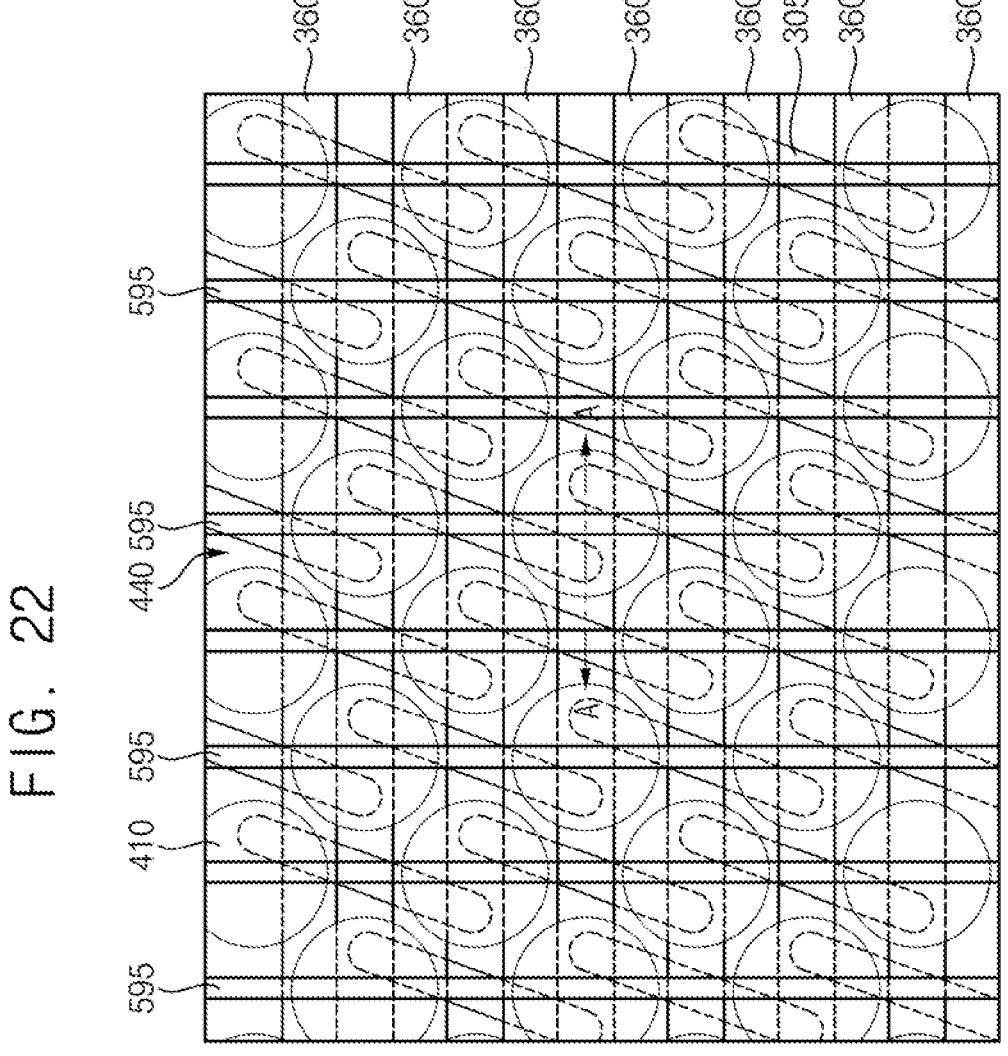
Figure 22:
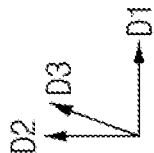
Figure 23:
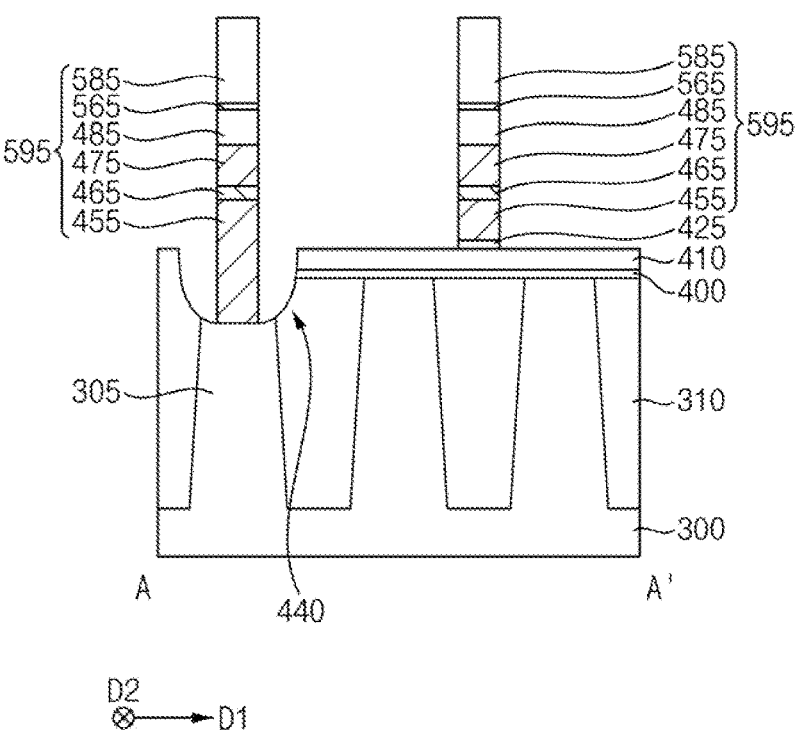

Referring to FIGS. 22 and 23, an etch stop layer and a first capping layer may be sequentially formed on the conductive structure layer, the first capping layer may be etched to form a first capping pattern 585, and the etch stop layer, the third mask layer 480, the seventh conductive layer 470, the first barrier layer 460 and the sixth conductive layer 450 may be sequentially etched using the first capping pattern 585 as an etch mask.

In example embodiments, the first capping pattern 585 may extend in the second direction D2, and a plurality of first capping patterns 585 may be spaced apart from each other in the first direction D1.

By the etching process, a seventh conductive pattern 455, a first barrier pattern 465, an eighth conductive pattern 475, a third mask 485, an etch stop pattern 565 and the first capping pattern 585 may be formed on the third opening 440, and a third insulation pattern 425, the seventh conductive pattern 455, the first barrier pattern 465, the eighth conductive pattern 475, the third mask 485, the etch stop pattern 565 and the first capping pattern 585 may be sequentially stacked on the second insulating layer 410 of the insulating layer structure 430 at an outside of the third opening 440.

Hereinafter, the seventh conductive pattern 455, the first barrier pattern 465, the eighth conductive pattern 475, the third mask 485, the etch stop pattern 565 and the first capping pattern 585 that are sequentially stacked may be referred to as a first bit line structure 595. The seventh conductive pattern 455, the first barrier pattern 465 and the eighth conductive pattern 475 may form a conductive structure, and the third mask 485, the etch stop pattern 565 and the first capping pattern 585 may form an electrically insulating structure. In example embodiments, the first bit line structure 595 may extend in the second direction D2, and a plurality of first bit line structures 595 may be spaced apart from each other in the first direction D1.

Figure 24:
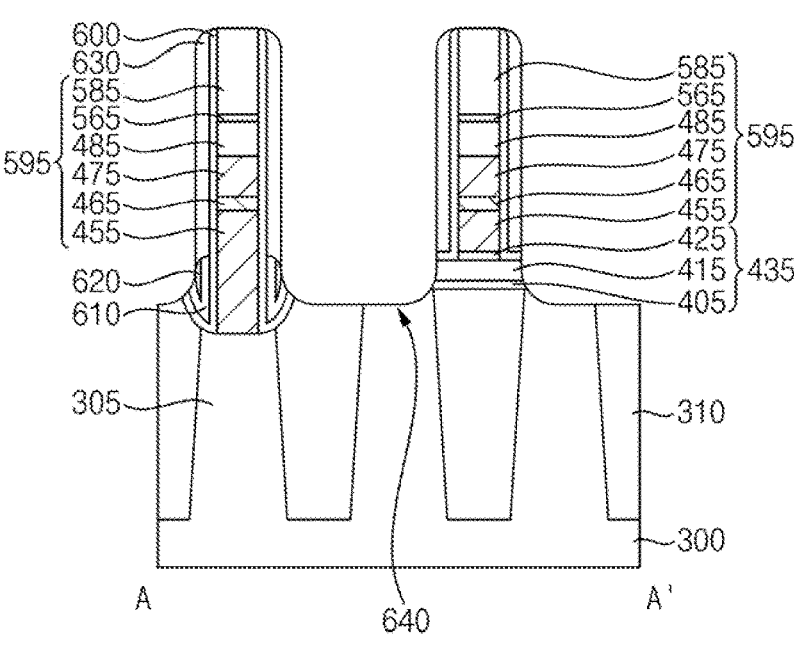

Referring to FIG. 24, a first spacer layer may be formed on the substrate 300 on which the first bit line structure 595 is formed, and fourth and fifth insulating layers may be sequentially formed on the first spacer layer.

The first spacer layer may also at least partially cover a sidewall of the third insulation pattern 425 under the first bit line structure 595 on the second insulating layer 410, and the fifth insulating layer may fill a remaining portion of the third opening 440.

The fourth and fifth insulating layers may be etched by an etching process. In example embodiments, the etching process may be a wet etching process using, for example, phosphoric acid ($H_3PO_3$), standard clean 1 (SC1), and hydrofluoric acid (HF) as an etchant, and portions of the fourth and fifth insulating layers except for portions thereof in the third opening 440 may be removed. Accordingly, most portion of a surface of the first spacer layer, for example, all portions of the surface of the first spacer layer except for a portion of the surface thereof in the third opening 440 may be exposed, and the fourth and fifth insulating layers remaining in the third opening 440 may form fourth and fifth insulation patterns 610 and 620, respectively.

A second spacer layer may be formed on the exposed surface of the first spacer layer and the fourth and fifth insulation patterns 610 and 620 in the third opening 440. The second spacer layer may be anisotropically etched to form a second spacer 630 at least partially covering a sidewall of the first bit line structure 595 on the surface of the first spacer layer and on the fourth and fifth insulation patterns 610 and 620.

A dry etching process may be performed using the first capping pattern 585 and the second spacer 630 as an etch mask to form a fourth opening 640 exposing an upper surface of the active pattern 305, and upper surfaces of the isolation pattern 310 the gate mask 350 may also be exposed by the fourth opening 640.

By the dry etching process, portions of the first spacer layer on upper surfaces of the first capping pattern 585 and the second insulating layer 410 may be removed, and thus a first spacer 600 may be formed on the sidewall of the first bit line structure 595. By the dry etching process, the first and second insulating layers 400 and 410 may be partially removed to remain as first and second insulation patterns 405 and 415, respectively, under the first bit line structure 595. The first to third insulation patterns 405, 415 and 425 that are sequentially stacked under the first bit line structure 595 may form a first insulation pattern structure 435.

Figure 25:
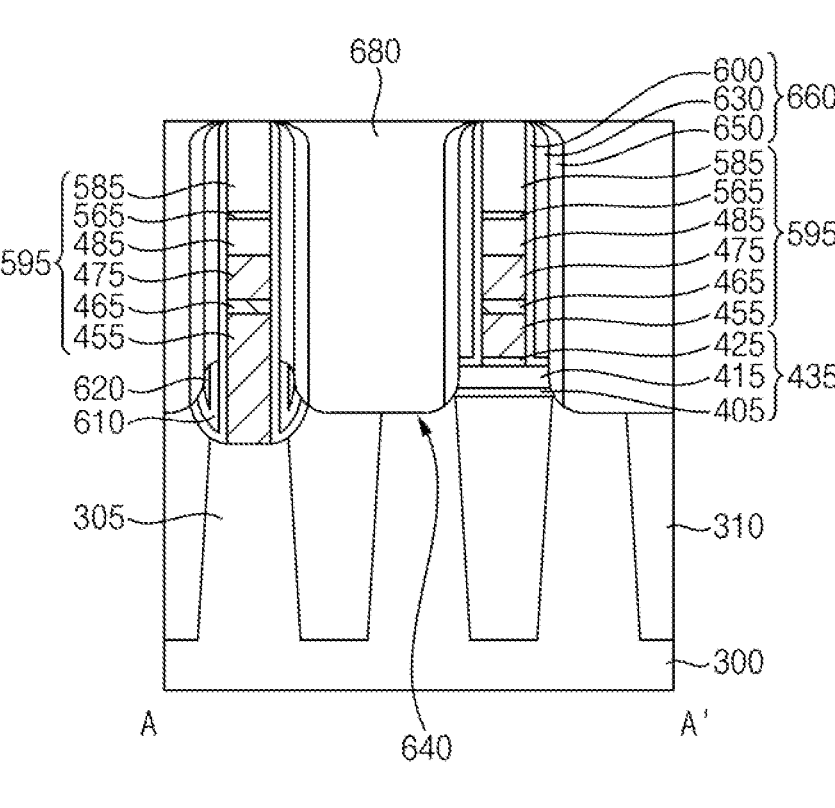

Referring to FIG. 25, a third spacer layer may be formed on an upper surface of the first capping pattern 585, an outer sidewall of the second spacer 630, portions of the upper surfaces of the fourth and fifth insulation patterns 610 and 620, and upper surfaces of the active pattern 305, the isolation pattern 310 and the gate mask 350 exposed by the fourth opening 640. The third spacer layer may be anisotropically etched to form a third spacer 650 at least partially covering the sidewall of the first bit line structure 595.

The first to third spacers 600, 630 and 650 that are sequentially stacked on the sidewall of the first bit line structure 595 in the horizontal direction may be referred to as a preliminary spacer structure 660.

A sacrificial layer may be formed to fill the fourth opening 640 on the substrate 300 to a sufficient height, and an upper portion of the sacrificial layer may be planarized until the upper surface of the first capping pattern 585 is exposed to form a sacrificial pattern 680 in the fourth opening 640.

In example embodiments, the sacrificial pattern 680 may extend in the second direction D2, and a plurality of sacrificial patterns 680 may be spaced apart from each other in the first direction D1 by the first bit line structures 595. The sacrificial pattern 680 may include, for example, an oxide such as silicon oxide.

Figure 26:
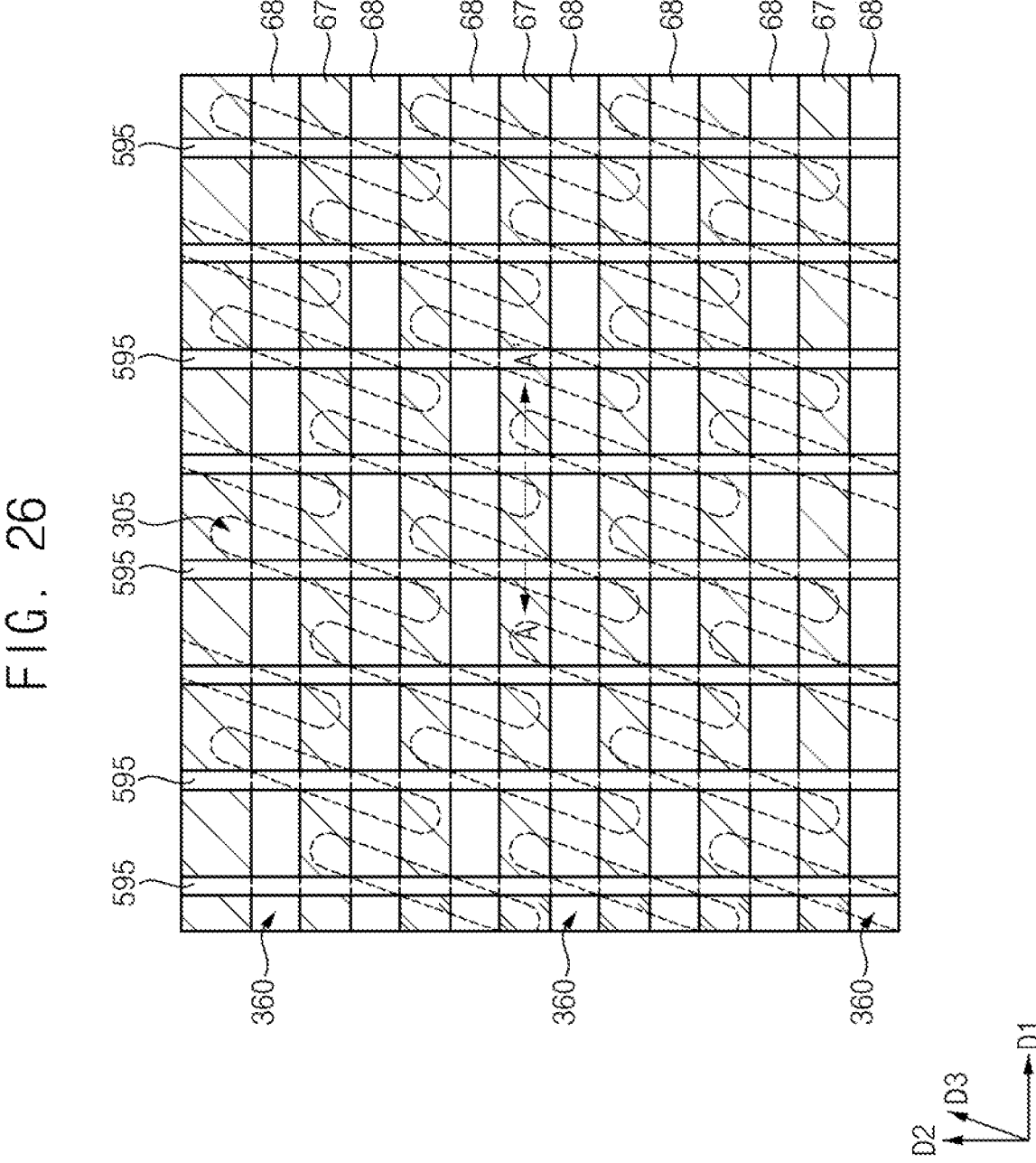
Figure 27:
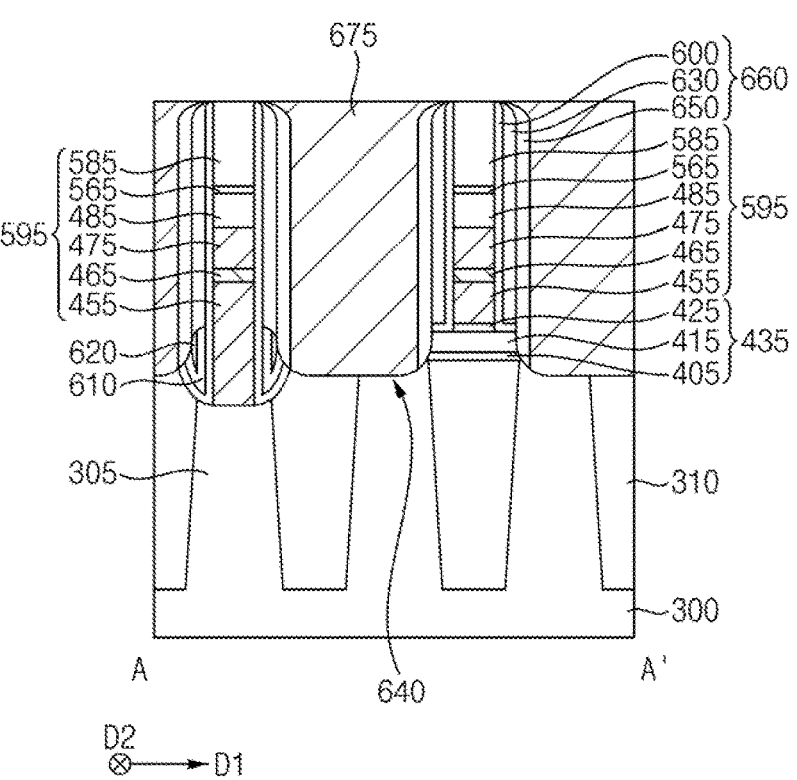

Referring to FIGS. 26 and 27, a fourth mask including a plurality of fifth openings, each of which may extend in the first direction D1, spaced apart from each other in the second direction D2 may be formed on the first capping pattern 585, the sacrificial pattern 680 and the preliminary spacer structure 660, and may be etched using the fourth mask as an etching mask.

In example embodiments, each of the fifth openings may overlap a region between the gate structures 360 in the vertical direction. By the etching process, a sixth opening exposing upper surfaces of the active pattern 305 and the isolation pattern 310 may be formed between the first bit line structures 595 on the substrate 300.

The fourth mask may be removed, a lower contact plug layer may be formed to fill the sixth opening to a sufficient height, and an upper portion of the lower contact plug layer may be planarized until the upper surface of the first capping pattern 585 and upper surfaces of the sacrificial pattern 680 and the preliminary spacer structure 660 are exposed. Thus, the lower contact plug layer may be transformed into a plurality of lower contact plugs 675 spaced apart from each other in the second direction D2 between the first bit line structures 595. Additionally, the sacrificial pattern 680 extending in the second direction D2 between the first bit line structures 595 may be divided into a plurality of parts in the second direction D2 by the lower contact plugs 675.

The sacrificial pattern 680 may be removed to form a seventh opening, and a second capping pattern 685 may be formed to fill the seventh opening. In example embodiments, the second capping pattern 685 may overlap the gate structure 360 in the vertical direction.

Figure 28:
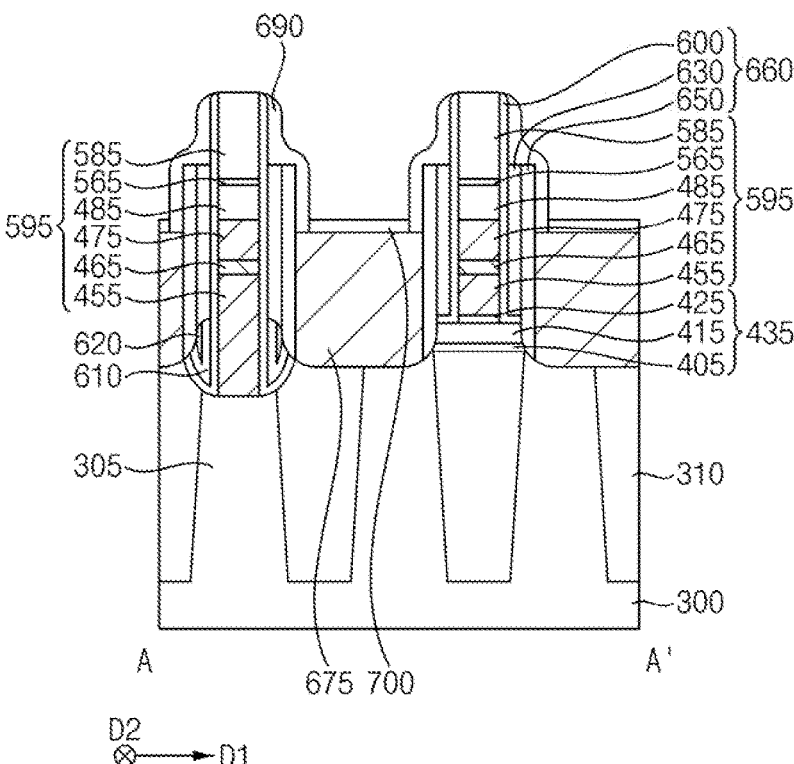

Referring to FIG. 28, an upper portion of the lower contact plug 675 may be removed to expose an upper portion of the preliminary spacer structure 660 on the sidewall of the first bit line structure 595, and upper portions of the second and third spacers 630 and 650 of the exposed preliminary spacer structure 660 may be removed.

An upper portion of the lower contact plug 675 may be additionally removed. Thus, an upper surface of the lower contact plug 675 may be lower than upper surfaces of the second and third spacers 630 and 650.

A fourth spacer layer may be formed on the first bit line structure 595, the preliminary spacer structure 660, the second capping pattern 685 and the lower contact plug 675, and may be anisotropically etched to form a fourth spacer 690 at least partially covering an upper portion of the preliminary spacer structure 660 on the sidewall of the first bit line structure 595, and the upper surface of the lower contact plug 675 may be exposed by the etching process.

A metal silicide pattern 700 may be formed on the exposed upper surface of the lower contact plug 675. In example embodiments, the metal silicide pattern 700 may be formed by forming a first metal layer on the first and second capping patterns 585 and 685, the fourth spacer 690 and the lower contact plug 675, performing a heat treatment thereon, and removing an unreacted portion of the first metal layer.

Figure 29:
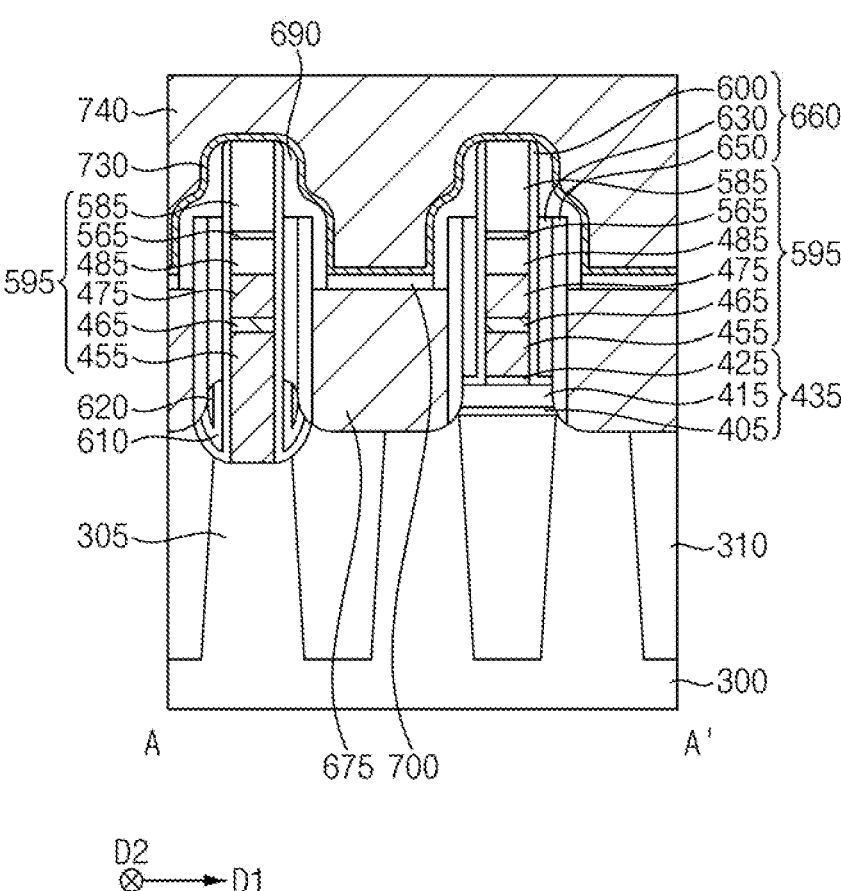

Referring to FIG. 29, a second barrier layer 730 may be formed on the first and second capping patterns 585 and 685, the fourth spacer 690, the metal silicide pattern 700 and the lower contact plug 675, and a second metal layer 740 may be formed on the second barrier layer 730 to fill a space between the first bit line structures 595.

A planarization process may be performed on an upper portion of the second metal layer 740. The planarization process may include, for example, a chemical mechanical polishing (CMP) process and/or an etch-back process.

Referring to FIGS. 30 and 31, the second metal layer 740 and the second barrier layer 730 may be patterned to form an upper contact plug 755. In example embodiments, a plurality of upper contact plugs 755 may be formed, and an eighth opening 760 may be formed between the upper contact plugs 755.

The eighth opening 760 may be formed by partially removing the first and second capping patterns 585 and 685, the preliminary spacer structure 660 and the fourth spacer 690 as well as the second metal layer 740 and the second barrier layer 730.

The upper contact plug 755 may include a second metal pattern 745 and a second barrier pattern 735 at least partially covering a lower surface of the second metal pattern 745. In example embodiments, the upper contact plug 755 may have a shape of a circle, an ellipse, or a rounded polygon in a plan view, and the upper contact plugs 755 may be arranged, for example, in a honeycomb pattern in the first and second direction D1 and D2, in a plan view.

The lower contact plug 675, the metal silicide pattern 700 and the upper contact plug 755 that are sequentially stacked on the substrate 300 may collectively form a contact plug structure.

Figure 32:
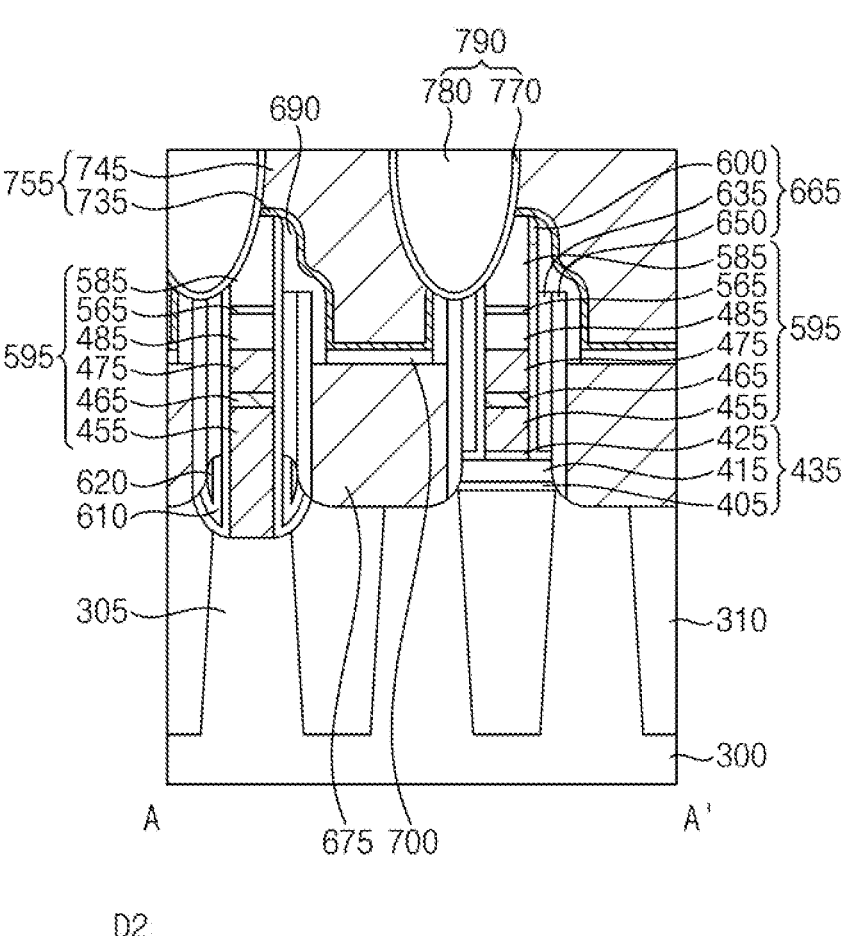

Referring to FIG. 32, the second spacer 630 included in the preliminary spacer structure 660 exposed by the eighth opening 760 may be removed to form an air gap, a sixth insulation pattern 770 may be formed on a bottom and a sidewall of the eighth opening 760, and a seventh insulation pattern 780 may be formed to fill a remaining portion of the eighth opening 760.

Each of the sixth and seventh insulation patterns 770 and 780 may form a second insulation pattern structure 790.

A top end of the air gap may be at least partially covered by the sixth insulation pattern 770, and thus an air spacer 635 may be formed. The first spacer 600, the air spacer 635 and the third spacer 650 may form a spacer structure 665.

Referring to FIGS. 15 and 16 again, the first capacitor structure may be formed by processes substantially the same as or similar to the processes described with reference to FIGS. 1 to 6.

Figure 33:
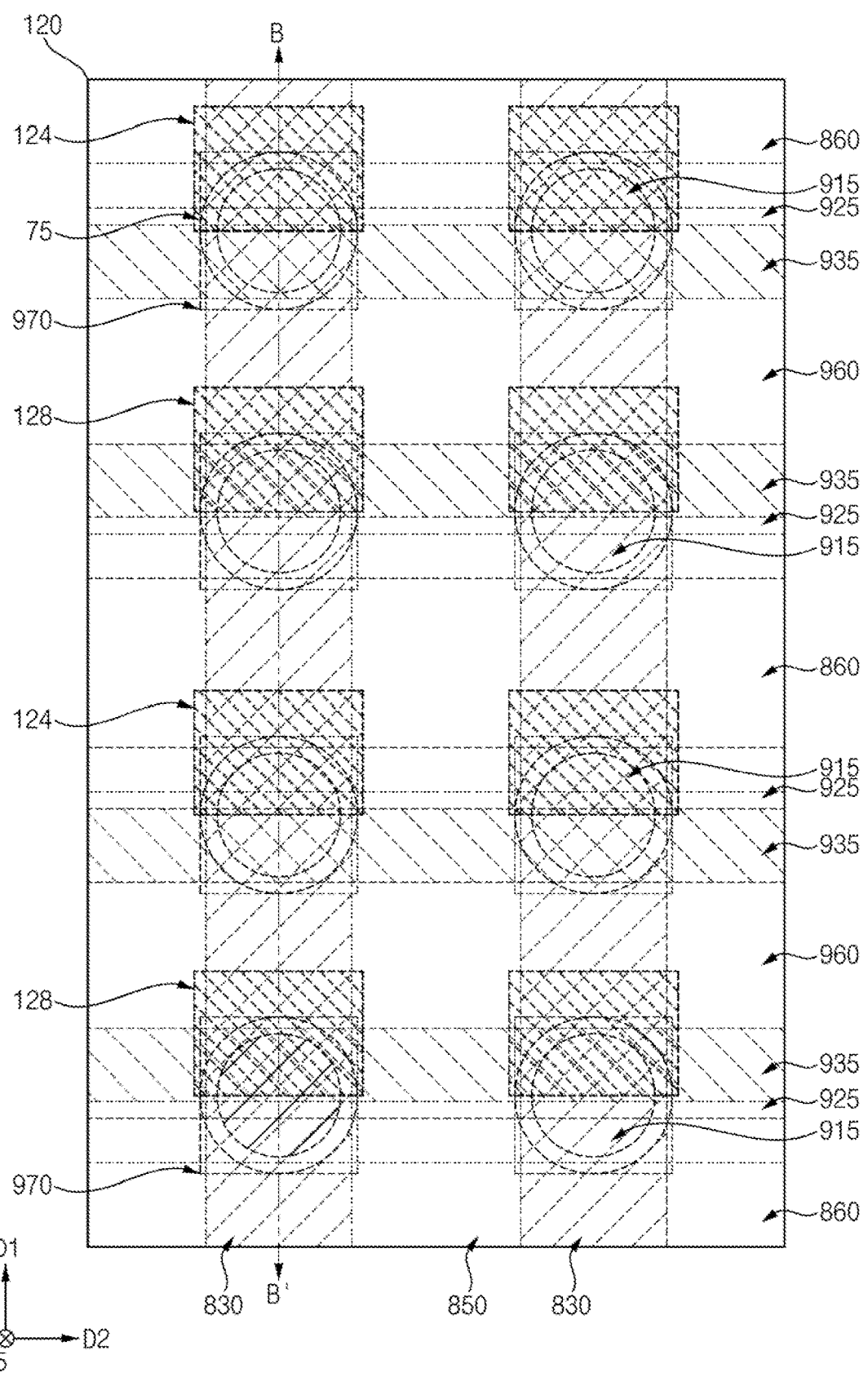
FIGS. 33 and 34 are a plan view and a cross-sectional view, respectively, illustrating a semiconductor device according to example embodiments.
Figure 34:
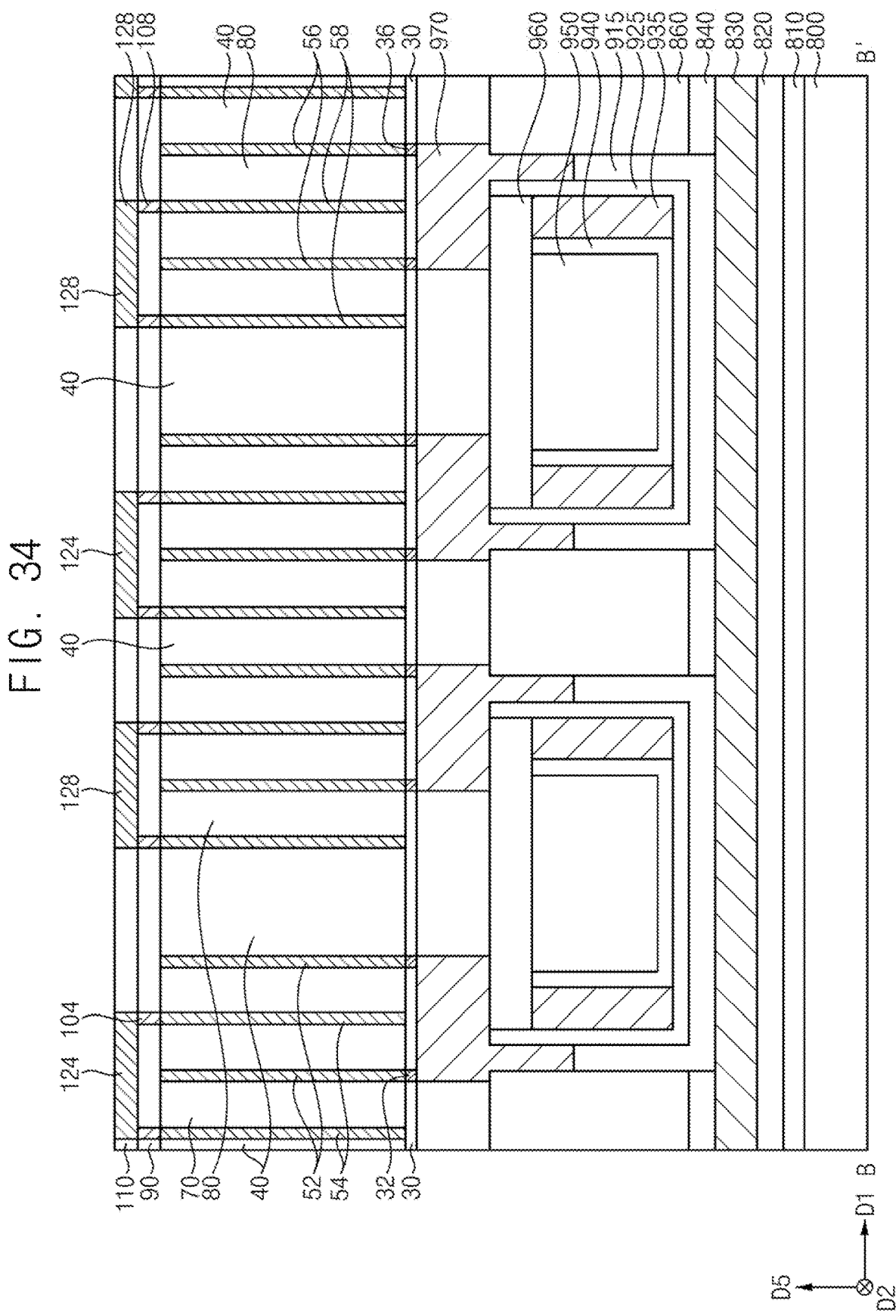

FIGS. 33 and 34 are a plan view and a cross-sectional view, respectively, illustrating a semiconductor device according to example embodiments. FIG. 34 is a cross-sectional view taken along line B-B' of FIG. 33.

This semiconductor device may be an application of the first capacitor structure illustrated with reference to FIG. 1 to a vertical channel transistor (VCT) DRAM device, and thus to the extent that an element is not described in detail herein, it may be assumed that the element is at least similar to a corresponding element that has been described elsewhere within the instant specification. However, the semiconductor device may include one of the second to sixth capacitor structures shown in FIGS. 10 to 14 instead of the first capacitor structure.

Hereinafter, two directions among horizontal directions that are substantially parallel to an upper surface of a substrate 800, which may be substantially orthogonal to each other, may be referred as first and second directions D1 and D2, respectively, and a direction that is substantially perpendicular to the upper surface of the substrate 800 may be referred to as a fifth direction D5.

Referring to FIGS. 33 and 34, the semiconductor device may include a second bit line structure, a second gate electrode 935, a second gate insulation pattern 925, a channel 915, a contact plug 970 and the first capacitor structure on a substrate 800.

The semiconductor device may further include an eighth insulation layer 810, eleventh and twelfth insulation patterns 940 and 960, and fifth to eighth insulating interlayer patterns 850, 860, 950 and 980.

The substrate 800 may include, e.g., a semiconductor material, an electrically insulating material or an electrically conductive material.

Figure 35:
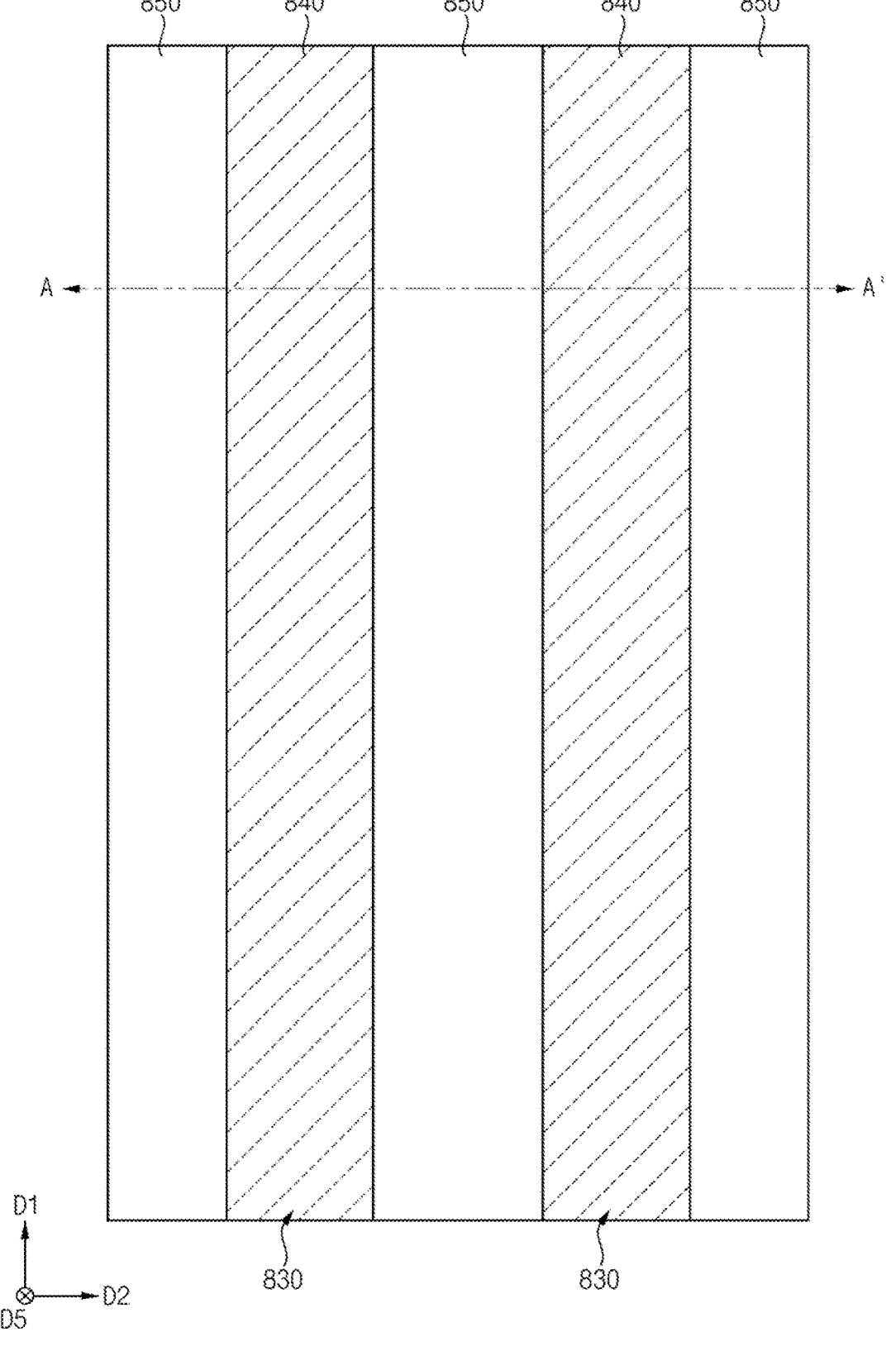
Figure 36:
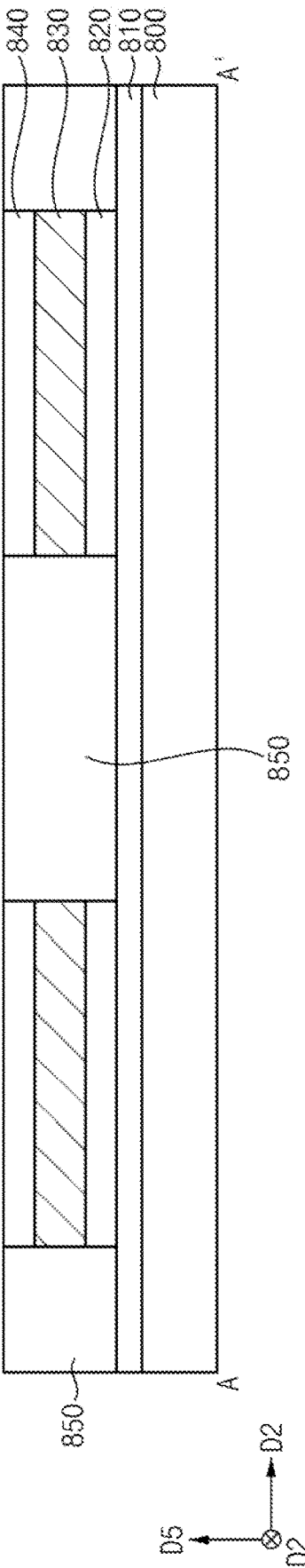

Referring to FIGS. 33 and 34 together with FIGS. 35 and 36, the eighth insulation layer 810 may be formed on the substrate 800, and the second bit line structure may extend in the first direction D1 on the eighth insulation layer 810.

In example embodiments, the second bit line structure may include a ninth insulation pattern 820, a second bit line 830 and a tenth insulation pattern 840 that are sequentially stacked on the eighth insulation layer 810. Each of the ninth insulation pattern 820 and the second bit line 830 may extend in the first direction D1, and a plurality of tenth insulation patterns 840 may be spaced apart from each other in the first direction D1 on the second bit line 830.

In example embodiments, a plurality of second bit line structures may be spaced apart from each other in the second direction D2, and the fifth insulating interlayer pattern 850 may extend in the first direction D1 on the eighth insulation layer 810 between neighboring ones of the second bit line structures in the second direction D2.

An upper surface of a portion of the fifth insulating interlayer pattern 850 that is adjacent to the tenth insulation pattern 840 in the second direction D2 may be substantially coplanar with an upper surface of the tenth insulation pattern 840, and an upper surface of a portion of the fifth insulating interlayer pattern 850 that is not adjacent to the tenth insulation pattern 840 in the second direction D2 may be substantially coplanar with an upper surface of the second bit line 830. For example, a height of the upper surface of the fifth insulating interlayer pattern 850 may periodically change in the first direction D1.

Each of the eighth insulation layer 810 and the fifth insulating interlayer pattern 850 may include an oxide, e.g., silicon oxide, the second bit line 830 may include a conductive material, e.g., a metal, a metal nitride, a metal silicide, and each of the ninth and tenth insulation patterns 820 and 840 may include an electrically insulating nitride, e.g., silicon nitride.

The sixth insulating interlayer pattern 860 extending in the second direction D2 may be formed on the tenth insulation pattern 840 and the fifth insulating interlayer pattern 850. The sixth insulating interlayer pattern 860 may include an oxide, e.g., silicon oxide. Hereinafter, the sixth insulation pattern 860, the tenth insulation pattern 840 and an upper portion of the fifth insulating interlayer pattern 850 at the same height as the tenth insulation pattern 840 may be collectively referred to as a bar structure. In example embodiments, the bar structure may extend in the second direction D2, and a plurality of bar structures may be spaced apart from each other in the first direction D1.

In example embodiments, the channel 915 may be formed between neighboring ones of the bar structures in the first direction D1, and a plurality of channels 915 may be spaced apart from each other in the second direction D2 on the second bit line 830 and the fifth insulating interlayer pattern 850. A fourteenth insulation pattern 500 may be formed between neighboring ones of the channels 915 in the second direction D2. The fourteenth insulation pattern 500 may include an oxide, e.g., silicon oxide or an electrically insulating nitride, e.g., silicon nitride.

Additionally, a plurality of channels 915 may be spaced apart from each other in the first direction D1 on the second bit line 830 extending in the first direction D1. FIG. 33 shows that a width in the second direction D2 of the channel 915 may be substantially the same as a width in the second direction D2 of the second bit line 830, however, the inventive concept is not necessarily limited thereto.

In example embodiments, the channel 915 may be conformally formed on an upper surface of the second bit line 830, an upper surface of the fifth insulating interlayer pattern 850 and a sidewall of the bar structure, and thus a cross-section of the channel 915 in the first direction D1 may have a shape of a cup.

In example embodiments, the channel 915 may include an oxide semiconductor material. The oxide semiconductor material may include zinc tin oxide (ZTO), indium zine oxide (IZO), zinc oxide ($ZnO_x$), indium gallium zinc oxide (IGZO), indium gallium silicon oxide (IGSO), Indium oxide ($InO_x$, $In_2O_3$), tin oxide ($SnO_2$) titanium oxide ($TiO_x$), zinc oxide nitride ($Zn_xOyN_z$), magnesium zinc oxide ($Mg_xZn_yO_z$), indium zinc oxide ($In_xZn_yO_a$), indium gallium zinc oxide ($In_xGa_yZn_zO_a$), zirconium indium zinc oxide ($Zr_xIn_yZn_zO_a$), hafnium indium zinc oxide ($Hf_xIn_yZn_xO_a$), tin indium zinc oxide ($Sn_xIn_yZn_zO_a$), aluminum tin indium zinc oxide ($Al_xSn_yIn_zZn_aO_d$), silicon indium zinc oxide ($Si_xIn_yZn_zO_a$), zinc tin oxide ($Zn_xSn_yO_z$), aluminum zinc tin oxide ($Al_xZn_ySn_zO_a$), gallium zinc tin oxide ($Ga_xZn_ySn_zO_a$), zirconium zinc tin oxide ($Zr_xZn_ySn_zO_a$), and/or indium gallium silicon oxide (InGaSiO).

In example embodiments, the channel 915 may include amorphous oxide semiconductor material. In example embodiments, an upper surface of the channel 915 may be lower than an upper surface of the bar structure.

The seventh insulating interlayer pattern 950 may extend on a portion of the channel 915 on the second bit line 830 and the fifth insulating interlayer pattern 850 between neighboring ones of the bar structures in the first direction D1, and a lower surface and a sidewall of the seventh insulating interlayer pattern 950 may be at least partially covered by the eleventh insulation pattern 940. A cross-section of the eleventh insulation pattern 940 in the first direction D1 may have a cup shape, and may contact an upper surface of the portion of the channel 915 on the second bit line 830 and the fifth insulating interlayer pattern 850.

The seventh insulating interlayer pattern 950 may include an oxide, e.g., silicon oxide, and the eleventh insulation pattern 940 may include an electrically insulating nitride, e.g., silicon nitride.

The second gate insulation pattern 925 and the second gate electrode 935 may be formed between a portion of the channel 915 on the sidewall of the bar structure and the eleventh insulation pattern 940.

The second gate electrode 935 may contact an outer sidewall of the eleventh insulation pattern 940, and may extend in the second direction D2. An upper surface of the second gate electrode 935 may be substantially coplanar with upper surfaces of the seventh insulating interlayer pattern 950 and the eleventh insulation pattern 940. The second gate electrode 935 may include a conductive material, e.g., a metal, a metal nitride, a metal silicide, etc.

The second gate insulation pattern 925 may extend in the second direction D2, and may contact a lower surface and an outer sidewall of the second gate electrode 935. Additionally, the second gate insulation pattern 925 may contact inner sidewalls of the portion of the channel 915 and a lower portion of the contact plug 970 on the sidewall of the bar structure, and an upper surface of the portion of the channel 915 on the second bit line 830 and the fifth insulating interlayer pattern 850. Thus, a cross-section of the second gate insulation pattern 925 in the first direction D1 may have an "L" shape.

The second gate insulation pattern 925 may include a metal oxide, e.g., aluminum oxide, hafnium oxide, zirconium oxide, etc., or silicon oxide.

The twelfth insulation pattern 960 may be formed on the seventh insulating interlayer pattern 950, the eleventh insulation pattern 940 and the second gate electrode 935, and may extend in the second direction D2. The twelfth insulation pattern 960 may contact the upper surfaces of the seventh insulating interlayer pattern 950, the eleventh insulation pattern 940 and the second gate electrode 935, and an upper inner sidewall of the second gate insulation pattern 925.

In example embodiments, an upper surface of the twelfth insulation pattern 960 may be substantially coplanar with the upper surface of the second gate insulation pattern 925. The twelfth insulation pattern 960 may include an electrically insulating nitride, e.g., silicon nitride.

The contact plug 970 may contact the upper surface of the channel 915 at each of areas where the second bit lines 830 and the second gate electrodes 935 cross each other in the third direction D3. The contact plug 970 may contact the upper surfaces of the second gate insulation pattern 925, the sixth insulating interlayer pattern 860 and the twelfth insulation pattern 960 adjacent to the channel 915, and may be spaced apart from the upper surface of the second gate electrode 935 by the twelfth insulation pattern 960.

In example embodiments, the contact plug 970 may include the lower portion contacting the upper surface of the channel 915, and an upper portion on the lower portion and having a width greater than a width of the lower portion. The lower portion of the contact plug 970 may contact the second gate insulation pattern 925 and the sixth insulating interlayer pattern 860, and a lower surface of the lower portion of the contact plug 970 may be lower than an upper surface of the second gate electrode 935.

In example embodiments, a plurality of contact plugs 970 may be spaced apart from each other in the first and second directions D1 and D2, and may be arranged in a lattice pattern or a honeycomb pattern in a plan view. The contact plug 970 may include a conductive material, e.g., a metal, a metal nitride, a metal silicide, etc.

The eighth insulating interlayer pattern 980 may be formed on the sixth insulating interlayer pattern 860, the channel 915, the second gate insulation pattern 925 and the twelfth insulation pattern 960, and may at least partially cover a sidewall of the contact plug 970. The eighth insulating interlayer pattern 980 may include an oxide, e.g., silicon oxide.

The first capacitor structure may include the first and second capacitors, and the second insulating interlayer 30 may be formed on the eighth insulating interlayer pattern 980 and the contact plug 970.

The first electrodes 52 included in the first capacitor may be electrically connected to the first vias 32, respectively, extending through the second insulating interlayer 30 and may contact an upper surface of the contact plug 970, and the second electrodes 54 included in the first capacitor may be electrically connected to the third vias 104, respectively, extending through the third insulating interlayer 90 and may contact upper surfaces of the second electrodes 54, respectively, and the third conductive pattern 124 extending through the fourth insulating interlayer 110 and may contact upper surfaces of the third vias 104.

Additionally, the third electrodes 56 included in the second capacitor may be electrically connected to the second vias 36, respectively, extending through the second insulating interlayer 30 and may contact an upper surface of the contact plug 970, and the fourth electrodes 58 included in the second capacitor may be electrically connected to the fourth vias 108, respectively, extending through the third insulating interlayer 90 and may contact upper surfaces of the fourth electrodes 58, respectively, and the fourth conductive pattern 128 extending through the fourth insulating interlayer 110 and may contact upper surfaces of the fourth vias 108.

In the semiconductor device, current may flow in the fifth direction D5, for example, in the vertical direction in the channel 915 between the second bit line 830 and the contact plug 970, and thus the semiconductor device may include a vertical channel transistor (VCT) having a vertical channel.

FIGS. 35 to 45 are plan views and cross-sectional views illustrating a method of manufacturing a semiconductor device in accordance with example embodiments. For example, FIGS. 35, 37, 40, 42 and 44 are the plan views, and FIG. 36 is a cross-sectional view taken along line A-A' of FIG. 35, and FIGS. 38-39, 41, 43 and 45 are cross-sectional views taken along lines B-B' of corresponding plan views, respectively.

This method may be an application of the method of forming the first capacitor structure illustrated with reference to FIGS. 1 to 6 to a method of manufacturing a VCT DRAM device, and thus to the extent that a method for forming an element is not described in detail herein, it may be assumed that the element is formed at least similar to a corresponding element whose method of formation has been described elsewhere within the instant specification.

Referring to FIGS. 35 and 36, an eighth insulation layer 810, a ninth insulation layer, a second bit line layer and a tenth insulation layer may be sequentially stacked on a substrate 800, and the tenth insulation layer, the second bit line layer and the ninth insulation layer may be patterned to form a tenth insulation pattern 840, a second bit line 830 and a ninth insulation pattern 820, respectively.

The ninth insulation pattern 820, the second bit line 830 and the tenth insulation pattern 840 that are sequentially stacked on the substrate 800 may be referred to as a second bit line structure. In example embodiments, the second bit line structure may extend in the first direction D1 on the substrate 800, and a plurality of second bit line structures may be spaced apart from each other in the second direction D2. Thus, a ninth opening may be formed between neighboring ones of the second bit line structures in the second direction D2 to expose an upper surface of the eighth insulation layer 810.

A fifth insulating interlayer may be formed on the second bit line structures and the eighth insulation layer 810 to fill the ninth opening, and an upper portion of the fifth insulating interlayer may be planarized until upper surfaces of the second bit line structures are exposed. Thus, a fifth insulating interlayer pattern 850 extending in the first direction D1 may be formed on the eighth insulation layer 810 between the second bit line structures.

In example embodiments, the planarization process may include a chemical mechanical polishing (CMP) process and/or an etch back process.

Figure 37:
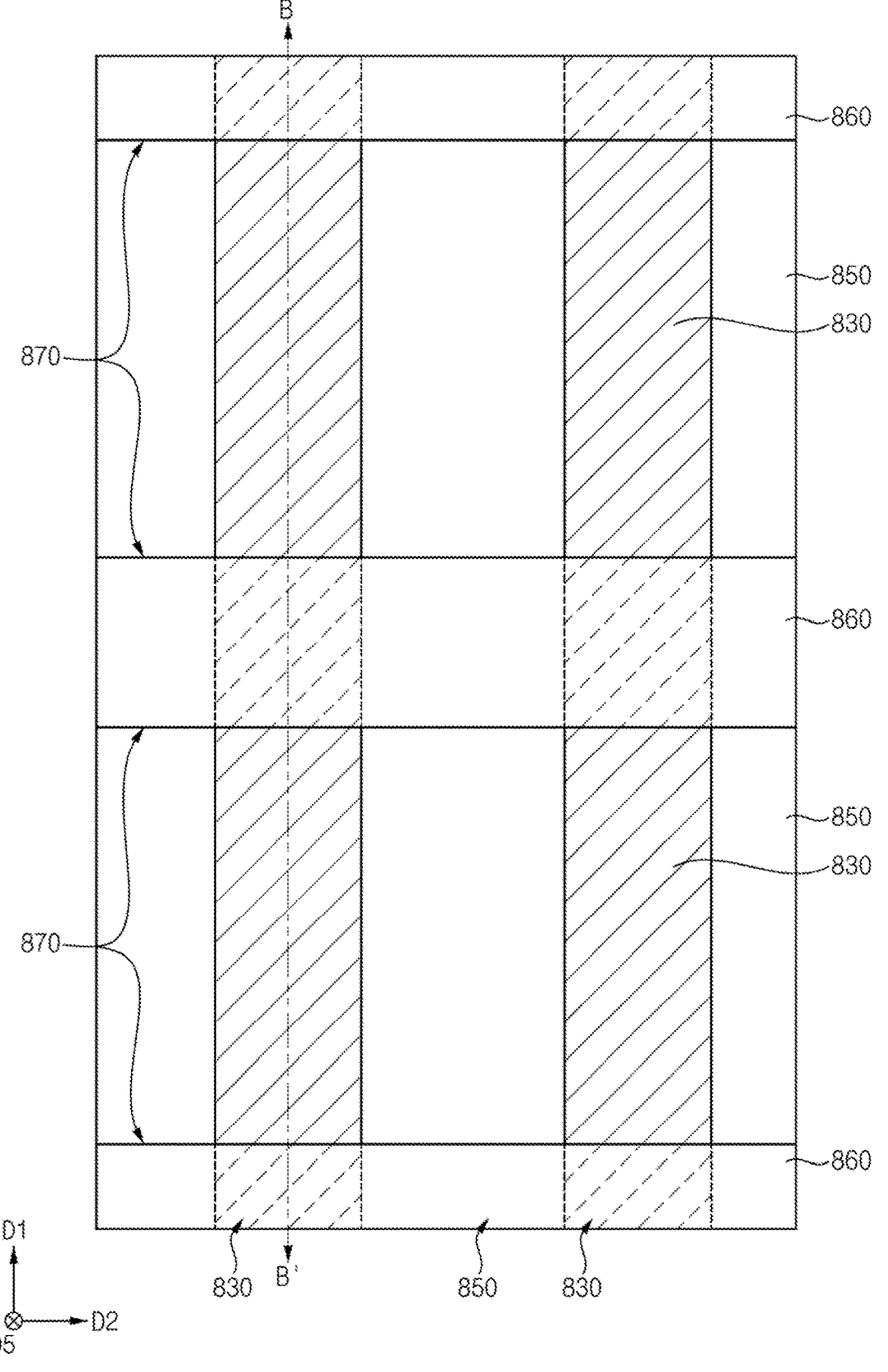
Figure 38:
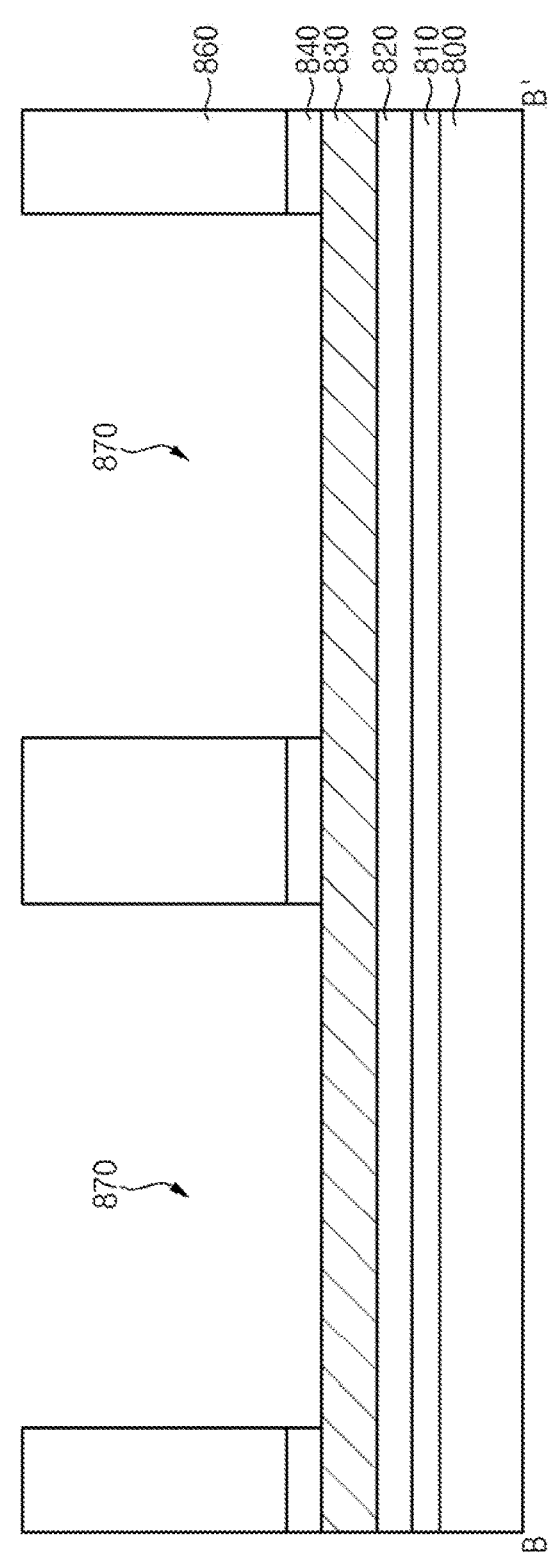
Figure 38:
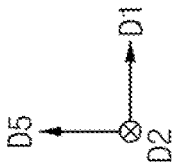

Referring to FIGS. 37 and 38, a sixth insulating interlayer may be formed on the second bit line structures and the fifth insulating interlayer patterns 850, and the sixth insulating interlayer and the tenth insulation pattern 840 may be partially removed by, e.g., a dry etching process to form a tenth opening 870 extending in the second direction D2 and exposing upper surfaces of the second bit line 830 and the fifth insulating interlayer pattern 850.

Thus, the sixth insulating interlayer may be divided into a plurality of sixth insulating interlayer patterns 860, each of which may extend in the second direction D2, spaced apart from each other in the first direction D1.

Figure 39:
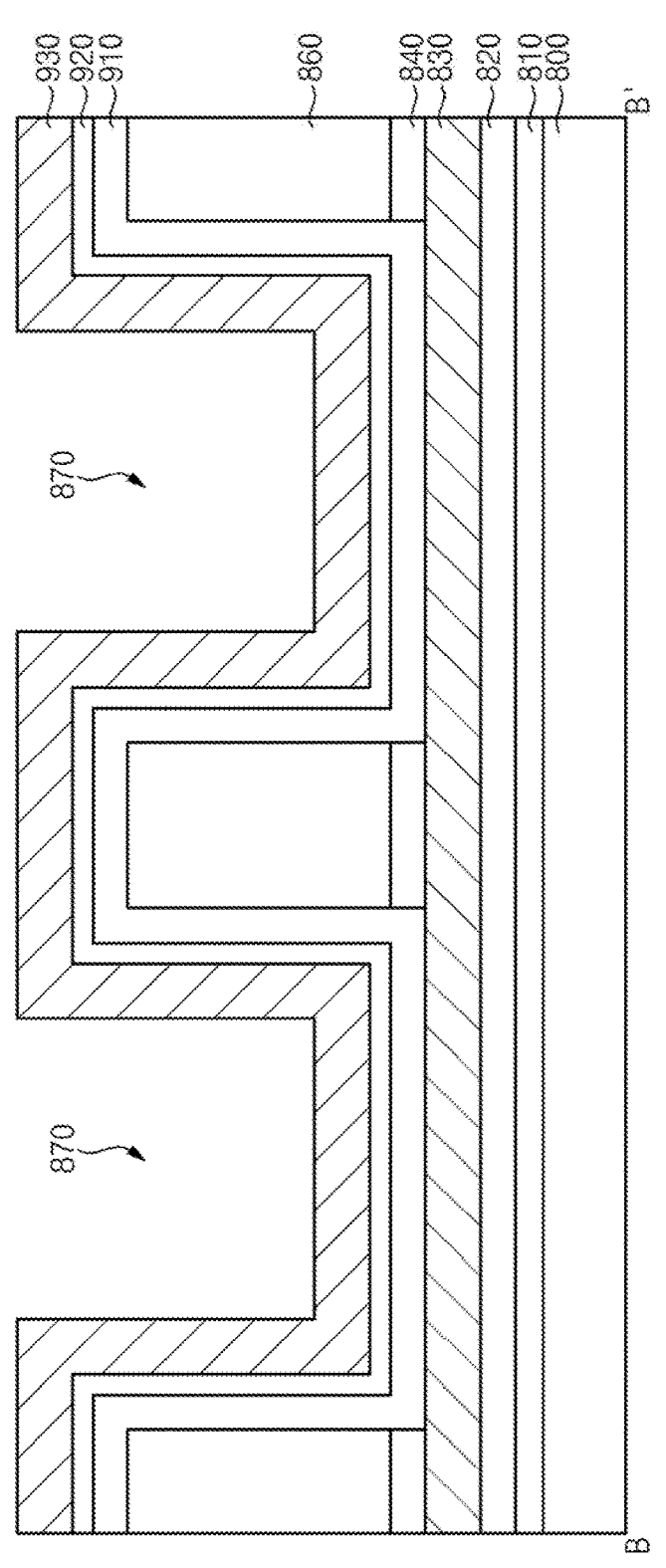
Figure 39:
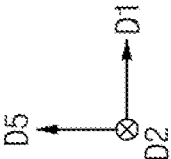

Referring to FIG. 39, a channel layer 910, a second gate insulation layer 920 and a second gate electrode layer 930 may be sequentially stacked on upper surfaces of the second bit line 830 and the fifth insulating interlayer pattern 850 exposed by the tenth opening 870 and a sidewall and an upper surface of the sixth insulating interlayer pattern 860.

In example embodiments, the channel layer 910, the second gate insulation layer 920 and the second gate electrode layer 930 may be formed by a deposition process, e.g., an atomic layer deposition (ALD) process, a chemical vapor deposition (CVD) process, etc.

In example embodiments, the channel layer 910 may include an amorphous oxide semiconductor material, e.g., IGZO, and may be formed at a relatively low temperature. The second gate insulation layer 920 and the second gate electrode layer 930 may be formed at a relatively high temperature.

Figure 40:
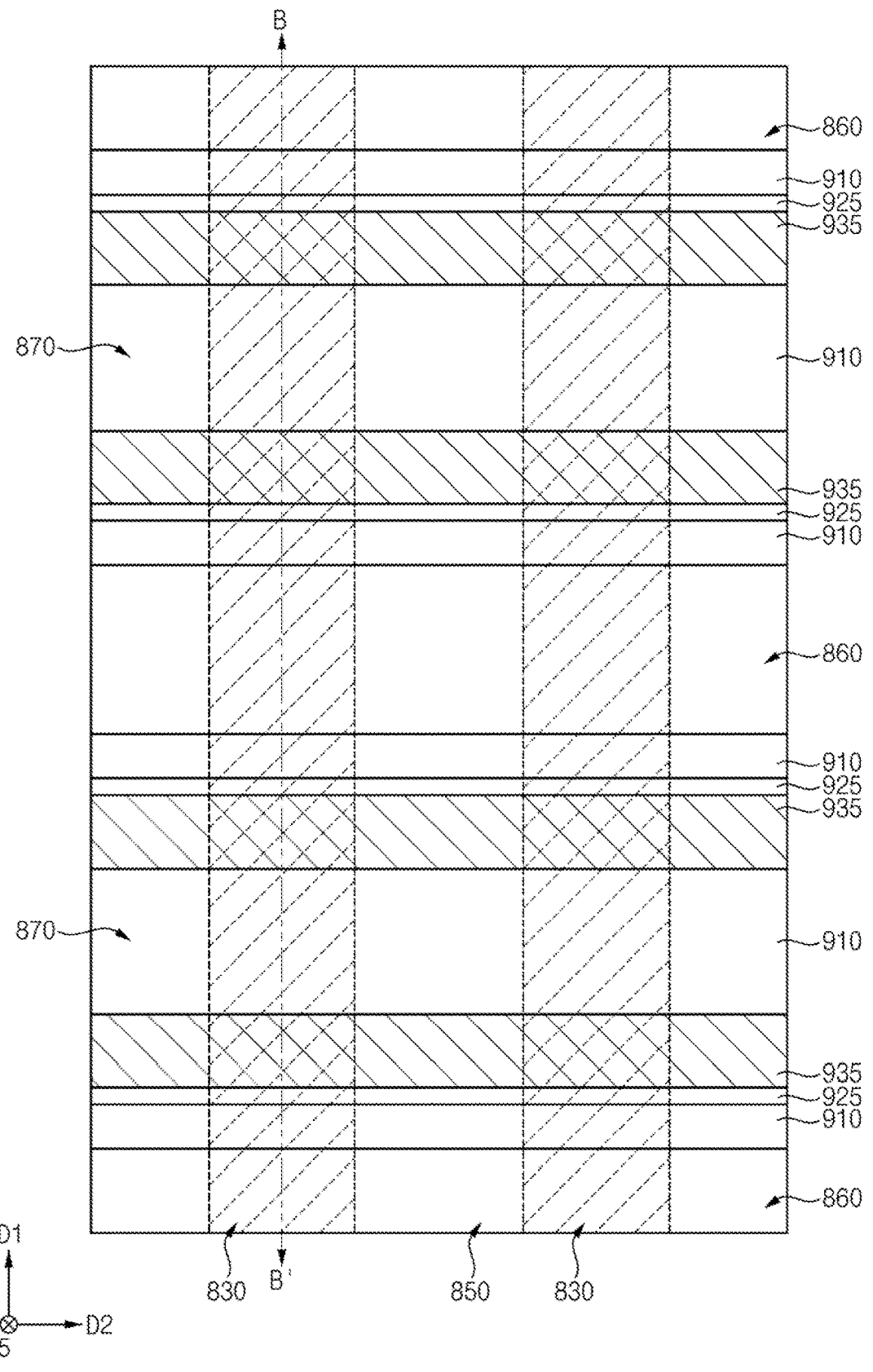

Referring to FIGS. 40 and 41, the second gate electrode layer 930 and the second gate insulation layer 920 may be anisotropically etched to form a second gate electrode 935 and a second gate insulation pattern 925, respectively, on a sidewall of the tenth opening 870.

In example embodiments, an outer sidewall of the second gate insulation pattern 925 may contact an inner sidewall of the channel layer 910 and an upper surface of an edge portion in the first direction D1 of the channel layer 910. In example embodiments, a cross-section of the second gate insulation pattern 925 in the first direction D1 may have an "L" shape.

The second gate electrode 935 may contact an inner sidewall of the second gate insulation pattern 925 and an upper surface of a portion of the second gate insulation pattern 925 that is on the upper surface of the edge portion of the channel layer 910.

An upper portion of the second gate electrode 935 may be removed by, e.g., an etch back process. Thus, an upper surface of the second gate electrode 935 may be lower than an upper surface of the second gate insulation pattern 925, and an upper inner sidewall of the second gate insulation pattern 925 may be exposed. In example embodiments, the upper surface of the second gate electrode 935 may be lower than an upper surface of the sixth insulating interlayer pattern 860.

Figure 42:
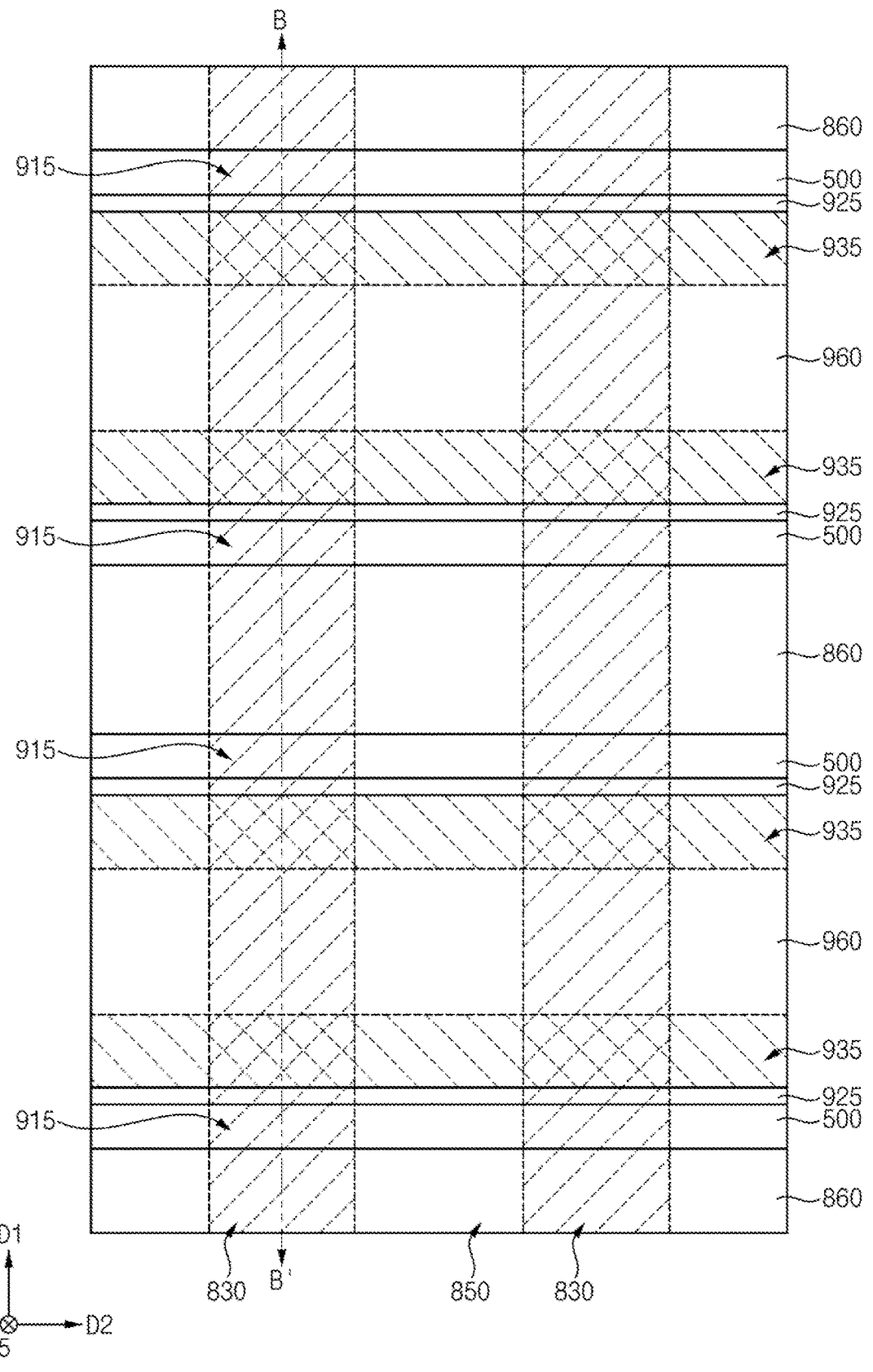
Figure 43:
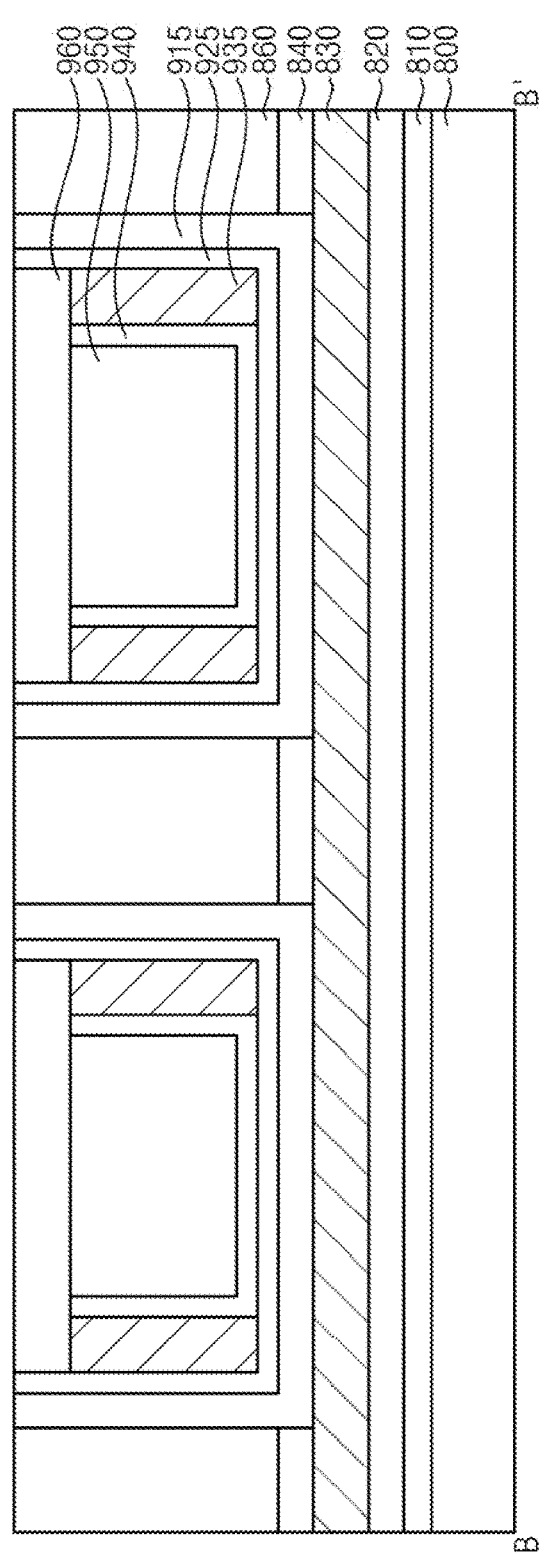
Figure 43:
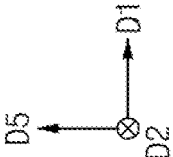

Referring to FIGS. 42 and 43, an eleventh insulation layer may be formed on a sidewall and the upper surface of the second gate electrode 935, the upper inner sidewall and the upper surface of the second gate insulation pattern 925, and an upper surface of the channel layer 910, a seventh insulating interlayer may be formed on the eleventh insulation layer to fill a remaining portion of the tenth opening 870, and a planarization process may be performed on the seventh insulating interlayer, the eleventh insulation layer, the second gate insulation pattern 925 and the channel layer 910 until the upper surface of the sixth insulating interlayer pattern 860 is exposed.

The planarization process may include a CMP process and/or an etch back process.

By the planarization process, a seventh insulating interlayer pattern 950 and an eleventh insulation pattern 940 at least partially covering a lower surface and a sidewall of the seventh insulating interlayer pattern 950 may be formed in the tenth opening 870, and the channel layer 910 may be divided into a plurality of channels 915 spaced apart from each other in the first direction D1. In example embodiments, each of the channels 915 may extend in the second direction D2, and a cross-section in the first direction D1 of each of the channels 915 may have a cup shape.

Upper portions of the seventh insulating interlayer pattern 950 and the eleventh insulation pattern 940 may be removed to form a third recess exposing the upper surface of the second gate electrode 935, and a twelfth insulation pattern 960 may be formed in the third recess.

The twelfth insulation pattern 960 may be formed by forming a twelfth insulation layer on the second gate electrode 235, the seventh insulating interlayer pattern 950, the eleventh insulation pattern 940, the second gate insulation pattern 925, the channel 915 and the sixth insulating interlayer pattern 860 to fill the third recess, and planarizing the twelfth insulation layer until the upper surface of the sixth insulating interlayer pattern 860 is exposed.

The channel 915 may be partially removed to form an eleventh opening exposing upper surfaces of the second bit line 830 and the fifth insulating interlayer pattern 850, and a thirteenth insulation pattern 500 may be formed in the eleventh opening. Thus, the channel 915 extending in the second direction D2 may be divided into a plurality of parts spaced apart from each other in the second direction D2. As a result, a plurality of channels 915 may be spaced apart from each other in the first and second directions D1 and D2.

Figure 44:
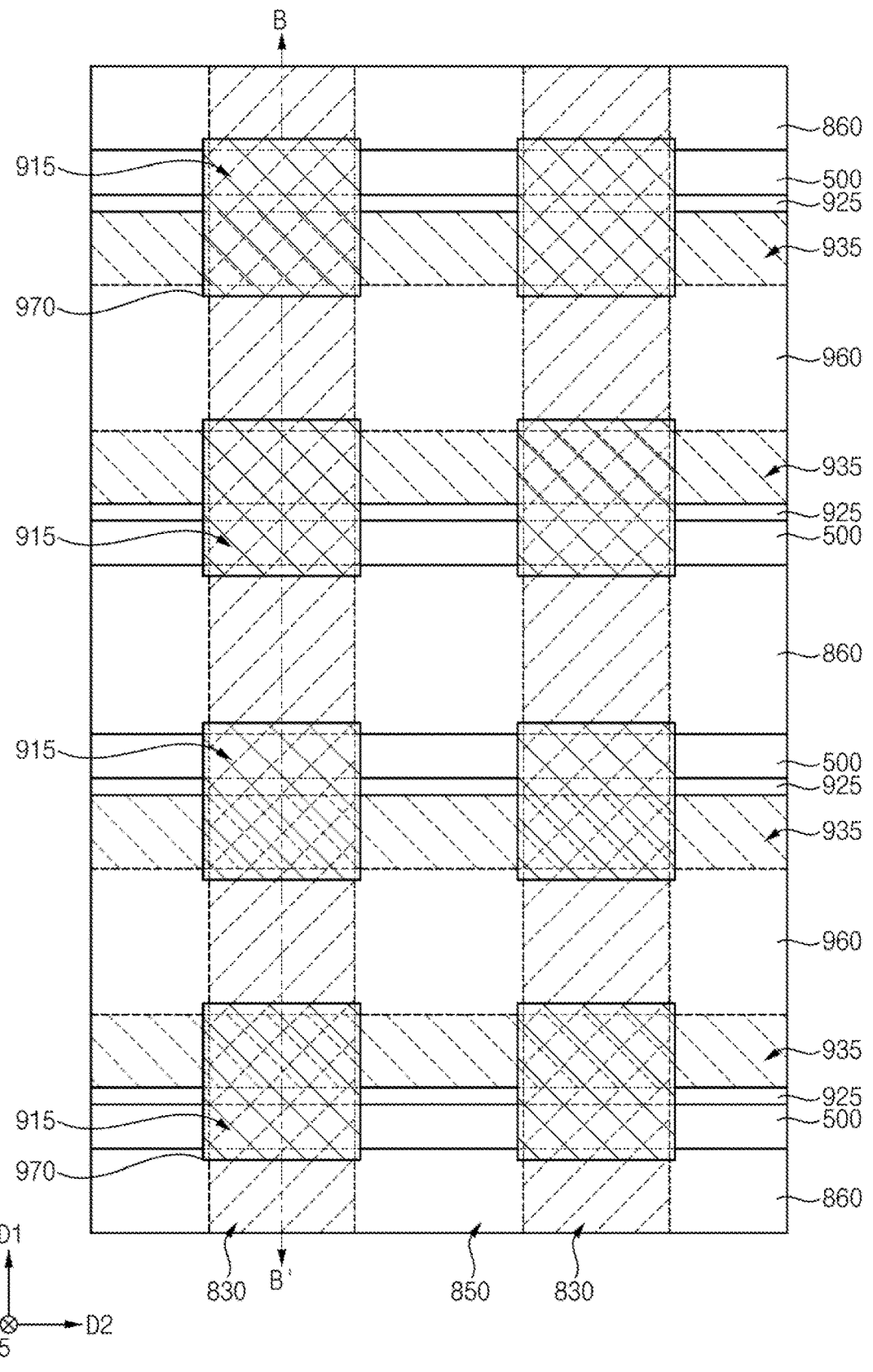
Figure 45:
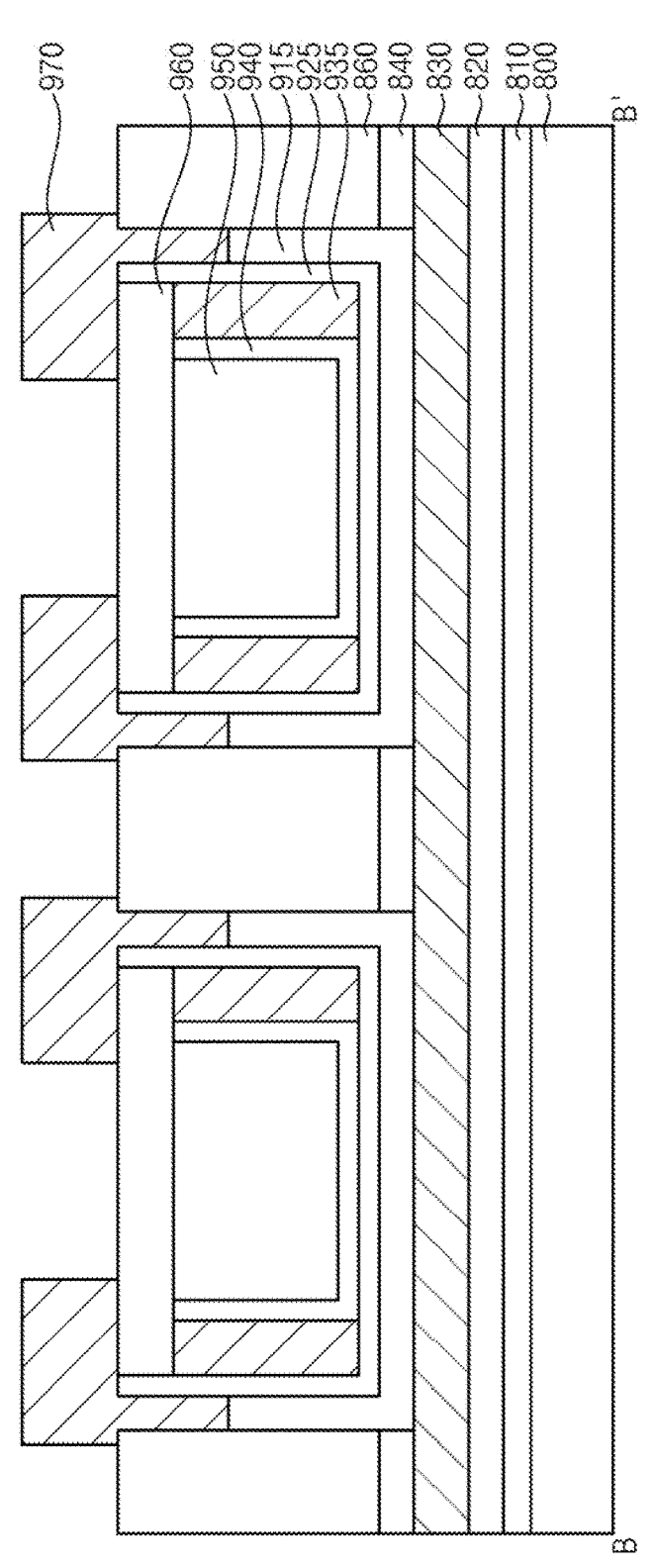
Figure 45:
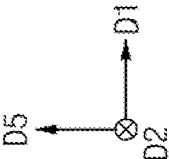

Referring to FIGS. 44 and 45, an upper portion of the channel 915 may be removed to form a fourth recess, and a contact plug layer may be formed on the channel 915, the sixth insulating interlayer pattern 860, the second gate insulation pattern 925 and the twelfth insulation pattern 960, and may be patterned to form a contact plug 970 contacting an upper surface of the channel 915.

In example embodiments, a plurality of contact plugs 970 may be spaced apart from each other in the first and second directions D1 and D2. In an example embodiment, the contact plugs 970 may be arranged in a lattice pattern in a plan view. Alternatively, the contact plugs 970 may be arranged in a honeycomb pattern in a plan view.

Referring to FIGS. 33 and 34 again, an eighth insulating interlayer may be formed on the sixth insulating interlayer pattern 860, the channel 915, the second gate insulation pattern 925 and the twelfth insulation pattern 960 to at least partially cover the contact plug 970, and an upper portion of the eighth insulating interlayer may be planarized until an upper surface of the contact plug 970 is exposed to form an eighth insulating interlayer pattern 980 at least partially covering a sidewall of the contact plug 970.

The first capacitor structure may be formed and may contact the upper surface of the contact plug 970 so the fabrication of the semiconductor device may be completed.

While example embodiments have been particularly shown and described, it will be understood by one of ordinary skill in the art that variations in form and detail may be made therein without departing from the spirit and scope of the present disclosure.

What is claimed is:

1. A capacitor structure, comprising:
   a first lower conductive pattern disposed on a substrate;
   a first capacitor including:
      first lower electrodes spaced apart from each other on the first lower conductive pattern in a horizontal direction that is substantially parallel to an upper surface of the substrate, the first lower electrodes being electrically connected to the first lower conductive pattern;

first upper electrodes disposed in a space between the first lower electrodes and further disposed in a space adjacent to one of the first lower electrodes that is disposed at a first end portion; and first dielectric structures, each disposed between one of the first lower electrodes and a corresponding one of the first upper electrodes;

a first upper conductive pattern disposed on and electrically connected to the first upper electrodes;

a second lower conductive pattern disposed on the substrate, the second lower conductive pattern being spaced apart from the first lower conductive pattern;

a second capacitor including:

second lower electrodes spaced apart from each other on the second lower conductive pattern in the horizontal direction, the second lower electrodes being electrically connected to the second lower conductive pattern;

second upper electrodes disposed in a space between the second lower electrodes and further disposed in a space adjacent to one of the second lower electrodes that is disposed at a first end portion; and second dielectric structures each being disposed between one of the second lower electrodes and a corresponding one of the second upper electrodes; and a second upper conductive pattern disposed on and electrically connected to the second upper electrodes, wherein the first and second conductive patterns are electrically insulated from each other.

2. The capacitor structure of claim 1, further comprising a first upper electrode disposed in a space adjacent to one of the first lower electrodes that is disposed at a second end portion.

3. The capacitor structure of claim 1, further comprising a second upper electrode disposed in a space adjacent to one of the second lower electrodes that is disposed at a second end portion.

4. The capacitor structure of claim 1, wherein each of the first dielectric structures includes a third dielectric pattern extending in a vertical direction that is substantially perpendicular to the upper surface of the substrate, a second dielectric pattern disposed on a sidewall of the third dielectric pattern, and a first dielectric pattern disposed on an outer sidewall of the second dielectric pattern.

5. The capacitor structure of claim 4, wherein the first dielectric pattern contacts a sidewall of the first lower electrode and a sidewall of the first upper electrode.

6. The capacitor structure of claim 4, wherein the second dielectric pattern at least partially covers a lower surface of the third dielectric pattern, and the first dielectric pattern at least partially covers a lower surface of the second dielectric pattern.

7. The capacitor structure of claim 4, wherein the first and third dielectric patterns include a same material, and the second dielectric pattern includes a material that is different from the material of the first and third dielectric patterns.

8. The capacitor structure of claim 4, wherein each of the second dielectric structures includes a fifth dielectric pattern extending in the vertical direction and a fourth dielectric pattern disposed on a sidewall of the fifth dielectric pattern.

9. The capacitor structure of claim 8, wherein the fourth dielectric pattern contacts a sidewall of the second lower electrode and a sidewall of the second upper electrode.

10. The capacitor structure of claim 8, wherein the fourth dielectric pattern at least partially covers a lower surface of the fifth dielectric pattern.

11. The capacitor structure of claim 8, wherein the fourth and fifth dielectric patterns include different materials from each other.

12. The capacitor structure of claim 1, wherein the first dielectric structure includes a first dielectric pattern contacting sidewalls of the first lower electrode and the first upper electrode, and the second dielectric structure includes a second dielectric pattern contacting sidewalls of the second lower electrode and the second upper electrode, and wherein the first and second dielectric patterns include different dielectric materials from each other.

13. The capacitor structure of claim 1, further comprising:

a first lower via disposed between the first lower conductive pattern and each of the first lower electrodes;

a second lower via disposed between the second lower conductive pattern and each of the second lower electrodes;

a first upper via disposed between each of the first upper electrodes and the first upper conductive pattern; and a second upper via disposed between each of the second upper electrodes and the second upper conductive pattern.

14. The capacitor structure of claim 1, wherein different voltages are applied to the first and second lower conductive patterns, respectively.

15. A capacitor structure, comprising:

a first lower conductive pattern disposed on a substrate;

a first capacitor including:

first lower electrodes spaced apart from each other on the first lower conductive pattern in a horizontal direction that is substantially parallel to an upper surface of the substrate, the first lower electrodes being electrically connected to the first lower conductive pattern;

first upper electrodes disposed in a space between the first lower electrodes and further disposed in a space adjacent to one of the first lower electrodes that is disposed at a first end portion; and first dielectric structures each being disposed between one of the first lower electrodes and a corresponding one of the first upper electrodes;

a first upper conductive pattern disposed on and electrically connected to the first upper electrodes;

a second lower conductive pattern disposed on the substrate, the second lower conductive pattern being spaced apart from the first lower conductive pattern;

a second capacitor including:

second lower electrodes spaced apart from each other on the second lower conductive pattern in the horizontal direction, the second lower electrodes being electrically connected to the second lower conductive pattern;

second upper electrodes disposed in a space between the second lower electrodes and further disposed in a space adjacent to one of the second lower electrodes that is disposed at a first end portion; and second dielectric structures each being disposed between one of the second lower electrodes and a corresponding one of the second upper electrodes; and a second upper conductive pattern disposed on and electrically connected to the second upper electrodes, wherein each of the first dielectric structures includes a third dielectric pattern extending in a vertical direction that is substantially perpendicular to the upper surface of the substrate, a second dielectric pattern disposed on a sidewall of the third dielectric pattern, and a first dielectric pattern disposed on an outer sidewall of the second dielectric pattern and contacting sidewalls of the first lower electrode and the first upper electrode, and wherein each of the second dielectric structures includes a fifth dielectric pattern extending in the vertical direction, and a fourth dielectric pattern disposed on a sidewall of the fifth dielectric pattern and contacting sidewalls of the second lower electrode and the second upper electrode.

16. The capacitor structure of claim 15, wherein the first and third dielectric patterns include a same material, and the second dielectric pattern includes a material that is different from the material of the first and third dielectric patterns.

17. The capacitor structure of claim 15, wherein the fourth and fifth dielectric patterns include different materials from each other.

18. A capacitor structure, comprising:

a first lower conductive pattern disposed on a substrate;

a first capacitor including:

first lower electrodes spaced apart from each other on the first lower conductive pattern in a horizontal direction that is substantially parallel to an upper surface of the substrate, the first lower electrodes being electrically connected to the first lower conductive pattern;

first upper electrodes disposed in a space between the first lower electrodes and further disposed in a space adjacent to one of the first lower electrodes that is disposed at a first end portion; and first dielectric structures each being disposed between one of the first lower electrodes and a corresponding one of the first upper electrodes;

a first upper conductive pattern disposed on and electrically connected to the first upper electrodes;

a second lower conductive pattern disposed on the substrate, the second lower conductive pattern being spaced apart from the first lower conductive pattern;

a second capacitor including:

second lower electrodes spaced apart from each other on the second lower conductive pattern in the horizontal direction, the second lower electrodes being electrically connected to the second lower conductive pattern;

second upper electrodes disposed in a space between the second lower electrodes and further disposed in a space adjacent to one of the second lower electrodes that is disposed at a first end portion; and second dielectric structures each being disposed between one of the second lower electrodes and a corresponding one of the second upper electrodes; and a second upper conductive pattern disposed on and electrically connected to the second upper electrodes, wherein each of the first dielectric structures includes a first dielectric pattern extending in a vertical direction that is substantially perpendicular to the upper surface of the substrate, and at least one second dielectric pattern disposed on a sidewall of the first dielectric pattern, and wherein each of the second dielectric structures includes a third dielectric pattern extending in the vertical direction, and at least one fourth dielectric pattern disposed on a sidewall of the fifth dielectric pattern, and wherein a number of the second dielectric pattern is different from a number of the fourth dielectric patterns.

19. The capacitor structure of claim 18, wherein the first and third dielectric patterns include different materials from each other.

20. The capacitor structure of claim 18, wherein the first and third dielectric patterns include a same material.

* * * * *